United States Patent [19]
Masuda

[11] Patent Number: 6,008,679
[45] Date of Patent: Dec. 28, 1999

[54] SEMICONDUCTOR INTEGRATED CIRCUIT AND SEMICONDUCTOR INPUT SYSTEM

[75] Inventor: Yoshinobu Masuda, Kanagawa-ken, Japan

[73] Assignee: Kabushiki Kaisha Toshiba, Kawasaki, Japan

[21] Appl. No.: 08/730,058

[22] Filed: Oct. 15, 1996

[30] Foreign Application Priority Data

Oct. 16, 1995 [JP] Japan ................................. 7-267438

[51] Int. Cl.$^6$ ................................................. H03K 3/295
[52] U.S. Cl. .......................... 327/205; 327/206; 327/214; 327/73
[58] Field of Search .................................. 327/362, 205, 327/206, 214, 73, 513, 53, 66, 427

[56] References Cited

U.S. PATENT DOCUMENTS 4,563,594  1/1986  Koyama ................................. 327/73

FOREIGN PATENT DOCUMENTS 62-90021  4/1987  Japan .

*Primary Examiner*—Dinh T. Le
*Attorney, Agent, or Firm*—Finnegan, Henderson, Farabow, Garrett & Dunner, L.L.P.

[57] ABSTRACT

A Schmitt trigger circuit has an input device and an amplifier. The input device has a current adder device having a P-type current mirror circuit and a N-type current mirror circuit connected in parallel. The P-type current mirror circuit has a positive constant current source for converting an external input signal to a positive constant current and a first output current control transistor for controlling an output current from the positive constant current source. The N-type current mirror circuit has a negative constant current source for converting the external input signal to a negative constant current and a second output current control transistor for controlling an output current from the negative constant current source. The amplifier amplifies the output signal from the input device and generates the feed-back control signal to be used for controlling and driving the first output current control transistor and the second output current control transistor.

13 Claims, 31 Drawing Sheets

HYSTERESIS RANGE

DIFFERENCE OF CIRCUIT
THRESHOULD VOLTAGES

HYSTERESIS
RANGE

SEMICONDUCTOR INTEGRATED CIRCUIT AND SEMICONDUCTOR INPUT SYSTEM

BACKGROUND OF THE INVENTION

1. Field of the Invention

The present invention relates to a semiconductor integrated circuit and a semiconductor input system such as Schmitt trigger circuits and the like used as input circuits and noise elimination circuits, for example.

2. Description of the Prior Art

Recently, the modern trend is toward the selection of low voltage level, low power consumption and high speed processing of semiconductor integrated circuits. Specifically, the enlargement of an available range of operational power source voltage and the increasing of a range of operational frequency for semiconductor integrated circuits are strongly required. In order to achieve those requirements, it must be required to increase performances of input circuits and internal logic circuits incorporated in semiconductor integrated circuits.

FIG. 29 is a circuit diagram showing a configuration of a conventional Schmitt trigger circuit (Hereinafter, it is also referred to as "the first conventional circuit".). This Schmitt trigger circuit has an inverter circuit 101 and is used as an input circuit and is placed in a semiconductor integrated circuit.

The inverter circuit 101 comprises P-MOS transistors 101a and 101b and N-MOS transistors 101c and 101d. These P-MOS transistors 101a and 101b and the N-MOS transistors 101c and 101d are connected in series between a high power source voltage VDD and a low power source voltage or a ground voltage VSS. In other words, the output terminal of the inverter circuit 101 is an intermediate point between the P-MOS transistors 101a, 101b and the N-MOS transistors 101c, 101d. The inverter circuit 101 receives an input signal Vin transferred from external devices (not shown) and converts it and then transmits the inverted input signal Vthc as an output signal from the inverter circuit 101 through the output node N2. In this explanation, the signal transferred from the intermediate node N1 is referred to as "the signal VBH" and the signal transferred from the intermediate node N3 is referred to as "the signal VBL".

The output signal Vthc is amplified by an amplifier circuit 102 comprising the inverter circuits 102a, 102b and 102c. The amplifier circuit 102 outputs an output signal Vout and a feed-back control signal VFB. The amplifier circuit 102 inverts and amplifies the output signal Vthc from the inverter circuit 101 as the preceding stage or the previous stage by the first stage inverter circuit 102a and then generates a signal Vthc1. The inverter circuits 102b and 102c connected in parallel in the following stage also inverts and amplifies the signal Vthc1 and then outputs the output signal Vout and the feed-back control signal VFB.

The output signal transferred from the inverter circuit 102c is transferred as an external output signal to external devices (not shown). The feed-back control signal transferred from the inverter circuit 102b to the gate terminal of the P-MOS transistor 103 connected between the node N1 in the inverter circuit 101 and the voltage ground source VSS and to the gate terminal of the N-MOS transistor 104 connected between the node N3 and the voltage power source VDD.

Since the P-MOS transistor 103 and the N-MOS transistor 104 are connected to the power source, VDD and VSS respectively, whose polarity is reversed to both the P-MOS transistor 103 and the N-MOS transistor 104, the hysteresis characteristics shown in FIG. 30 can be realized when the P-MOS transistor 103 and the N-MOS transistor 104 change conductive state. That is, the hysteresis characteristics of this circuit, as shown in FIG. 30, the hysteresis of the output voltage Vthc passes the path a and then passes the path b after the hysteresis reaches the point V1, when the voltage potential of the external input signal Vin is increased.

Next, when the voltage potential of the external input signal Vin is decreased, the hysteresis passes the path C and passes d after the hysteresis reaches the point V2. In this case, the range between the voltages V1 to V2 becomes the hysteresis range of this circuit.

In addition, the path e designated by the dotted line in FIG. 30 shows the usual input/output characteristics of the inverter circuit 101. In FIG. 30, the point P0 indicates the circuit threshold voltage, the point P1 designates the circuit threshold voltage of the inverter circuit 101 when the voltage Vthc is given to the path b. The point P1 designates the circuit threshold voltage of the inverter circuit 101 when the voltage Vthc passes the path b.

Next, the operation of the Schmitt trigger circuit shown in FIG. 29 will now be explained.

When the level of the external input signal Vin is in the VSS level, both the N-MOS circuits 101c and 101d are in a cut-off state, both the P-MOS transistors 101a and 101b are in an on-state. Both the potentials of the signals VBH and Vthc are in the voltage potential VDD, and both the potential of the output signal Vout and the feed-back control signal VFB are also in the VDD level.

In this state, the P-MOS transistor 103 and the N-MOS transistor 104 whose gates receive the feed-back control signal VFB are in the cut-off state and the on-state respectively (or a forward saturated state). The N-MOS transistor 104 enters a state which is equal to a state that diodes are connected to each other toward the forward bias referenced by the voltage power source VDD.

In the state that each circuit element is in the above state, when the potential of the external input voltage Vin transits to the VDD potential level from the VSS potential level, the P-MOS transistors 101a and 101b transit to the on-state and the N-MOS transistors 101c and 101d transit to the cut-off state. In addition, the P-MOS transistors 101a and 101b form a direct current path and changes the potential of the output signal Vthc from the inverter circuit section 101 to a desired voltage potential VSS level.

However, a current load in each of the N-MOS transistors 101c and 101d is increased because the N-MOS transistor 104 receiving the feed-back control signal VFB is in the state that it is connected between the voltage power source VDD and the intermediate node N3 in forward bias and a direct current path including the N-MOS transistor 104 is generated in addition to a direct current path formed by the P-MOS transistor 101a and 10b and the N-MOS transistors 101c and 101d.

The circuit threshold voltage of the inverter circuit section 101 is shifted toward the VDD level side (see the P1 side shown in FIG. 30) by the current load of this N-MOS transistor 104 so that the hysteresis characteristics is generated.

In addition, the direct current path is generating by the N-MOS transistor 104 until the N-MOS transistor 104 completely enters the cut-off state when the level of the feed-back control signal VFB is shifted over the circuit threshold voltage level of the inverter circuit 102a in the primary stage in the amplifier circuit 102 and then changed to the VSS voltage potential level.

The explanation described above shows the process that the external input signal Vin is changed from the VSS voltage level to the VSS voltage level. Conversely, in the primary state in which the VDD voltage level is changed to the VSS voltage level, the current load path is changed from the N-MOS transistor 104 to the P-MOS transistor 103 according to the state of the feed-back control voltage VFB, so that the voltage potential at each terminal is changed to the inverted state. Thereby, the threshold voltage level of the inverter circuit 101 is also shifted to the VSS level side (see P2 side shown in FIG. 30), so that the hysteresis characteristics is generated.

FIG. 31 is a circuit diagram showing a configuration of a conventional Schmitt trigger circuit having a stand-by function relating to the conventional Schmitt trigger circuit shown in FIG. 29. The components which are equal to the components used in the Schmitt trigger circuit shown in FIG. 29 in configuration and operation are used with the same reference numbers and the explanation for them are omitted here for brevity.

The Schmitt trigger circuit has the stand-by function by which a power consumption of the Schmitt trigger circuit becomes zero during a stand-by mode in addition to the function of the Schmitt trigger circuit shown in FIG. 29. In the conventional Schmitt trigger circuit shown in FIG. 31, a P-MOS transistor 111 and a N-MOS transistor 112 are placed in the direct current path in the inverter circuit section 101.

During the stand-by mode (STBY signal is in VSS level), the STBY signal is transferred to the gate of the N-MOS transistor 112, so that the N-MOS transistor 112 enters the cut-off state. Then, during the stand-by mode, the STBY signal is inverted by the inverter 113. The inverted STBY signal is transferred to the gate of the P-MOS transistor 111, so that the P-MOS transistor 112 enters the cut-off state. In addition, the P-MOS transistor 114 enters the ON-state, so that the level of the node N2 is fixed to the VDD voltage level.

A Schmitt trigger circuit having the following function is disclosed in the literature of the Japanese laid-open publication number:62-90021.

FIG. 32 is a diagram showing another conventional Schmitt trigger circuit (the second conventional Schmitt trigger circuit) disclosed in the above literature.

This second conventional Schmitt trigger circuit is incorporated as an input circuit in a semiconductor integrated circuit and the Schmitt trigger circuit has the inverter circuit sections 201 and 202.

In the inverter circuit section 201, the node N1 is used as the output terminal of the inverter circuit section 201, the P-MOS transistor 201a is connected between the voltage power source VDD and the output terminal N11, and the N-MOS transistor 201b is connected between the ground voltage power source VSS and the output terminal N11. In the inverter circuit section 202, the node N12 is used as the output terminal of the inverter circuit section 202, the P-MOS transistor 202a is connected between the voltage power source VDD and the output terminal N12, and the N-MOS transistor 202b is connected between the ground voltage power source VSS and the output terminal N12. An external input signal Vin is transferred to both the gates of the P-MOS transistors 201a, 202a and the N-MOS transistors 201b, 202b. The VBH signal is generated and transferred from the output terminal N11 and the VBL signal is transferred to the output terminal N12.

The inverter circuit sections 201 and 202 which receive commonly the external input signal are placed in parallel, the output terminal N11 of the inverter circuit section 201 is connected to the gate terminal of the P-MOS transistor 203a in the inverter circuit section 203 in the following stage, and the output terminal N12 of the inverter circuit 202 is connected to the gate terminal of the N-MOS transistor 203 in the inverter circuit section 203.

The inverter circuit section 203 having the output terminal N13 has the circuit configuration in which the P-MOS transistor 203a is connected between the voltage power source VDD and the output terminal N13 and the N-MOS transistor circuit 203b is connected between the ground voltage power source VSS and the output terminal N13. The output signal Vout transferred through the output terminal N13 to external devices is used as an external output signal.

When the circuit threshold voltages of the inverter circuit section 201 and the inverter circuit section 202 are Vt201 and Vt202, respectively, and when a transistor ratio W/L (hereinafter referred to as "W/L" for brevity, where W is a channel width, and L is a channel length) of the P-MOS transistor 201a is greater and when a transistor ratio W/L of the N-MOS transistor 201b is small in the inverter circuit section 201, the circuit threshold voltage of the inverter circuit section 201 against the external input signal Vin is shifted to the high voltage Vt201 side.

In contrast, in the inverter circuit section 202, when a transistor ratio W/L of the P-MOS transistor 202a is smaller and when a transistor ratio W/L of the N-MOS transistor 202b is larger in the inverter circuit section 202, the circuit threshold voltage of the inverter circuit section 202 against the external input signal Vin is shifted toward the low voltage Vt202 side.

Accordingly, this makes it possible to set the hysteresis characteristics shown in FIG. 33A based on the difference between the threshold voltages Vt201 and Vt202 when the circuit threshold voltages of the inverter circuit section 201 and 202 are set to the high voltage side threshold voltages Vt201 and the low voltage side threshold voltage Vt202, respectively.

However, in the conventional circuits (see FIG. 29 and FIG. 31), the circuit threshold voltage of the circuit section 101 is set to a desired voltage level by setting the following manners:

The feed-back control signal VFB as the output signal of the circuits is fed back to the circuits themselves, and the P-MOS transistor 103 and the N-MOS transistor 104 are set to an active state corresponding to each operation state and the current load is added to them in order to maintain the hysteresis characteristics, especially the hysteresis width.

By the increasing of the current load, there are drawbacks in the conventional Schmitt trigger circuits described above that a gain of the circuit is decreased, namely the amplifier ratio of the circuit becomes low and the peration frequency is decreased.

Furthermore, the channel conductance of the MOS transistors caused by the trend of decreasing the voltage potential level of the voltage power source VDD (the on-resistance of a MOS transistor is increased) and mutual conductance are decreased (a driving performance of a MOS transistor becomes low, namely a magnitude of the drain current flow is decreased.), so that the amplifier ratio of the conventional Schmitt trigger circuit becomes low and a delay of the output signal Vout is increased, thereby, it is difficult to guarantee the operation of the conventional Schmitt trigger circuit under a low voltage power source.

In addition, there is the following problem in both the second conventional circuit (see FIG. 32):

When the external input signal Vin is in the VSS voltage level, the P-MOS transistors 201a and 202a in the inverter circuits 201 and 202 enter the ON state, and the N-MOS transistors 201b and 202b enter the cut-off state, so that both the output signals VBH and VBL are VDD voltage level.

Furthermore, in the inverter circuit section 203, the P-MOS transistor 203a whose gate terminal receives the signals VBH and VBL transferred from the inverter circuits 201 and 202 in the previous stage enters the cut-off state. The voltage level of the output signal Vout from the output terminal N13 becomes the VSS voltage level because the N-MOS transistor 203b is in the on state.

In this state, when the external input signal Vin by which the threshold voltage of the low voltage potential circuit in the inverter circuit 202 will be changed is received, the level of the output signal VBL from the inverter circuit section 202 is changed from the VDD level to the VSS level, and thereby the N-MOS transistor circuit 203b enters completely the cut-off state during the transition state in which the level of the external input signal Vin is changed from the VSS level to the VDD level.

In the above state, the signals VBH and VBL which are transferred to the gate terminals of the P-MOS transistor 203a and the N-MOS transistor 203b in the inverter circuit section 203 become the VDD level and the VSS level, respectively, and both the P-MOS transistor 203a and the N-MOS transistor 203b enter the cut-off state.

Accordingly, because the output terminal N13 is not driven by the P-MOS transistor 203a and the N-MOS transistor 203b, the terminal N13 at which the output signal Vout appears has a high-impedance state. Thereby, there is a drawback that it is difficult to guarantee the circuit operation when the external input signal Vin in a low frequency range is received.

After this state described above, when the level of the external input signal Vin is over the circuit threshold voltage level Vt201 of the high voltage potential side in the inverter circuit 201, the signal VBH of the inverter circuit section 201 is inverted or shifted from the VDD level to the VSS level, the P-MOS transistor 203a in the inverter circuit 203 enters the on-state. As a result, the level of the output signal Vout from the output terminal N13 of the inverter circuit section 203 becomes the VDD level. Thereby, as shown in FIG. 33B, the input/output characteristics in which the output signal Vout transits through the path from the point "a" to the point "b" can be generated.

Since the explanation described above shows that the external input signal Vin transits from the VSS level to the VDD level, conversely, both levels of the output signals VBH and VBL become the VSS level in the initial state when the external input signal Vin transits from the VDD level to the VSS level, like the same manner in the explanation described above, the P-MOS transistor 203a whose gate terminal receives the signal VBH and the N-MOS transistor whose gate terminal receives the signal VBL enter the on-state and the N-MOS transistor 203b enters the cut-off state and the level of the output signal from the output terminal N13 is the VDD level.

In this state, when the external input signal Vin is changed from the VDD level to the VSS level during a transition state, the state at each terminal is the inverted state of the explanation described above, namely the level of each terminal transits the reverse voltage potential direction. Thereby, the output signal VBH of the inverter circuit section 201 is changed from the VSS level to the VDD level when the external input signal Vin whose voltage level is below that of the threshold voltage Vt201 of the high voltage side in the inverter circuit section 201, so that the P-MOS transistor 203a in the inverter circuit section 203 enters the cut-off state completely.

Therefore when the threshold voltage Vt201 of the high voltage potential level is shifted from the VDD level to the VSS level by the external input signal Vin, the state of the output terminal N13 of the inverter circuit section 203 assumes a high impedance state, and the output terminal N13 is not driven, so that it is difficult to guarantee the circuit operation when the external input signal Vin in a low frequency range is received.

After this, the N-MOS transistor 203b in the inverter circuit section 203 enters the on-state because the output signal VBL of the inverter circuit section 202 is changed from the VSS level to the VDD level when the level of the external input signal Vin is below the threshold voltage Vt202 level of the low voltage potential side in the inverter circuit section 202. As a result, the signal Vout output from the output terminal N13 of the inverter circuit section 203 becomes the VSS level, and then the input/output characteristics passing through the path from the point "c" to the point "d", as shown in FIG. 33B, is generated.

As described above in detail, in the process in which the level of the external input signal Vin is changed from the VSS level to the VDD level, the hysteresis characteristic is provided in which the signal Vout transits the path from the point "a" to the point "d", and the output signal Vout transits the path from the point "c" to the point "d" when the external input signal Vin is changed from the VDD level to the VSS level.

In addition, when the section from the threshold voltage Vt202 of the low voltage potential side to the threshold voltage Vt201 of the high voltage potential side is used as the hysteresis width and when the level of the external input signal Vin is changed from the VSS level to the VDD level or when the of the external input signal Vin is changed from the VDD level to the VSS level, the hysteresis characteristics can be obtained by keeping the external output voltage Vout corresponding to the voltage of the external input signal Vin immediately before this external input signal Vin enters the hysteresis range at a drain capacitance of the P-MOS transistor circuit 203a and the N-MOS transistor 203b in the inverter circuit section 203, at a wiring capacitance in which both the drains of the P-MOS transistor 203a and the N-MOS transistor 203b are connected to each other, and at the external load capacitance connected to the output terminal N13.

Accordingly, when the external input signal whose level is in the hysteresis range is transferred to the Schmitt trigger circuit, the output signal Vout from the Schmitt trigger circuit has the characteristics depended on a parasitic capacitance and an external load capacitance relating to the output terminal N13 in the inverter circuit section 203, so that there is a drawback that it is difficult to guarantee the circuit operation. In addition, as shown in FIG. 33C, when the amplitude of the external input signal Vin is in an input range of the external input signal Vin having an offset voltage at the VSS level and the VDD level sides, and when the voltage difference between the threshold voltage Vt202 at the low voltage side and the threshold voltage Vt201 at the high voltage side becomes smaller, it is difficult to drive the parasitic capacitance and the external load capacitance at the output terminal N13 to the VSS voltage level completely because a driving time period to drive the parasitic capacitance and the external load capacitance at the output terminal N13 in the inverter circuit section 203 becomes short.

Similarly, when the voltage difference between the threshold voltage Vt201 of the high voltage side and the offset voltage of the VDD level side in the inverter circuit section 203 becomes smaller, a driving time period to drive the parasitic load capacitance and the load capacitance at the output terminal N13 in the inverter circuit section 203 into the VDD level becomes short, so that it is difficult to drive these load capacitances at the output terminal N13 to the VDD voltage level and there is a drawback that a circuit response of the conventional Schmitt trigger circuit becomes unstable.

Furthermore, under the condition that a low voltage power source is used as the voltage power source VDD, the ratio of a circuit amplitude of the conventional Schmitt trigger circuit becomes low by reducing the channel conductance based on the Vgs (Vgs is the voltage between gate-source terminals) of the P-MOS transistor 203a and the N-MOS 203b transistor and by reducing the mutual conductance (decreasing the driving ability of the MOS transistor namely decreasing the amount of the drain current). Therefore there is a drawback in the prior art that it is difficult to guarantee stable circuit operation.

As described above in detail, there is the drawback that it is difficult to enlarge the voltage range in operation and to enlarge the frequency range in operation in the conventional semiconductor integrated circuits.

SUMMARY OF THE INVENTION

Accordingly, an object of the present invention is, with due consideration to the drawbacks of the conventional semiconductor integrated circuit and the conventional semiconductor input circuit, to provide a semiconductor integrated circuit and a semiconductor input device which are capable of operating in a highly stable state even if a low voltage power source is used and also capable of reliable operating in a highly stable state within a wide frequency range.

In accordance with a preferred embodiment of the present invention, a semiconductor integrated circuit comprises: a first current mirror circuit for transferring a first constant current output according to an external input signal externally transferred; a second current mirror circuit for transferring a second constant current flow output according to the external input signal; an amplifier for amplifying the output from the first current mirror circuit or the second current mirror circuit, wherein the amplifier generates and transfers a feed-back control signal in addition to an external output signal, the first constant current flow output from the first current mirror circuit and the second constant current flow output from the second current mirror circuit being controlled by the feed-back control signal at the same time.

Thereby, both the first and second current mirror circuits operate correspondingly to each other and transfer the first and second constant current outputs, and the first an second constant current outputs are controlled by the feed-back control signal and the external input signal.

In addition the amplifier amplifies the stable output obtained by the first and second current mirror circuits, one of outputs is used as the external output signal and the other output signal is used as the feed-back control signal transferred to both the first and second current mirror circuits.

In accordance with another preferred embodiment of the present invention, a semiconductor integrated circuit comprises: an input device and an amplifier,wherein the input device comprises: a P-type current mirror circuit comprising: a positive constant current source means for converting an external input signal to a positive constant current; and a first output current control transistor for controlling an output current from the positive constant current source means; and a N-type current mirror circuit connected to the P-type current mirror circuit in parallel, comprising: a negative constant current source means for converting the external input signal to a negative constant current; and a second output current control transistor for controlling an output current from the negative constant current source means, and the amplifier for amplify the output signal transferred from the input device, wherein the amplifier transfers the feed-back control signal both the first output current control transistor and the second output current control transistor in order to drive the first output current control transistor and the second output current control transistor.

Thereby, because the P-type current mirror circuit and the N-type current mirror circuit are connected in parallel, the output from the input device is determined only based on the output current ratio between the P-type and N-type current mirror circuits. In addition, because the P-type and N-type current mirror circuits are used in the input device, the level of the output signal corresponding to the level of the input signal can be obtained. Furthermore because the first and the second output current control transistors are used in the P-type and the N-type current mirror circuits, the threshold voltages in both the first and the second output current control can be set to required voltage levels by the output current control function of the first and second desired threshold values.

In accordance with another preferred embodiment of the present invention, a semiconductor integrated circuit comprises: a P-type current mirror circuit, a N-type current mirror circuit and an amplifier, wherein the P-type current mirror circuit comprises: a first input transistor connected between a first input node and a low power source driven by an external input signal transferred from external devices; a first constant current load means, to become a constant current load for the first input transistor, connected between a high power source and the first input node; a first output transistor connected between the high power source and an output node driven based on the voltage potential of the first input node; and a first output current control transistor connected between the high power source and the first input node and driven based on a feed-back control signal transferred from the amplifier; the N-type current mirror circuit comprises: a second input transistor connected between a high power source and a second input node driven by the external input signal and whose operation is compensated to the first input transistor to each other; a second constant current load means, to become a constant current load for the second input transistor, connected between the second input node and the low power source; a second output transistor connected between the output node and the low power source driven based on the voltage potential of the second input node; and a second output current control transistor connected between the second input node and the low power source and driven based on the feed-back control signal transferred from the amplifier, andthe amplifier amplifies the output voltage to be transferred to the output node, one of outputs from the amplifier is transferred as the feed-back control signal, and the other output is transferred as the external output signal.

In accordance with another preferred embodiment of the present invention, a semiconductor integrated circuit comprises: a P-type current mirror circuit, a N-type current mirror circuit and an amplifier, wherein the P-type current mirror circuit comprises: a first input transistor connected between a first input node and a low power source driven by an external input signal; a first constant current load means, to become a constant current load for the first input transistor, connected between a high power source and the first input node; a first output transistor connected between the high power source and an output node driven based on the voltage potential of the first input node; a first output current control transistor connected between the high power source and the first output transistor; and a first control transistor connected between the high power source and the first constant current load means and driven based on a feed-back control signal, the N-type current mirror circuit comprises: a second input transistor connected between the high power source and a second input node driven by the external input signal transferred from external devices and whose operation is compensated with the first input transistor to each other; a second constant current load means, to become a constant current load for the second input transistor, connected between the second input node and the low power source; a second output transistor connected between the output node and the low power source driven based on the voltage potential of the second input node; a second control transistor connected between the second constant current load means and the low power source and driven based on the feed-back control signal; and a second output current control transistor connected between the second output transistor, the second constant current load means, the second input transistor and the low power source, and the amplifier amplifies the output voltage to be transferred to the output node, one of outputs from the amplifier is transferred as the feed-back control signal, and the other output is transferred as the external output signal.

In accordance with another preferred embodiment of the present invention, a semiconductor integrated circuit comprises: a P-type current mirror circuit, a N-type current mirror circuit and an amplifier, wherein the P-type current mirror circuit comprises: a first input transistor connected between a first input node and a low power source driven by an external input signal; a first constant current load means, to become a constant current load for the first input transistor, connected between a high power source and the first input node; a first output transistor connected between the high power source and an output node driven based on the voltage potential of the first input node; a first output current control transistor connected between the high power source and the first output transistor; and a first control transistor connected between the high power source and the first output current control transistor and driven based on a feed-back control signal, the N-type current mirror circuit comprises: a second input transistor connected between the high power source and a second input node driven by the external input signal transferred from external devices and whose operation is compensated with the first input transistor to each other; a second constant current load means, to become a constant current load for the second input transistor, connected between the second input node and the low power source; a second output transistor connected between the output node and the low power source driven based on the voltage potential of the second input node; a second output current control transistor connected between the second input transistor and the low power source; and a second control transistor connected between the second output transistor, the second constant current load means, the second input transistor and the low power source and driven based on the feed-back control signal; and the amplifier amplifies the output voltage to be transferred to the output node, one of outputs from the amplifier is transferred as the feed-back control signal, and the other output is transferred as the external output signal.

In accordance with another preferred embodiment of the present invention, a semiconductor integrated circuit comprises: a first current cut-off transistor connected between the first input node and the low voltage power source and whose ON/OFF operation is driven based on a stand-by signal; and a second current cut transistor connected between the high power source and the second input node and whose ON/OFF operation is driven based on the stand-by signal, like the first current cut transistor.

In accordance with another preferred embodiment of the present invention, a semiconductor input device comprises: an input device and an amplifier, wherein the input device comprises a current addition device comprising a P-type current mirror circuit and a N-type current mirror circuit connected in parallel, wherein the P-type current mirror circuit comprises: a positive constant current source for converting an external input signal to a positive constant current; a first output current control transistor for controlling a magnitude of an output current from the positive constant current source; and a first threshold voltage setting section for outputting a constant current based on a high potential reference voltage, the N-type current mirror circuit comprises: a negative constant current source for converting the external input signal to a negative constant current; a second output current control transistor for controlling a magnitude of an output current from the negative constant current source; and a second threshold voltage setting section for outputting a constant current based on a low potential reference voltage, and the amplifier amplifies the output signal transferred from the input device and generates the external output signal, and generates the feed-back control signal to be transferred to the first output current control transistor and the second output current control transistor in order to drive both the first output current control transistor and the second output current control transistor.

In accordance with another preferred embodiment of the present invention, a semiconductor input device comprises: a plurality of input devices connected in series; and a reference voltage generation circuit for generating a high reference voltage and a low reference voltage, wherein each of the plurality of input devices comprises: a current addition device and an amplifier, wherein the current addition device comprising: a P-type current mirror circuit; and a N-type current mirror circuit connected in parallel, wherein the P-type current mirror circuit comprises: a positive constant current source for converting an external input signal to a positive constant current; a first output current control transistor for controlling a magnitude of an output current from the positive constant current source; and a first threshold voltage setting section for outputting a constant current based on a high potential reference voltage, the N-type current mirror circuit comprises: a negative constant current source for converting the external input signal to a negative constant current; a second output current control transistor for controlling a magnitude of an output current from the negative constant current source; and a second threshold voltage setting section for outputting a constant current based on a low potential reference voltage, and the amplifier amplifies the output signal transferred from the input device and generates the external output signal, and generates the feed-back control signal to be transferred to the first output current control transistor and the second output current control transistor in order to drive both the first output current control transistor and the second output current control transistor.

Thereby, the setting of the threshold voltage levels for the P-type current mirror circuit and the N-type current mirror circuit can be easily set. Furthermore, the fluctuation of each threshold voltage in each input device can obtain the smallest value.

In accordance with another preferred embodiment of the present invention, a semiconductor input device, further comprises operation stop means for stopping the operation of the P-type current mirror circuit and the N-type current mirror circuit during a stand-by mode.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of semiconductor integrated circuits such as a semiconductor input device and a semiconductor input system according to the present invention will now be described with reference to the drawings.

Embodiment 1

Figure 1:
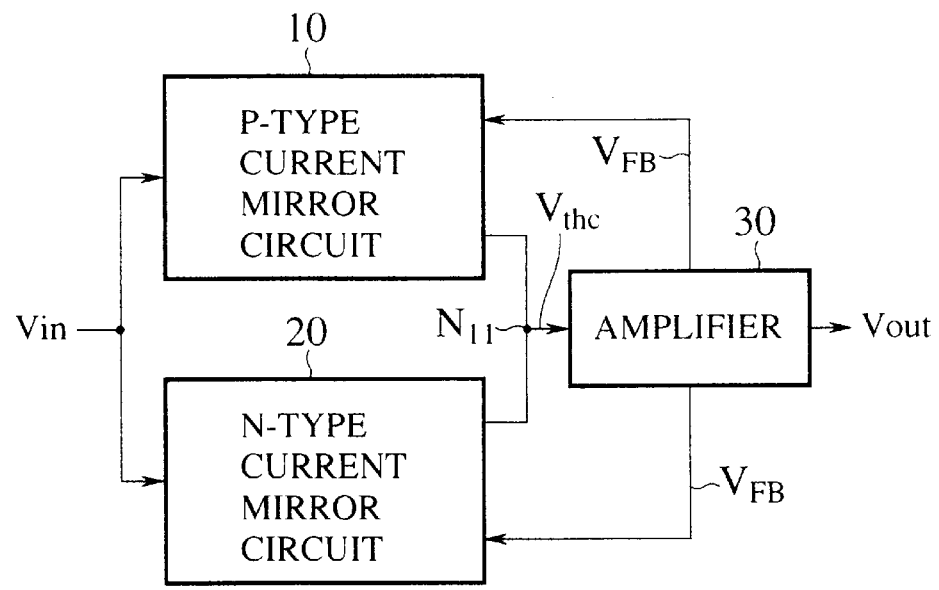
FIG. 1 is a diagram showing a basic configuration of a Schmitt trigger circuit, as a semiconductor integrated circuit, according to the first embodiment of the present invention.

FIG. 1 is a diagram showing a basic configuration of a Schmitt trigger circuit, as a semiconductor integrated circuit, according to the first embodiment of the present invention.

The Schmitt trigger circuit shown in FIG. 1 is used as a semiconductor input circuit (or a semiconductor input device) as a semiconductor integrated circuit incorporated in semiconductor integrated systems. This Schmitt trigger circuit comprises a P-type current mirror circuit 10 for generating and transferring a first constant current output according to an external input signal Vin, an N-type current mirror circuit 20, which is compensated with the P-type current mirror circuit, for generating and transferring a second constant current output according to the external input signal Vin, and an amplifier 30 connected to an output terminal N11 (as an output node) that is commonly to an output electrode of the P-type current mirror circuit 10 and to an output electrode of the N-type current mirror circuit 20.

One of outputs generated by and transferred from the amplifier 30 is used as an external output signal Vout, the other output is used as a feed-back control signal VFB that is transferred to both the P-type current mirror circuit 10 and the N-type current mirror circuit 20.

A magnitude of the first constant current output from the P-type current mirror circuit 10 is controlled by the feed-back control signal VFB and a magnitude of the second constant current output from the N-type current mirror circuit 20 is also controlled by the feed-back control signal VFB.

Specifically, the Schmitt trigger circuit having the configuration described above can be applied to following cases, for example, a current addition device which can be formed by connecting the P-type current mirror circuit 10 and the N-type current mirror circuit 20 to each other; a plurality of the current addition devices which can be connected in a plurality of stages, and so on.

Hereinafter, specific configuration examples of the Schmitt trigger circuit according to the first embodiment will now be explained in detail.

Figure 2:
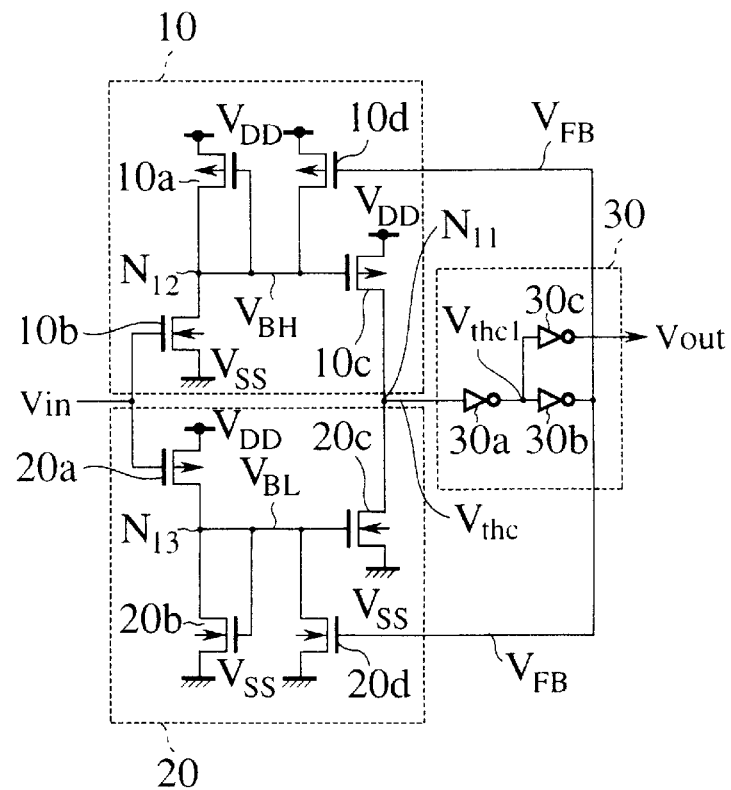
FIG. 2 is a circuit diagram showing a specific configuration example of the Schmitt trigger circuit shown in FIG. 1.
Figure 3A:
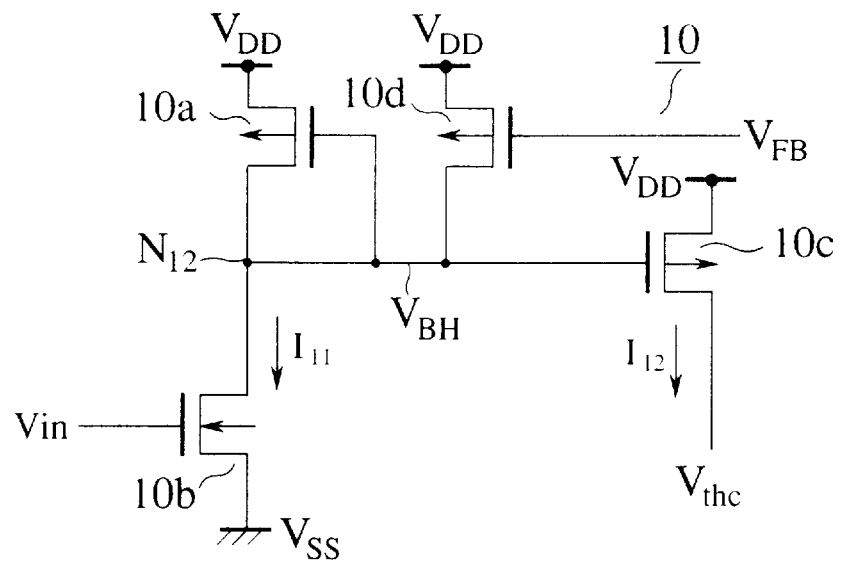
FIGS. 3A and 3B are a circuit diagram of a P-type current mirror circuit 10 and an explanation diagram showing an operation of the P-type current mirror circuit 10, respectively, in the Schmitt trigger circuit of the first embodiment.
Figure 3B:
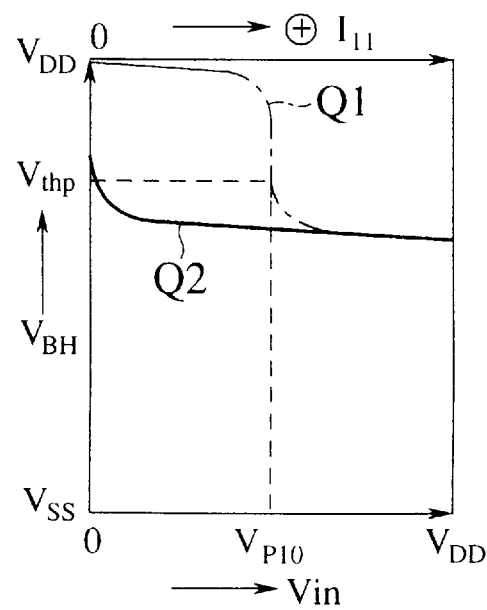

FIG. 2 is a circuit diagram showing a specific configuration example of the Schmitt trigger circuit of the first embodiment shown in FIG. 1. FIGS. 3A and 3B are a circuit diagram of the P-type current mirror circuit 10 and an explanation diagram showing an operation of the P-type current mirror circuit 10, respectively in the Schmitt trigger circuit of the first embodiment.

As shown in FIGS. 2 and 3A, the P-type current mirror circuit 10 comprises a P-MOS transistor 10a (first constant current load means) and an N-MOS transistor 10b (first input transistor) connected in series between a high voltage power source VDD and the ground voltage power source VSS through a first input node N12, and a P-MOS transistor 10c (first output transistor) connected between the high power source VDD and the node N11, and a P-MOS transistor 10d (first output current control transistor) connected between the voltage power source VDD and the node N12.

That is, in the P-type current mirror circuit 10, the output voltage VBH can be generated at the input node N12 under the circuit configuration in which the drain terminals of both the N-MOS transistor 10b and the P-MOS transistor 10a are connected to each other. The gate terminal of the N-MOS transistor 10b receives the external input signal Vin and the gate terminal and the drain terminal of the P-MOS transistor 10a are commonly connected to each other.

The gate terminal for receiving the output voltage VBH of the P-MOS transistor 10c are commonly connected to the gate and drain terminals of the P-MOS transistor 10a and also connected to the input node N12. Both the gate input voltages of the P-MOS transistors 10a and 10c have a same voltage potential.

Both the P-MOS transistor 10d and the P-MOS transistor 10a are connected in parallel, and both drain terminals of them are commonly connected. The gate terminal of the P-MOS transistor 10d receives the feed-back control signal VFB transferred from the amplifier 30. Thereby, the magnitude of the feed-back control signal VFB can be reflected to the P-type current mirror circuit 10 immediately.

On the other hand, since the gate terminal and the drain terminal in the P-MOS transistor 10a are connected to each other, the P-MOS transistor 10a is usually saturated, namely it enters a saturated state usually. The P-MOS transistor 10a operates as a constant current load for the N-MOS transistor 10b operates as a positive current source and is controlled by the external input signal Vin. Accordingly, a current value of the constant current flowing through the P-MOS transistor 10a and the N-MOS transistor 10b can be changed to a required current value by controlling the N-MOS transistor 10b based on the external input signal Vin.

Here, as shown in FIG. 3A, when the reference character "I11" designates the current flowing through the P-MOS transistor 10a and the N-MOS transistor 10b and the reference character "I12" denotes the current flowing through the P-MOS transistor 10c in the P-type current mirror circuit 10. The relationship between the currents I11 and I12 is described as follows, where the current flowing through the P-MOS transistor 10a is designated by IP10a, the current flowing through the N-MOS transistor 10b is denoted by IN10b, VBF is the VDD voltage level (VFB=VDD), and other transistors operate in the saturated state.

We obtain the current equation for each MOS transistor as follows:

$$I_{P10a} = \frac{\beta_{10a}}{2} \cdot (V_{DD} - V_{BH} - |V_{thP}|)^2 \quad (1)$$

$$I_{N10b} = \frac{\beta_{10b}}{2} \cdot (V_{in} - V_{thN})^2 \quad (2)$$

where, $$\beta_{10a} = \mu_P \cdot C_{OX} \cdot \frac{W_{10a}}{L}, \beta_{10b} = \mu_N \cdot C_{OX} \cdot \frac{W_{10b}}{L},$$

$\mu N$ and $\mu p$ are carrier mobilities (absolute value) of an N-MOS transistor and a P-MOS transistor, respectively, Cox is a capacitance per unit area of a gate insulating film, W10a and W10b are channel widths of a P-MOS transistor and an N-MOS transistor, respectively, and L is a channel length of each P-MOS transistor, a N-MOS transistor, |Vthp| is an element threshold voltage (absolute value) of a P-MOS transistor, and VthN is an element threshold voltage.

The total amount of the current IP1-a flowing through the P-MOS transistor 10a as a load flows into the N-MOS transistor 10b, the relationship 11=IP10a=IN10b is therefore satisfied, and we obtain the following equation:

$$\frac{\beta_{10a}}{2} \cdot (V_{DD} - V_{BH} - |V_{thP}|)^2 = \frac{\beta_{10b}}{2} \cdot (V_{in} - V_{thN})^2.$$

By using the above equation, VBH is given by the following equation (3):
Equation 3:

$$\sqrt{\frac{\beta_{10a}}{\beta_{10b}}} = \frac{(V_{in} - V_{thN})}{(V_{DD} - V_{BH} - |V_{thP}|)} \quad (3)$$

$$(V_{DD} - V_{BH} - |V_{thP}|) \cdot \sqrt{\frac{\beta_{10a}}{\beta_{10b}}} = (V_{in} - V_{thN})$$

$$V_{BH} = V_{DD} - |V_{thP}| - \frac{(V_{in} - V_{thN})}{\sqrt{\beta_{10a} / \beta_{10b}}}.$$

In addition, the output current I12 of the P-MOS transistor 10c is given by the following equation:

$$I_{12} = \frac{\beta_{10c}}{2} \cdot (V_{DD} - V_{BH} - |V_{thP}|)^2 \quad (4)$$

where, $$\beta_{10c} = \mu_P \cdot C_{OX} \cdot \frac{W_{10c}}{L},$$

W10c is the channel width of the P-MOS transistor 10c.
From both the equation (3) and the equation (4), we have the following equation (5):

$$I_{12} = \frac{\beta_{10c}}{2} \cdot \left( \frac{(V_{in} - V_{thN})}{\sqrt{\beta_{10a} / \beta_{10b}}} \right)^2$$

$$= \frac{\beta_{10c}}{2} \cdot \frac{(V_{in} - V_{thN})^2}{\beta_{10a} / \beta_{10b}}$$

$$= \frac{\beta_{10b}}{2} \cdot (V_{in} - V_{thN})^2 \cdot \frac{\beta_{10c}}{\beta_{10a}}$$

$$I_{12} = I_{N10b} \cdot \frac{\beta_{10c}}{\beta_{10a}}.$$

where, we obtain the following equation because IN10b= I11:

$$I_{12} = I_{11} \cdot \frac{\beta_{10c}}{\beta_{10a}} \rightarrow \frac{I_{12}}{I_{11}} = \frac{W_{10c}/L}{W_{10a}/L}$$

$$\frac{I_{12}}{I_{11}} = \frac{W_{10c}}{W_{10a}} \text{ or } I_{12} \cdot W_{10a} = I_{11} \cdot W_{10c}.$$

Thereby, by using the transistor ratio W10c/W10a of each of the P-MOS transistor 10a and the N-MOS transistor 10c, any desired ratio of I11/I12 can be obtained.

As described above, in the P-type current mirror circuit 10, because the constant current value I11 can be controlled by using the external input signal Vin and the constant current ratio value I11/I12 can be set to a desired ratio value, the constant current I12 can be controlled by using the external input signal Vin. Therefore, as shown in FIG. 3B, we can obtained the characteristic that the value of the constant current output is increased when the value of the external input signal Vin is increased.

In addition, as shown in FIG. 3B, when the P-MOS transistor 10d enters the ON state (designated by the curve Q1), namely when the feed-back control signal VFB is at the VSS voltage level, the value of the output voltage VBH is more than the value of the element threshold voltage VthP until the current from the N-MOS transistor 10b is equal to the current from the P-MOS transistor 10d. Thereby, the P-MOS transistor 10c is in the cut-off state, namely is not activated. By using the above processes, the circuit threshold voltage VP10 of the P-type current mirror circuit 10 transistor is modulated.

Accordingly, the P-type current mirror circuit 10 operates only when the external input voltage Vin is in the voltage range over the circuit threshold voltage VP10. Here, the curve Q2 designates the output voltage VBH when the P-MOS transistor 10d enters the cut-off state.

In the following explanation, the P-MOS transistor 10d enters only the cut-off state, and does not turn on.

Next, the configuration and the operation of the N-type current mirror circuit 20 will now be explained.

When the N-type current mirror circuit 20 is compared with the P-type current mirror circuit 10 in circuit configuration, the N-type current mirror circuit has the following configuration:

Each transistor used in the P-type current mirror circuit 10 shown in FIG. 3A is replaced with another type MOS transistor and the high voltage power source VDD is used for the P-MOS transistors and the ground voltage power source VSS is used for the N-MOS transistors.

Figure 4A:
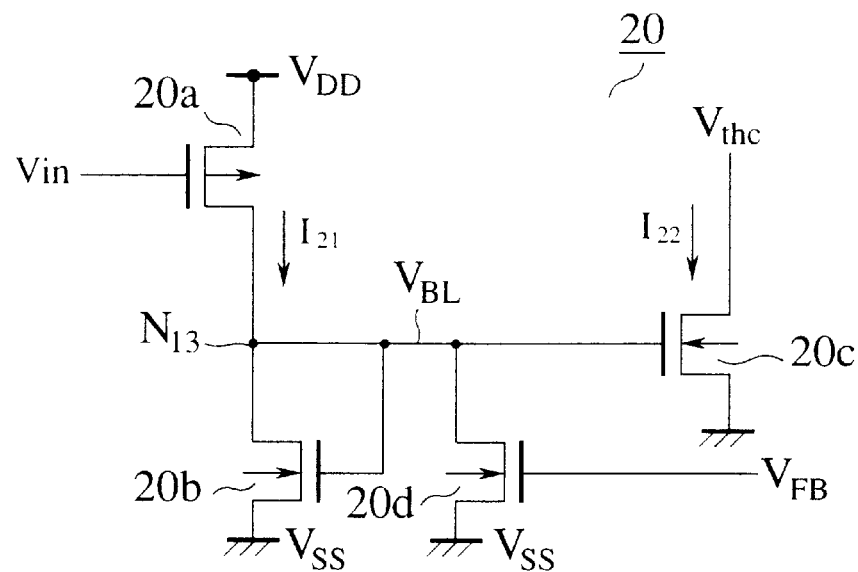
FIGS. 4A and 4B are a circuit diagram of a N-type current mirror circuit 20 and an explanation diagram showing an operation of the N-type current mirror circuit 20, respectively, in the Schmitt trigger circuit of the first embodiment.
Figure 4B:
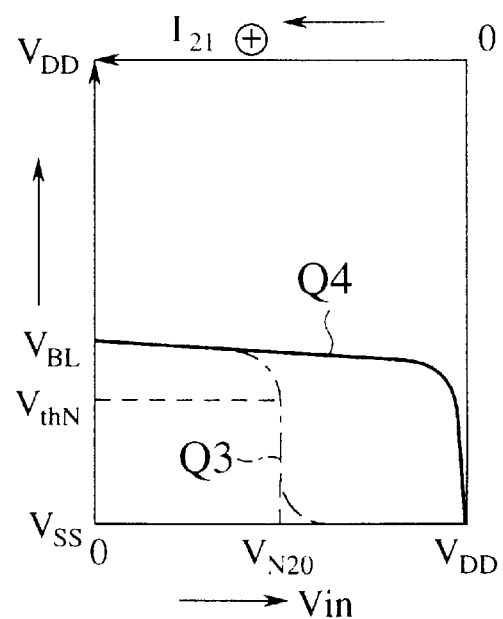

FIGS. 4A and 4B are a circuit diagram of a N-type current mirror circuit 20 and an explanation diagram showing an operation of the N-type current mirror circuit 20, respectively, in the Schmitt trigger circuit of the first embodiment.

Specifically, as shown in FIG. 2 and FIG. 4A, the N-type current mirror circuit 20 comprises a P-MOS transistor 20a (first input transistor) and a N-MOS transistor 20b (second constant current load means) connected in series between the high voltage power source VDD and the ground voltage power source VSS through a second input node N13, a N-MOS transistor 20c (second output transistor) connected between the node N11 and the ground voltage power source VSS, and an N-MOS transistor 20d (second output current control transistor) connected between the node N13 and the ground voltage power source VSS.

That is, in the N-type current mirror circuit 20, the output voltage VBL is generated at the input node N13 by using the following configuration:

The drain terminal of the P-MOS transistor 20a whose gate receives the external input signal Vin is connected to the drain terminal of the N-MOS transistor whose gate and drain are connected to each other.

The gate of the N-MOS transistor 20c, whose gate terminal receives the output voltage VBL, is connected to the gate and the drain of the N-MOS transistor 20b and the input node N13, namely both gate input voltage levels are same.

N-MOS transistor 20d and the N-MOS transistor 20b are placed in parallel, and both drains of them are connected to each other. The gate terminal of the N-MOS transistor 20d receives the feed-back control signal from the amplifier 30, like the P-MOS transistor 10d in the P-type current mirror circuit 10 described above, so that the feed-back control signal VFB can control the operation of the N-type current mirror circuit 20 at all times.

On the other hand, because the gate and the drain of the N-MOS transistor 20d are connected to each other, it is usually saturated, namely enters the saturated state. Thereby, the N-MOS transistor 20d operates as the constant current load for the P-MOS transistor 20a controlled by the external input signal Vin. Therefore the magnitude of the current flowing through the P-MOS transistor 20a and the N-MOS transistor 20b can be controlled and can be set to any required current value by controlling the operation of the P-MOS transistor 20a by using the external input signal Vin.

Here, as shown in FIG. 4A, when the current flowing through the P-MOS transistor 20a and the N-MOS transistor 20b is I21 and when the current flowing through the N-MOS transistor 20c is I22 in the N-type current mirror circuit 20, the relationship between the currents I12 and I22 can be obtained by the following process.

In this process, the current flowing through the P-MOS transistor 20a is IP20a, the current flowing through the N-MOS transistor 20b is IN20b, VFB is equal to VSS (VFB=VSS, namely the N-MOS transistor 20d enters the cut-off state.), and other MOS transistors operate in the saturated state.

The current equation for each MOS transistor can be obtained by using the equations (5) and (6) as follows:

$$I_{P20a} = \frac{\beta_{20a}}{2} \cdot (V_{DD} - V_{in} - |V_{thP}|)^2, \quad (5)$$

$$I_{N20b} = \frac{\beta_{20b}}{2} \cdot (V_{BL} - V_{thN})^2, \quad (6)$$

where, $$\beta_{10a} = \mu_P \cdot C_{OX} \cdot \frac{W_{20a}}{L}, \quad B_{20b} = \mu_N \cdot C_{OX} \cdot \frac{W_{20b}}{L},$$

μN and μp are carrier mobilities (absolute value) of a N-MOS transistor and a P-MOS transistor, respectively, Cox is a capacitance per unit area of a gate insulating film, W20a and W20b are channel widths of a P-MOS transistor and a N-MOS transistor, respectively, and L is a channel length of each of a P-MOS transistor and a N-MOS transistor, |Vthp| is an element threshold voltage (absolute value) of a P-MOS transistor, and VthN is an element threshold voltage All of the current IP20a from the P-MOS transistor 20a operating as the constant current source flows through the N-MOS transistor 20b. Therefore, I21=IP20a=IN20b, we obtain the following equation:

$$\frac{\beta_{20a}}{2} \cdot (V_{DD} - V_{in} - |V_{thP}|)^2 = \frac{\beta_{20b}}{2} \cdot (V_{BL} - V_{thN})^2.$$

$$\sqrt{\frac{\beta_{20b}}{\beta_{20a}}} = \frac{(V_{DD} - V_{in} - |V_{thP}|)}{(V_{BL} - V_{thN})} \quad (7)$$

$$(V_{DD} - V_{in} - |V_{thP}|) = (V_{BL} - V_{thN}) \cdot \sqrt{\frac{\beta_{20b}}{\beta_{20a}}}$$

$$V_{BL} = V_{thN} + \frac{(V_{DD} - V_{in} - |V_{thP}|)}{\sqrt{\beta_{20b}/\beta_{20a}}},$$

In addition, the output current of the N-MOS transistor 20c can be expressed by the following equation (8):

$$I_{22} = \frac{\beta_{20c}}{2} \cdot (V_{BL} - V_{thN})^2 \quad (8)$$

where, $$\beta_{20c} = \mu_N \cdot C_{OX} \cdot \frac{W_{20c}}{L},$$

W20c is the channel width of the N-MOS transistor 20c. From the equations (7) and (8), we can obtain the following result:

$$I_{22} = \frac{\beta_{20c}}{2} \cdot \left( \frac{(V_{DD} - V_{in} - |V_{thP}|)}{\sqrt{\beta_{20b}/\beta_{20a}}} \right)^2$$

$$= \frac{\beta_{20c}}{2} \cdot \frac{(V_{DD} - V_{in} - |V_{thP}|)^2}{\beta_{20b}/\beta_{20a}}$$

$$= \frac{\beta_{20a}}{2} \cdot (V_{DD} - V_{in} - |V_{thP}|)^2 \cdot \frac{\beta_{20c}}{\beta_{20b}}$$

$$I_{22} = I_{P20a} \cdot \frac{\beta_{20c}}{\beta_{20b}}.$$

Here, because IP20a=I21, we obtain the following result:

$$I_{22} = I_{21} \cdot \frac{\beta_{20c}}{\beta_{20b}} \rightarrow \frac{I_{22}}{I_{21}} = \frac{W_{20c}/L}{W_{20b}/L},$$

$$\frac{I_{22}}{I_{21}} = \frac{W_{20c}}{W_{20b}} \quad \text{or} \quad I_{22} \cdot W_{20b} = I_{21} \cdot W_{20c}.$$

Thereby, the ratio of the constant current values I21 and I22 can be set to a required ratio by using the transistor dimension ratio W20c/W20b of the N-MOS transistor 20b and the 20c.

As described above, in the N-type current mirror circuit 20, the magnitude of the constant current I21 can be controlled by changing the external input signal Vin. In addition, the ratio of the constant currents I12 and I22 can be set to a required value. Therefore the constant current value I22 of the N-MOS transistor 20c can be controlled by using the external input signal Vin and the characteristic shown in FIG. 4B can be obtained by decreasing the constant current output according to the increasing of the external input signal Vin.

Furthermore, as shown in FIG. 4B, in the on-state of the N-MOS transistor 20d (see the curve designated by Q3), namely in the VDD level of the feed-back control signal VFB, the output voltage VBL of the node N11 is not less than the element threshold voltage VthN until the current from the P-MOS transistor 20a reaches the current from the N-MOS transistor 20d, so that the N-MOS transistor 20c can be maintained in the saturated state. Thereby, the circuit threshold voltage VN20 of the N-type current mirror circuit 20 can be modulated. Therefore the N-type current mirror circuit 20 can operate only when the external input signal Vin is not over the threshold voltage VN20. In the drawing, the curve designated by Q4 designates the output voltage VBL when the N-MOS transistor 20d enters the cut-off state.

Hereinafter, the explanation for the preferred embodiments of the present invention will now be described under the condition that the N-MOS transistor 20d enters the cut-off state.

Both the drain terminals of the P-MOS transistor 10c and the N-MOS transistor 20c in both the P-type and N-type current mirror circuits are connected at the node N11 to each other, both current mirror circuits are compensated to each other so that the stable output voltage Vthc is provided to the node N11. The value of this output voltage Vthc can be set only by using the ratio of the constant current outputs from the P-type current mirror circuit 10 and the N-type current mirror circuit 20.

The amplifier 30 connected to the node N11 that is the common output terminal N11 of the P-type and N-type current mirror circuits 10 and 20 comprises inverter circuits 30a, 30b and 30c. The amplifier 30 amplifies the output voltage Vthc provided to the common output terminal N11 and generates and provides the external output signal Vout and the feed-back control signal VFB.

That is, the inverter circuit 30a as the primary stage in the amplifier 30 inverts and amplifies the signal Vthc transferred through the node N11 connected both the P-type and N-type current mirror circuit 10 and 20 and generates the signal Vthc1. The inverter circuits 30b and 30c as the following stages further invert and amplify the signal Vthc1. Then the inverter circuit 30b generates the feed-back control signal VFB and the inverter circuit 30c generates the output signal Vout, respectively.

The feed-back control signal VFB from the amplifier 30 is transferred to gates of the P-MOS transistor 10d and the N-MOS transistor 20d in the P-type and N-type current mirror circuit 10 and 20, respectively. By this configuration, the positive feed-back circuit is formed.

Next, the operation of the Schmitt trigger circuit of the first embodiment shown in FIG. 2 will now be explained.

When the level of the external input signal Vin is at the VSS level, the state of the N-MOS transistor 10b in the P-type current mirror circuit 10 in the cut-off state, the P-MOS transistor 20a enters the on-state. As a result, the signal Vthc becomes almost the VSS level and both the output signal Vout and the feed-back control signal become the VSS level.

In this state, the P-MOS transistor 10d and the N-MOS transistor 20d receiving the feed-back control signal VFB enter the on-state and the cut-off state, respectively. The gate voltage potential of each of the P-MOS transistors 10a and 10c becomes the VDD level, and both the P-MOS transistors 10a and 10c enter the cut-off state completely. At this time, because the N-MOS transistor 20d in the N-type current mirror circuit 20 enters the cut-off state, the N-MOS transistor 20d will not affect the Schmitt trigger circuit.

In the transition state in which the external input signal Vin is changed from the VSS level to the VDD level, both the N-MOS transistor 10b and the P-MOS transistor 20a whose gates receive the external input signal Vin operate so that a current corresponding to the external input signal Vin flows from the constant current load. However, the P-MOS transistor 10d in the P-type current mirror circuit 10 is in the on-state because the P-MOS transistor 10d receives the feed-back control signal VFB, and the circuit threshold voltage of the P-type current mirror circuit 10 is modulated to the VP10.

Accordingly, the P-type current mirror circuit 10 enters a constant current output state in which the level of the output Vthc reaches the VDD level only when the level of the external input signal Vin is not less than the circuit threshold voltage VP10. The hysteresis characteristic can be obtained by the circuit threshold voltage VP10 in the P-type current mirror circuit 10 is modulated by the P-MOS transistor 10d.

When the level of the external input signal Vin is over the circuit threshold voltage VP10 of the P-type current mirror circuit 10, the voltage potential level of the gate input voltage VBH of the P-MOS transistor 10c reaches the voltage potential level which is equal to the state when the P-MOS transistor 10c enters the cut-off state. The P-MOS transistor 10c starts to output the constant current output. Thereby, the voltage potential level of the signal Vthc is shifted to the VDD level.

The amplifier 30 further amplifies this signal Vthc and generates the external output signal Vout and the feed-back control signal VFB.

As described above, this feed-back control signal VFB is feed back to both the gates of the P-MOS transistor 10d and the N-MOS transistor 20d in the P-type and N-type current mirror circuits 10 and 20.

Thereby, the P-MOS transistor 10d is shifted to the cut-off state and the N-MOS transistor 20d is shifted to the on state because the feed-back control signal is amplified to the VDD level. Further, the circuit threshold voltage of the N-type current mirror circuit 20 is modulated and shifted to the voltage VN20, the gate input voltage VBL of the N-MOS transistor 20c enters the VSS level (see FIG. 4B) and the state of the N-MOS transistor 20c enters the cut-off state.

Thereby, the signal Vthc is only made by the constant current output of the P-MOS transistor 10c in the P-type current mirror circuit 10 and the signal Vthc is further amplified because the constant current output of the N-MOS transistor 20c is halted. After this, the feed-back control signal VFB becomes the VDD voltage level completely because the signal Vthc is amplified by the amplifier 30. This performs a positive feed-back amplification.

Thereby, the amplifier 30 can obtain the amplification ratio of approximately infinity, so that it can be achieved to decrease the delay of the output signal Vout to as small as possible a time interval and it can be also achieved to switch the Schmitt trigger circuit in a stable state and in a wide frequency range.

Figure 5:
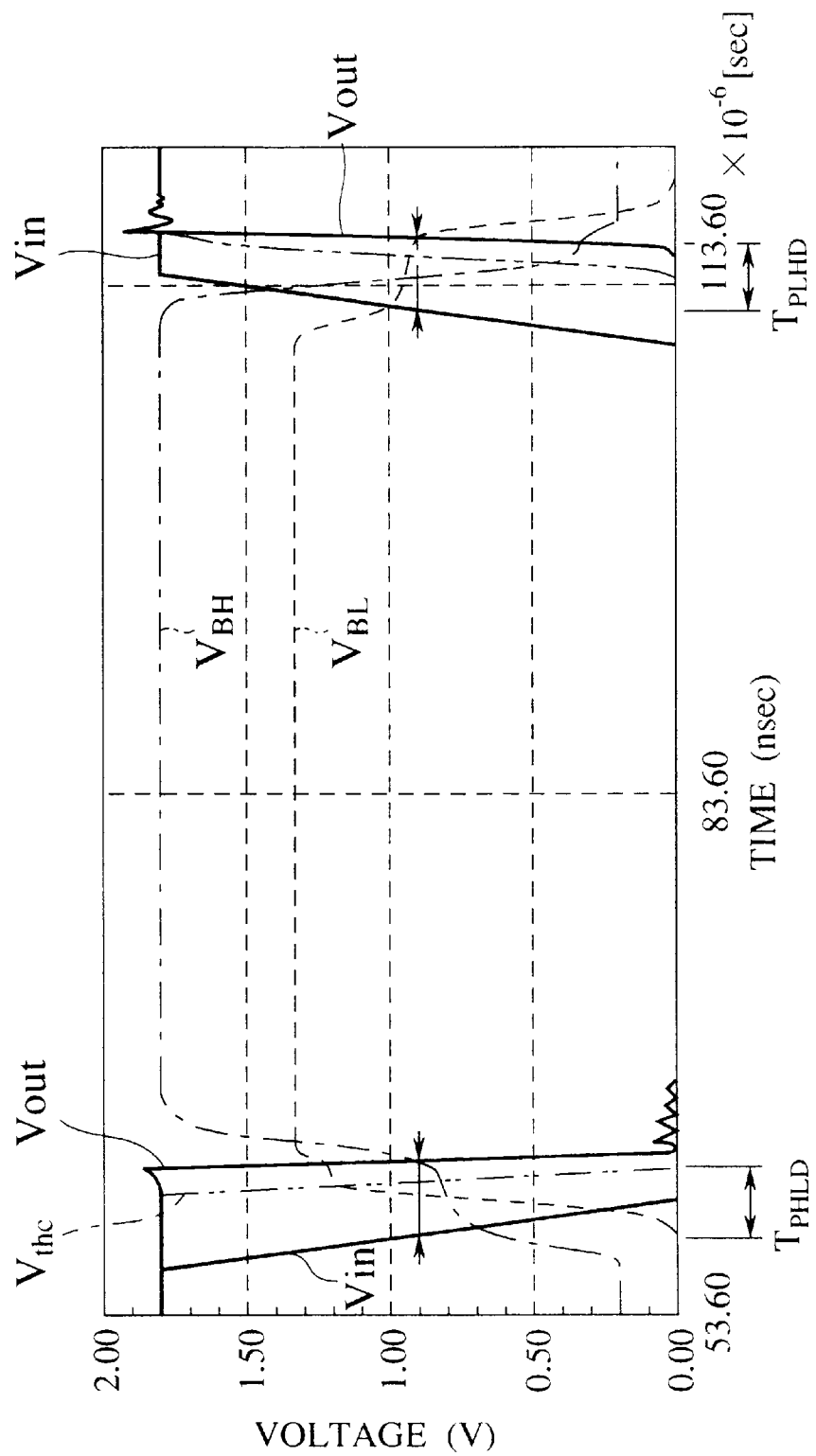
FIG. 5 is an explanation diagram showing a response at each terminal against a rectangular pulse input in the Schmitt trigger circuit of the first embodiment according to the present invention.

FIG. 5 is an explanation diagram showing a response at each terminal against a rectangular pulse input in the Schmitt trigger circuit of the first embodiment according to the present invention. On the other hand, FIG. 6 is an explanation diagram showing a response at each terminal against a rectangular pulse input in a conventional Schmitt trigger circuit.

Figure 6:
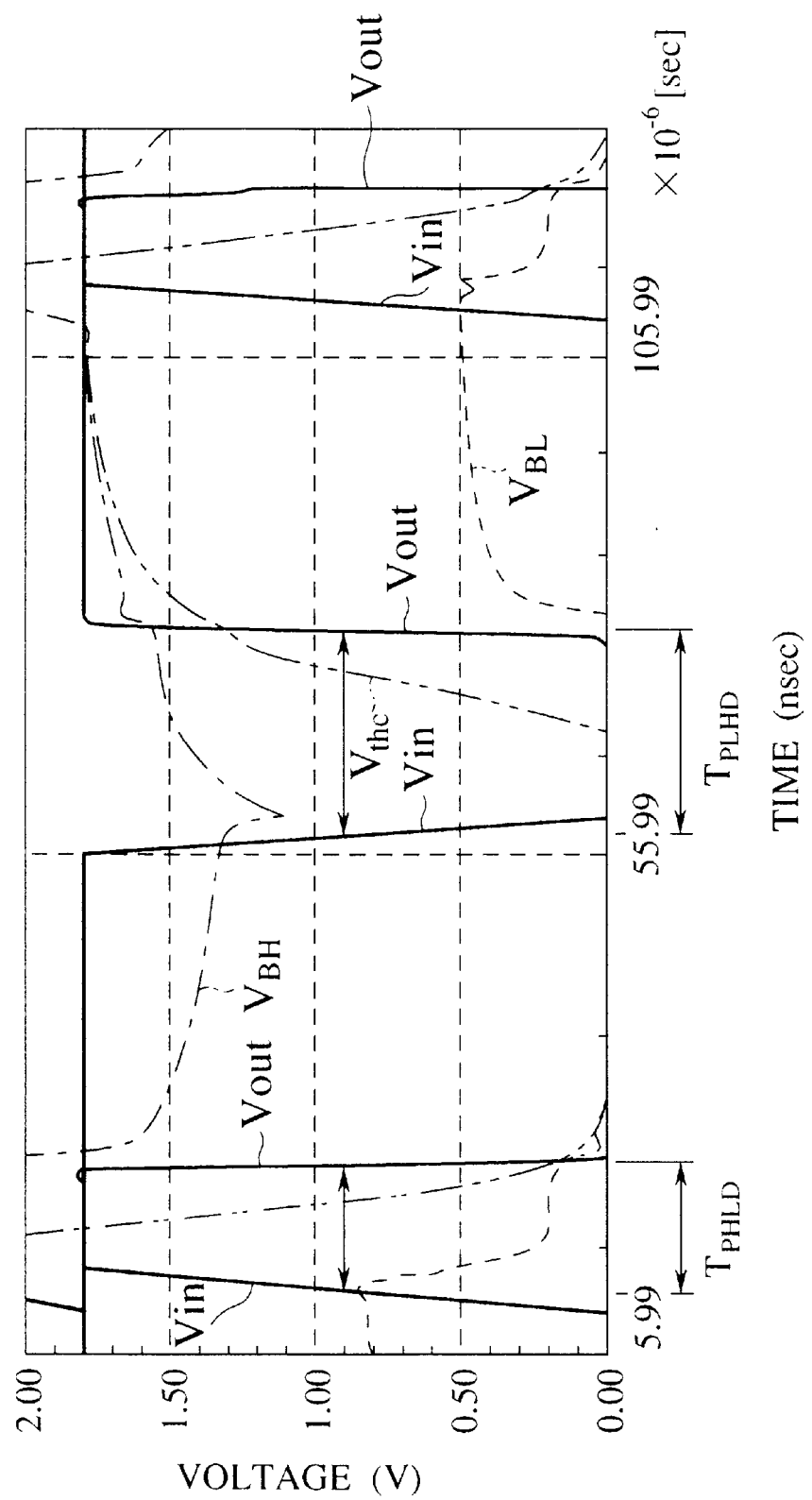
FIG. 6 is an explanation diagram showing a response at each terminal against a rectangular pulse input in a conventional Schmitt trigger circuit.

FIGS. 5 and 6 are waveform diagrams for comparing the Schmitt trigger circuit of the first embodiment with the conventional Schmitt trigger circuit in effect.

As clearly shown from both diagrams FIGS. 5 and 6, the response time (transmission delay time TPHLD and TPLHD) of each the P-type and N-type current mirror circuits is shorter than that of the conventional P-type and N-type current mirror circuits. The transmission delay time means that the time from that an input signal is received to that an output is obtained. That is, the transmission delay time TPLHD indicates the case that the output signal Vout is changed from a low level to a high level and the transmission delay time TPHLH means the case that the output Vout is changed from the high level to the low level.

Figure 7:
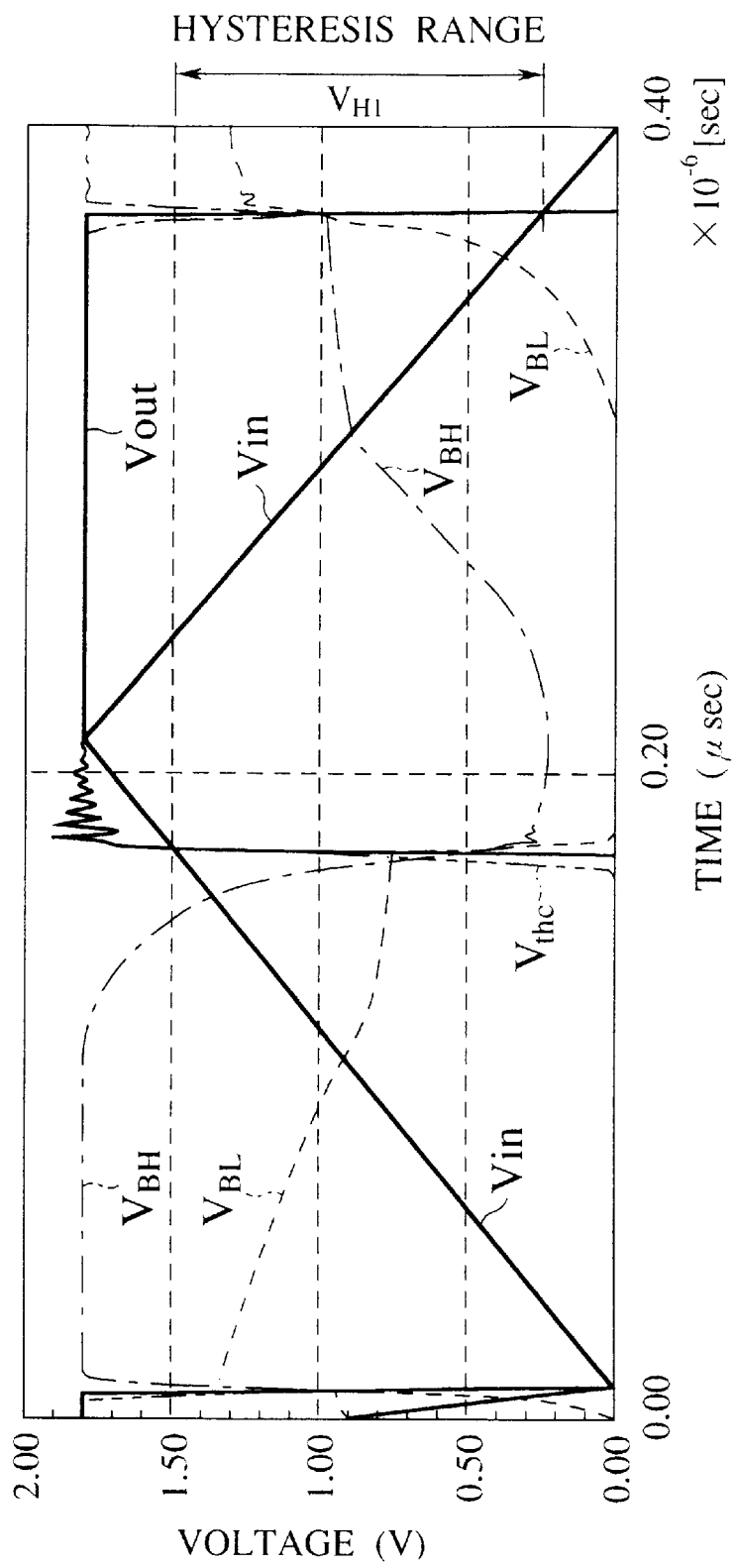
FIG. 7 is an operation diagram showing an input/output characteristic in the Schmitt trigger circuit according to the first embodiment.
Figure 8:
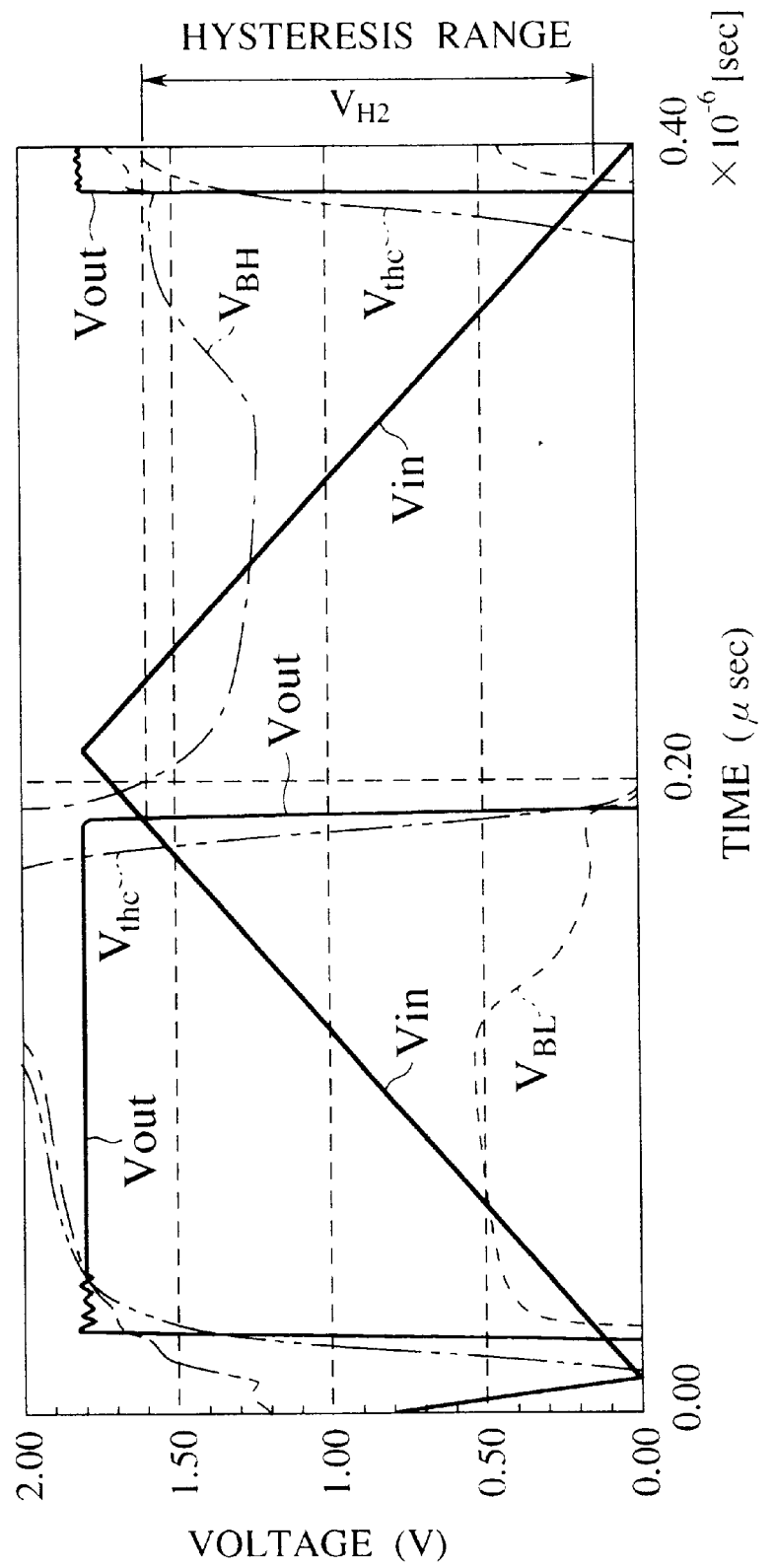
FIG. 8 is an operation diagram showing an input/output characteristic in the conventional Schmitt trigger circuit.

FIG. 7 is an operation diagram showing an input/output characteristic in the Schmitt trigger circuit of the first embodiment. FIG. 8 is an operation diagram showing an input/output characteristic in the conventional Schmitt trigger circuit. FIGS. 7 and 8 are diagrams showing a response of each of the terminals Vout and Vin against a triangle waveform input for comparing the effect of the Schmitt trigger circuit of the first embodiment with the effect of the conventional Schmitt trigger circuit. FIG. 7 shows the input/output characteristic according to the Schmitt trigger circuit of the first embodiment and FIG. 8 shows the input/output characteristic of the conventional Schmitt trigger circuit.

As clearly shown by these waveform-diagrams, the hysteresis width VHl of the Schmitt trigger circuit of the first embodiment is shorter than the hysteresis width VHZ of the conventional Schmitt trigger circuit, and the Schmitt trigger circuit of the first embodiment is capable of keeping the high level threshold voltage and the low level threshold voltage and is capable of improving the response characteristics against the external input signal Vin.

Figure 9:
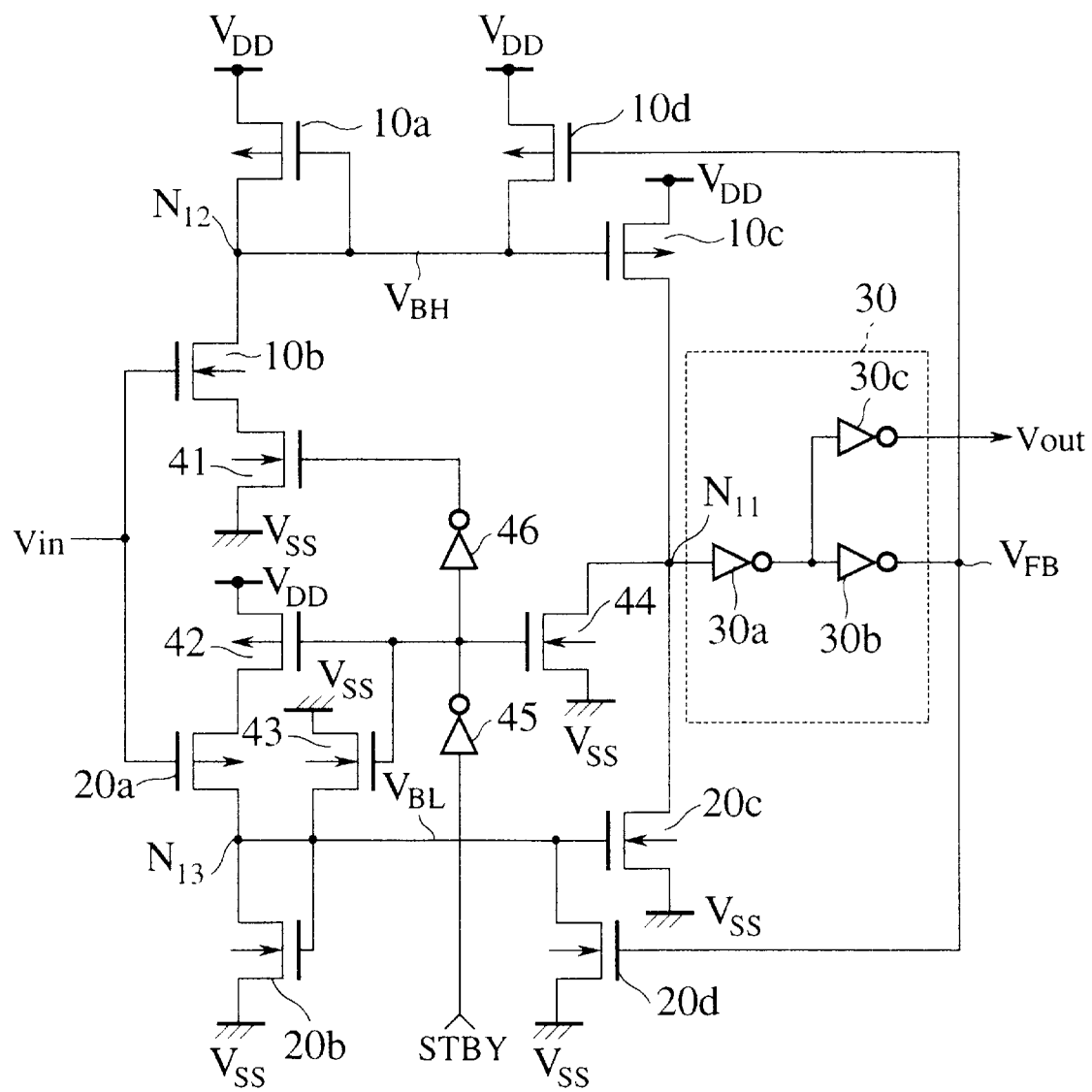
FIG. 9 is a circuit diagram showing a circuit configuration (the first configuration example) of a Schmitt trigger circuit having a stand-by function in addition to the configuration of the Schmitt trigger circuit of the first embodiment.

First example of a configuration of a Schmitt trigger circuit having a stand-by function FIG. 9 is a circuit diagram showing a circuit configuration (the first configuration example) of a Schmitt trigger circuit having a stand-by function in addition to the configuration of the Schmitt trigger circuit as the first embodiment shown in FIG. 2. In addition, the common configuration elements between FIGS. 2 and 9 are used with the same reference numbers in this embodiment. Therefore explanation for these elements are omitted here for brevity.

This Schmitt trigger circuit having the stand-by function comprises: the Schmitt trigger circuit having the configuration shown in FIG. 2, a current cut N-MOS transistor 41 (first current cut transistor) incorporated between the source terminal of the N-MOS transistor 10c and the ground voltage power source VSS, a current cut P-MOS transistor 42 (second current cut transistor) incorporated between the source of the P-MOS transistor 20a and the voltage power source VDD, N-MOS transistors 43 and 44 connected to the input node N13 and the output node N11, respectively, so as to fix a voltage potential at each node, and inverter circuits 45 and 46 connected in series (in two stages) for amplifying an external stand-by signal STBY. In the Schmitt trigger circuit having the stand-by function shown in FIG. 9, the connection point between the inverter circuits 45 and 46 is connected to the gates of the P-MOS transistor 42 and the N-MOS transistor 44, and the output terminal of the inverter circuit 46 is connected to the gate of the N-MOS transistor 41.

In the Schmitt trigger circuit having the configuration shown in FIG. 9, when the external stand-by signal STBY is at the VSS level, the Schmitt trigger circuit enters the stand-by mode, when the VSS level, it is in the normal operation mode. That is, when the external stand-by signal is at the VSS level, the N-MOS transistors 43 and 44 whose gates receive the inverted external stand-by signal /STBY that is inverted by the inverter circuit 45 enter the on state, so that the voltage potential level of both the nodes N11 and N13 are fixed to the VSS level. At this time, both the N-MOS transistor 41 and the P-MOS transistor 42 enter the cut-off state. In this state, each of current paths in the Schmitt trigger circuit enters the cut-off state in which there is no current flow, so that a power consumption of the Schmitt trigger circuit is zero.

On the other hand, when the external stand-by signal is at the VDD level, both the N-MOS transistors 43 and 44 enter the cut-off state and both the N-MOS transistor 41 and the P-MOS transistor 42 enter the on-state. In this state, the Schmitt trigger circuit enters the normal operation mode and all circuit elements forming the stand-by function do not affect to the function and the operation of the Schmitt trigger circuit.

Figure 10:
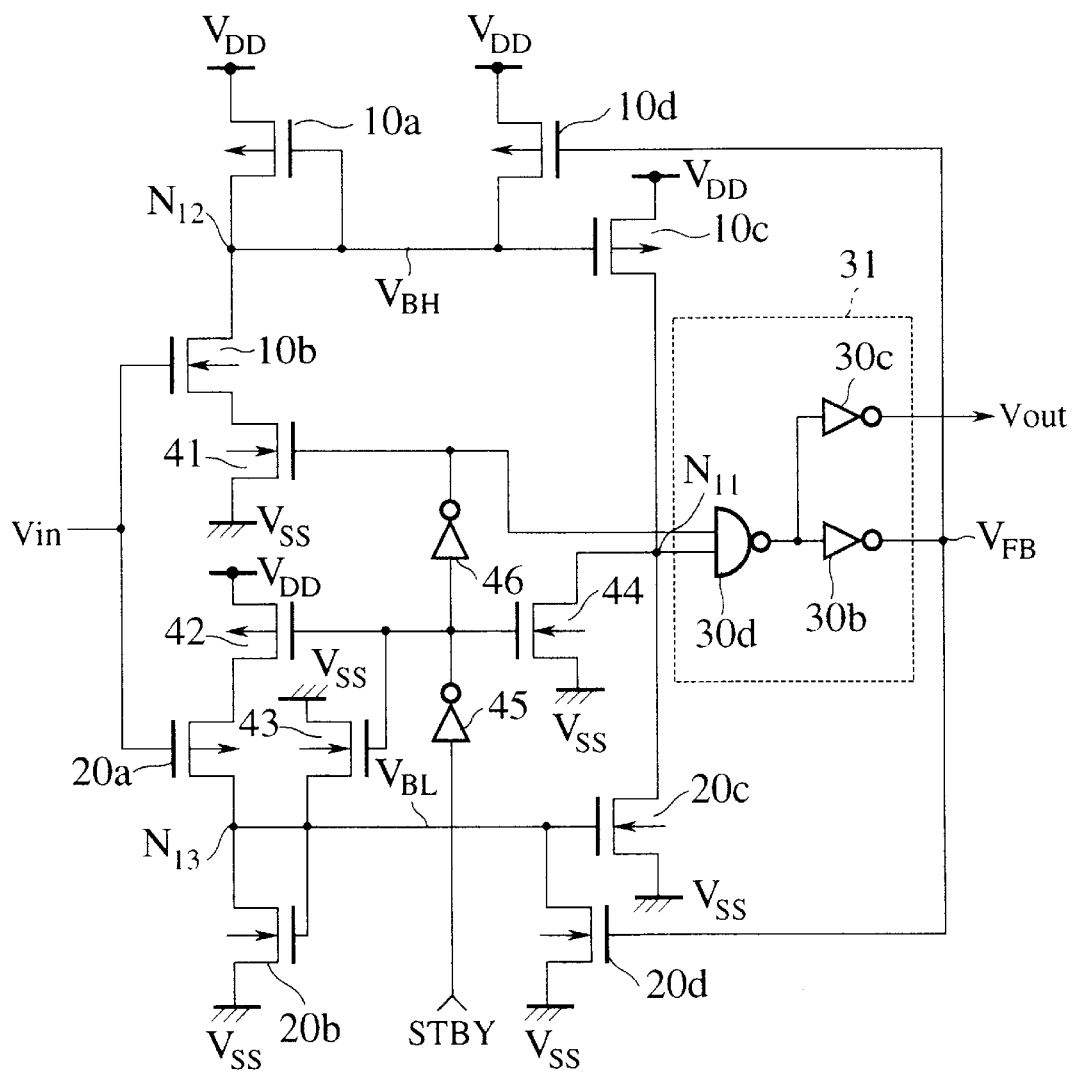
FIG. 10 is a circuit diagram showing a circuit configuration (the second configuration example) of a Schmitt trigger circuit having a stand-by function in addition to the configuration of the Schmitt trigger circuit of the first embodiment.

Second example of a configuration of a Schmitt trigger circuit having a stand-by function FIG. 10 is a circuit diagram showing a circuit configuration (the second configuration example) of a Schmitt trigger circuit having a stand-by function in addition to the configuration of the Schmitt trigger circuit as the first embodiment shown in FIG. 2. In addition, the common configuration elements between FIGS. 2 and 9 are used with the same reference numbers in this embodiment. Therefore explanation for these elements are omitted here for brevity.

In an amplifier 31 in the Schmitt trigger circuit shown in FIG. 10, the inverter 30a in the amplifier 30 in the Schmitt trigger circuit shown in FIG. 9 is replaced with a NAND gate 30d and one input terminal of the NAND gate 30d is connected to the output terminal of the inverter 46 and the other input terminal is connected to the node N11.

By using the configuration of the amplifier 31, the Schmitt trigger circuit has the same function as the Schmitt trigger circuit of the first example shown in FIG. 9.

Figure 11:
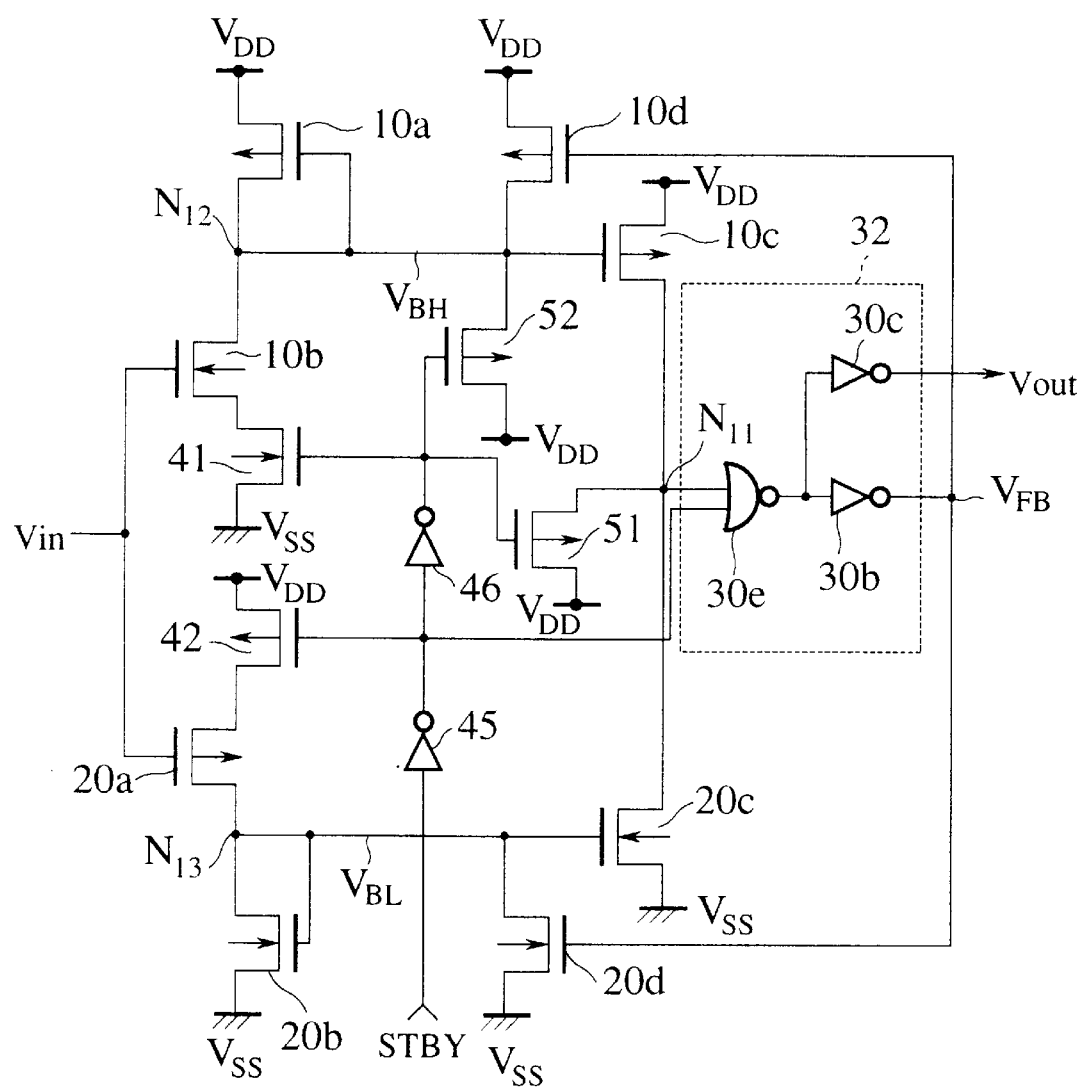
FIG. 11 is a circuit diagram showing a circuit configuration (the third configuration example) of a Schmitt trigger circuit having a stand-by function in addition to the configuration of the Schmitt trigger circuit of the first embodiment.

Third example of a configuration of a Schmitt trigger circuit having a stand-by function FIG. 11 is a circuit diagram showing a circuit configuration (the third configuration example) of a Schmitt trigger circuit having a stand-by function in addition to the configuration of the Schmitt trigger circuit of the first embodiment shown in FIG. 2. In addition, the common configuration elements between FIGS. 2 and 11 are used with the same reference numbers in this embodiment. Therefore explanation for these elements are omitted here for brevity.

In an amplifier 32 in the Schmitt trigger circuit shown in FIG. 11, the N-MOS transistors 43 and 44 in the amplifier 30 in the Schmitt trigger circuit shown in FIG. 9 are removed and the inverter circuit 30a in the amplifier 30 shown in FIG. 2 is replaced with the NOR gate 30e. The amplifier 32 shown in FIG. 11 and one terminal of the NOR gate 30e is connected to the node N11 and the other terminal of the NOR gate 30e is connected to the output terminal of the inverter 45. In addition, a P-MOS transistor 51 is connected between the node N11 and the voltage power source VDD and a P-MOS transistor 52 is connected between the node N12 and the voltage power source VDD. Each gate of the P-MOS transistors 51 and 52 is connected to the output terminal of the inverter 46.

By using the configuration of the Schmitt trigger circuit, each of direct current paths can be cut-off, and both the node N11 and N12 are fixed to the VDD level simultaneously, so that the power consumption of the Schmitt trigger circuit can be reduced to zero during the stand-by mode.

Fourth example of a configuration of a Schmitt trigger circuit having a stand-by function.

Figure 12:
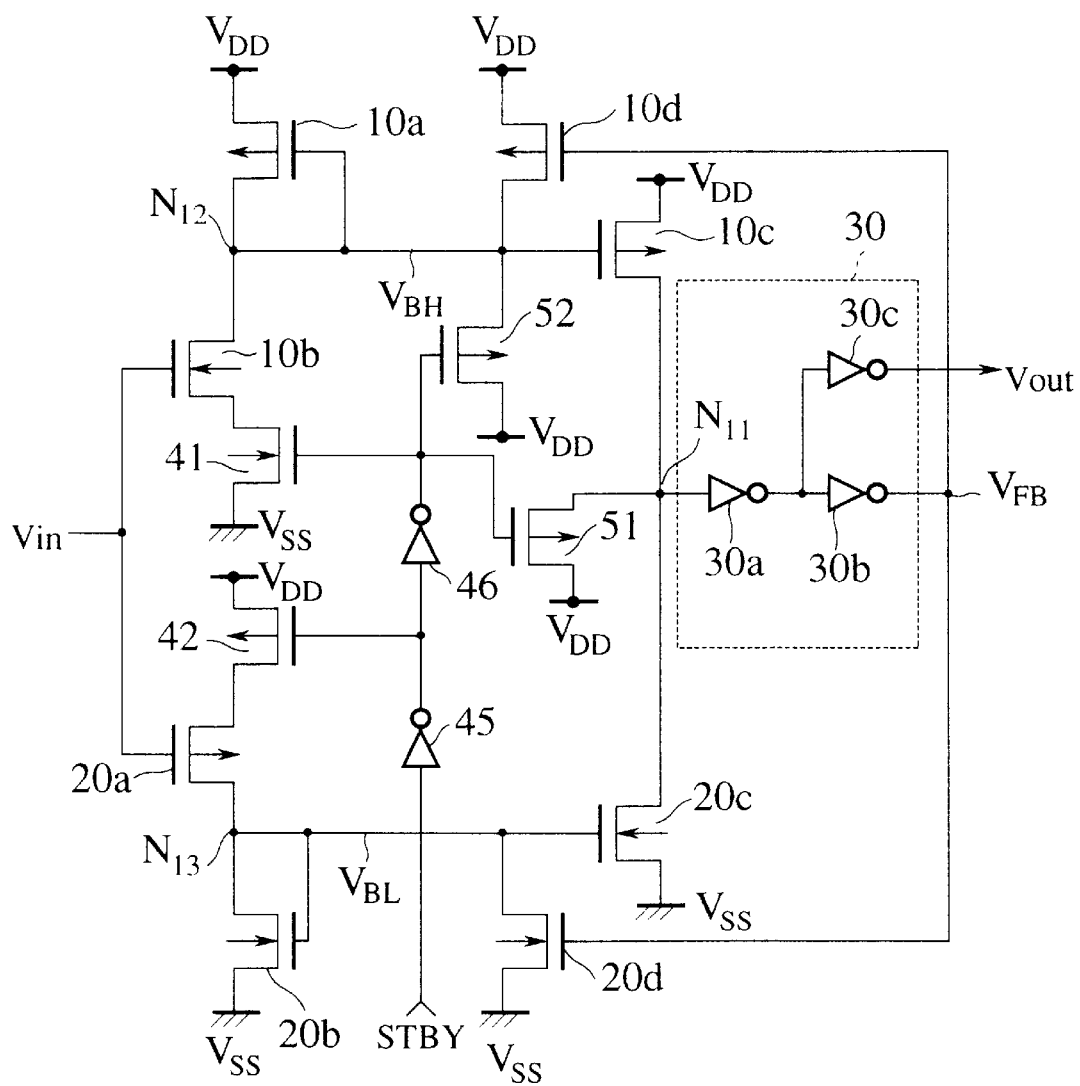
FIG. 12 is a circuit diagram showing a circuit configuration (the fourth configuration example) of a Schmitt trigger circuit having a stand-by function in addition to the configuration of the Schmitt trigger circuit of the first embodiment.

FIG. 12 is a circuit diagram showing a circuit configuration (the fourth configuration example) of a Schmitt trigger circuit having a stand-by function in addition to the configuration of the Schmitt trigger circuit of the first embodiment shown in FIG. 2. In addition, the common configuration elements between FIGS. 2 and 12 are used with the same reference numbers in this embodiment. Therefore explanation for these elements are omitted here for brevity.

In the Schmitt trigger circuit shown in FIG. 12, the N-MOS transistors 43 and 44 in the amplifier 30 in the Schmitt trigger circuit shown in FIG. 9 are removed and both the P-MOS transistors 51 and 52 are incorporated, like the third example shown in FIG. 11.

By using the configuration of the Schmitt trigger circuit shown in FIG. 12, like the example shown in FIG. 11, each of direct current paths can be cut, namely enters the cut-off state, and both the node N11 and N12 are fixed to the VDD level simultaneously, so that the power consumption of the Schmitt trigger circuit can be set to zero during the stand-by mode.

Embodiment 2

Figure 13A:
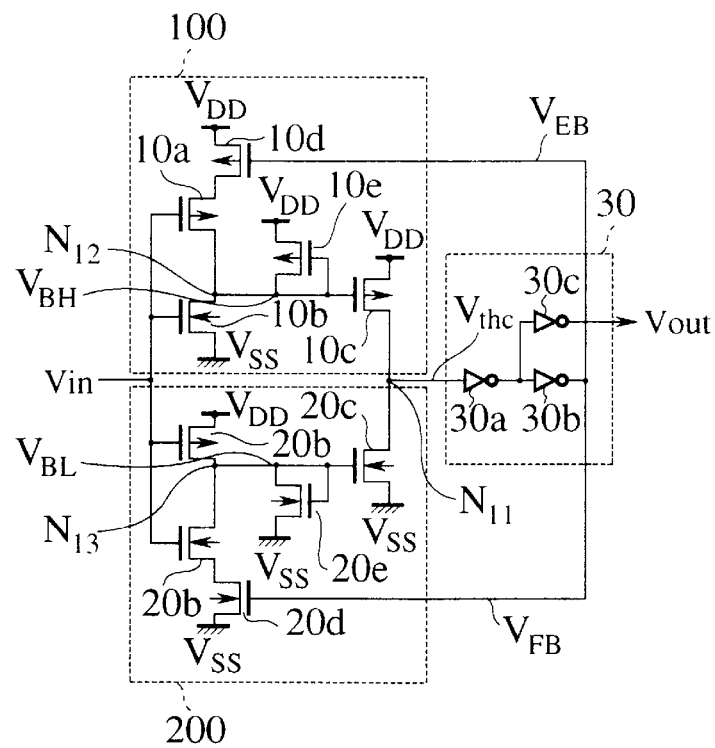
FIGS. 13A and 13B are a circuit diagram of a Schmitt trigger circuit, as a semiconductor integrated circuit, of a second embodiment according to the present invention and an explanation diagram showing an operation of the Schmitt trigger circuit, respectively.
Figure 13B:
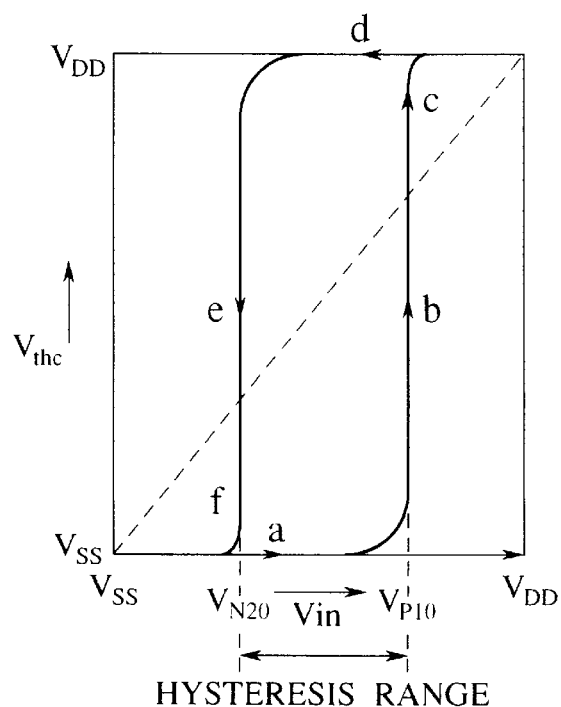
Figure 14A:
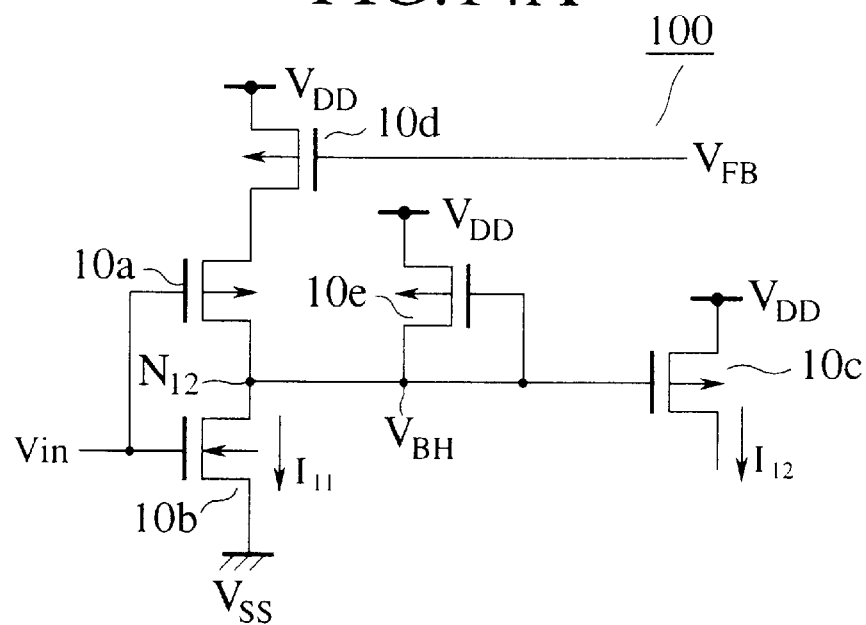
FIGS. 14A and 14B are a circuit diagram of a P-type current mirror circuit and an explanation diagram showing an operation of the P-type current mirror circuit, respectively, in the Schmitt trigger circuit of the second embodiment.
Figure 14B:
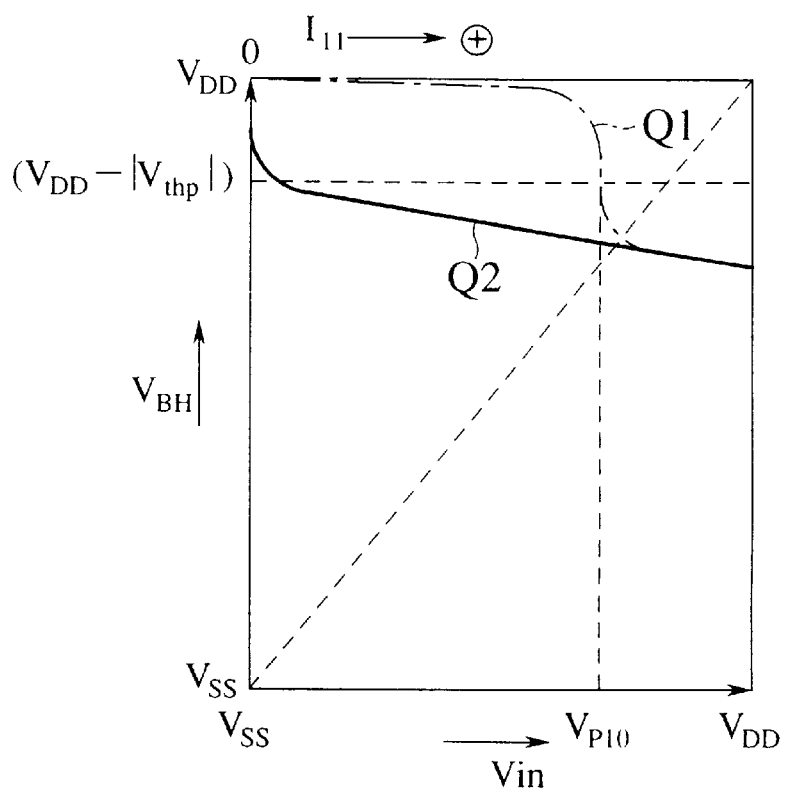
Figure 15A:
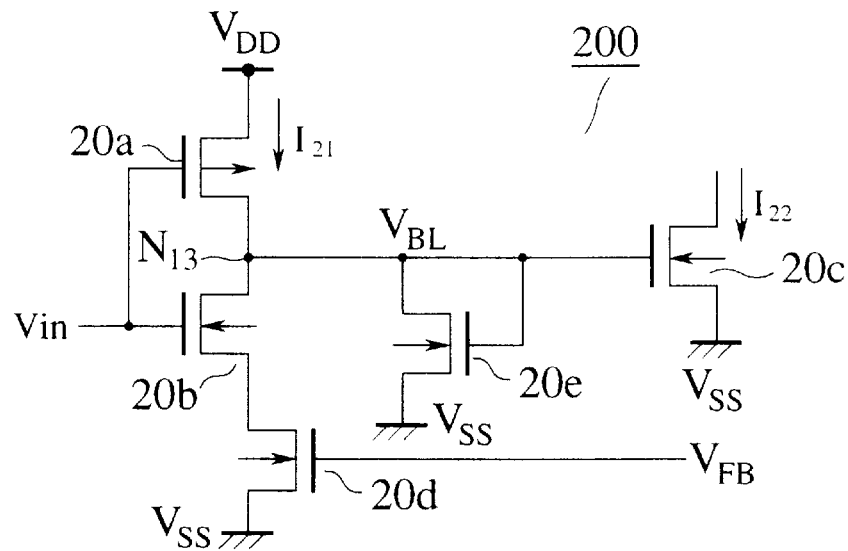
FIGS. 15A and 15B are a circuit diagram of a N-type current mirror circuit and an explanation diagram showing an operation of the N-type current mirror circuit, respectively, in the Schmitt trigger circuit of the second embodiment.
Figure 15B:
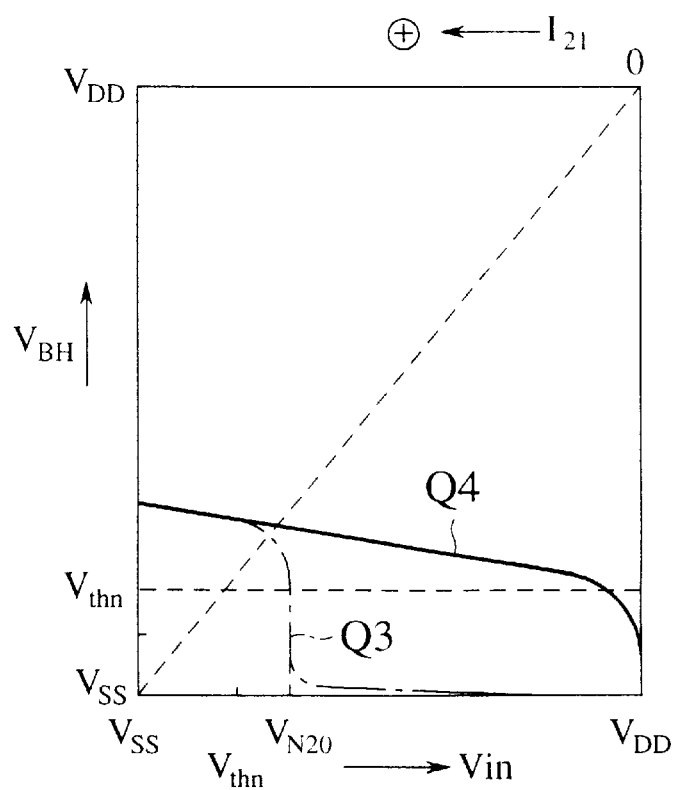

FIGS. 13A and 13B are a circuit diagram of a Schmitt trigger circuit, as a semiconductor integrated circuit, of a second embodiment according to the present invention and an explanation diagram showing an operation of input/output characteristics (a hysteresis characteristic) of the Schmitt trigger circuit, respectively. FIGS. 14A and 14B are a circuit diagram of a P-type current mirror circuit and an explanation diagram showing an input/output characteristics of the P-type current mirror circuit, respectively, in the Schmitt trigger circuit of the second embodiment. FIGS. 15A and 15B are a circuit diagram of a N-type current mirror circuit and an explanation diagram showing an input/output characteristics of the N-type current mirror circuit, respectively, in the Schmitt trigger circuit of the second embodiment.

The basic configuration of the Schmitt trigger circuit according to the second embodiment is the same as the Schmitt trigger circuit of the first embodiment shown in FIG. 1. In addition, the common configuration elements between the Schmitt trigger circuits of the first and second embodiments are used with the same reference numbers in this embodiment. Therefore explanation for these elements are omitted here for brevity.

In the Schmitt trigger circuit of the second embodiment, an output signal Vthc is amplified by using the amplifier 30 and the amplifier 30 generates an external output signal Vout and a feed-back control signal VFB. This can be achieved by the configuration that the output terminal of a P-type current mirror circuit 100 is connected to the output terminal of a N-type current mirror circuit 200 at an output terminal N11.

The inverter circuit 30a as the primary stage in the amplifier 30 inverts and amplifies the signal Vthc transferred through the node N11 connected both the P-type and N-type current mirror circuit 100 and 200 and generates the signal Vthc1. The inverter circuits 30b and 30c as the following stages further invert and amplify the signal Vthc1. Then the inverter circuit 30b generates the feed-back control signal VFB and the inverter circuit 30c generates the output signal Vout, respectively.

The feed-back control signal VFB from the amplifier 30 is transferred to gates of the P-MOS transistor 10d and the N-MOS transistor 20d in the P-type and N-type current mirror circuit 100 and 200, respectively. The positive feed-back circuit can be formed by this configuration including the P-type current mirror circuit 100, the N-type current mirror circuit and the amplifier 30.

The configuration and the operation of the Schmitt trigger circuit according to the second embodiment will now be explained more concretely.

As shown in FIGS. 13A and 14A, the P-type current mirror circuit 100 comprises a P-MOS transistor 10a and a N-MOS transistor 10b, whose gates receive the external input signal Vin and whose drains are commonly connected through the node N12, a P-MOS transistor 10d, whose gate receives the feed-back control signal VFB transferred from the amplifier 30, connected between the source of the P-MOS transistor 10a and the voltage power source VDD, a P-MOS transistor 10e, whose gate and drain are commonly connected through the node N12, connected between the voltage power source VDD and the node N12, and a P-MOS transistor 10c whose gate receives the signal VBH from the P-MOS transistor 10e.

In the P-type current mirror circuit 100, the gate voltage potentials of both the P-MOS transistor 10c and the P-MOS transistor 10e whose gates receive the signal VBH are same. The drain terminals of both the P-MOS transistors 10a and 10d connected in series between the voltage power source VDD and the node N12 are commonly connected through the node N12. The gate of the P-MOS transistor 10d which is connected to the P-MOS transistor 10a in series receives the feed-back control signal VFB so that the state of the node N12 is reflected from the state of the feed-back control signal VFB transferred from the amplifier 30.

The P-MOS transistor 10e is in the saturated state because both gate and drain of the P-MOS transistor 10e are commonly connected through the node N12 and operates as an active load (or a constant current load) controlled by the external input signal Vin. Accordingly, the constant current flowing through the P-MOS transistor 10e and the N-MOS transistor 10b can be set to a required current value by controlling the operation of the N-MOS transistor 10b based on the external input signal Vin.

While the level of the feed-back control signal VFB is at the VDD level, the P-MOS transistor 10d is in the cut-off state, and the source terminal of the P-MOS transistor 10a receives no VDD level. Therefore, the P-MOS transistor 10a whose drain is connected to the node N12 gives no effect to the node N12. Accordingly, while the level of the feed-back control signal VFB is at the VDD level, the P-MOS transistor 10a gives no effect to the characteristics, operation, and the effect of the means comprising the P-MOS transistors 10e and 10c and the N-MOS transistor 10b for converting the external input signal Vin to a positive constant current.

Here, when the current flowing through the P-MOS transistor 10c whose gate is connected to the node N12 is designated by the reference character I12 and the current flowing through the P-MOS transistor 10e as the active load is denoted by the reference character I11, we obtain the following relationship because both gates of the P-MOS transistors 10c and 10e are commonly connected to the node N12 and the voltage potentials of those gates are equal to each other:

$$I12/I11 = W10c/W10e,$$

where a transistor dimension of each of the P-MOS transistors 10c and 10e is W10c/L, W10e/L, respectively (a channel length of each of the P-MOS transistors 10c and 10e is L).

Therefore the constant current value I12 of the P-MOS transistor 10c can be set to a required current value only by the channel width ratio W10c/W10e and the constant current output of the P-MOS transistor 10c can be controlled by using the external input signal Vin. As shown by the solid line in FIG. 14B, the P-type current mirror circuit has the input/output characteristics of the positive constant current source tracing the path Q (P-MOS transistor 10d is OFF) in which the constant current output is increased according to the increasing of the external input signal Vin.

When the level of the feed-back control signal VFB transferred from the amplifier 30 is at the VSS level, the P-MOS transistor 10d is in the on-state, the source of the P-MOS transistor 10a whose source is connected to the voltage power source VDD enters the active state because both P-MOS transistors 10a and 10e are connected in series between the voltage power source VDD and the node N12. Further, the state of the P-MOS transistor 10a can be controlled by using the external input signal Vin because the gate of the P-MOS transistor 10a receives the external input signal Vin.

In the above state, the P-MOS transistors 10d and 10a connected to the voltage power source VDD in series through the node N12 and the N-MOS transistor 10b connected to the ground power source VSS through the node N12 are connected between the voltage power source VDD and the ground power source VSS in series and those MOS transistors forms a reverse amplifier circuit that also forms other direct current path in addition to the P-MOS transistor 10e operating as the constant current load for the N-MOS transistor 10b.

Therefore the output voltage VBH at the node N12 works to maintain the P-type current mirror circuit 100 in the cut-off state and the output voltage VBH at the node N12 becomes more than the element threshold voltage of the P-MOS transistor 10c (VDD−|Vthp|) until the current value from the P-MOS transistor 10a as the constant current load controlled by the external input signal Vin is equal to the current from the N-MOS transistor 10b controlled by the external input signal Vin (where the element threshold voltage Vthp has a negative sign because the voltage power source VDD is used as a reference voltage, so the absolute sign is added to the VthPn namely |Vthp|.).

In addition, when the external input signal Vin is over the threshold voltage VP10 of the P-type current mirror circuit 100 and when the output voltage VBH goes below the element threshold voltage Vthp (VDD−|Vthp|) of each of the P-MOS transistors 10 and 10c, the constant current is provided into the N-MOS transistor 10b according to the constant current characteristics of the P-MOS transistor 10e as the active load (or the constant current load).

Accordingly, the constant current output of the P-MOS transistor 10a controlled by using the external input signal Vin is decreased by increasing the external input signal Vin and the output VBH at the node N12 is decreased by increasing the constant current output from the N-MOS transistor 10b, so that the P-MOS transistor on-characteristics in which the output of the constant current of the P-MOS transistor 10c is started at the same time when the P-MOS transistor 10e enters the on state (the slope indicated by Q1) shown in FIG. 14B can be obtained.

In addition, in the state that the feed-back control signal VFB is in the VSS level, the P-MOS transistor 10d is in the on-state, the source of the P-MOS transistor 10a is connected to the ground voltage level VSS in order to form the reverse amplifier. Therefore, by forming the reverse amplifier, the circuit threshold voltage of the P-type current mirror circuit 100 can be modulated to the level of the VP10. This VP10 can be determined by the transistor dimension ratio W/L of both the P-MOS transistors 10a and 10d and the N-MOS transistor 10b. Therefore when it is required to shift the circuit threshold voltage VP10 of the P-type current mirror circuit 100 to a high voltage potential side, the transistor dimension ratio of each of the P-MOS transistors 10a and 10d is increased, and the transistor dimension ratio W/L of the N-MOS transistor 10b is decreased. Thereby, it can be easily achieved to shift the circuit threshold voltage VP10 of the P-type current mirror circuit 100 toward the high voltage potential level side.

Next, the configuration and the operation of the N-type current mirror circuit 200 shown in FIGS. 13A and 15A will now be explained.

The N-type current mirror circuit comprises a P-MOS transistor 20a and a N-MOS transistor 20b whose gates receive the external input signal Vin and whose drains are commonly connected through the node N13, an N-MOS transistor 20d, whose gate receives the feed-back control signal VFB transferred from the amplifier 30, placed between the source of the P-MOS transistor 10b and the ground power source VSS, a N-MOS transistor 20e for generating the signal VBL, whose gate and drain are commonly connected through the node N13, connected between the ground power source VSS and the node N13, and a N-MOS transistor 20c for receiving the signal VBL. Here, the gate voltage potential of the N-MOS transistor 20c is the same as the N-MOS transistor 20e because both gate and drain of the N-MOS transistor 20e are commonly connected to each other and the gate input voltage potential of each of the N-MOS transistors 20c and 20e is same.

In addition, the drains of both the N-MOS transistor 20b, which is connected to the N-MOS transistor 20d in series between the ground power source VSS and the node N13, and the N-MOS transistor 20e are commonly connected through the node N13 in parallel.

In addition, the gate terminal of the N-MOS transistor 20d receives the feed-back control signal VFB so as to usually reflect the state of the feed-back control signal VFB from the amplifier 30.

The N-MOS transistor 20e is always in the saturated state because the gate and the drain of the N-MOS transistor 20e are connected commonly through the node N133 and acts as the active load (or the constant current load) for the P-MOS transistor 20a controlled by the external input signal Vin. Accordingly, the value of the constant current flowing between the N-MOS transistor 20e and the P-MOS transistor 20a can be set to a required current value by controlling the operation of the P-MOS transistor 20a based on the external input signal Vin.

In addition, when the level of the feed-back control signal VFB is at the VSS level, the N-MOS transistor 20d is in the cut-off state, so that no VSS level is provided to the source terminal of the N-MOS transistor 20b. In this state, the N-MOS transistor 20b whose drain terminal is connected to the node N13 gives no effect to the node N13.

When the feed-back control signal VFB is therefore at the VSS level, the characteristics, operation and effect of the means (namely, the N-type current mirror circuit) for converting the external input signal Vin to the negative voltage power source are not changed.

Here, when the current flowing through the P-MOS transistor 20c whose gate is connected to the node N13 is designated by the reference character I22 and when the current flowing through the N-MOS transistor 20e which acts as the active load is denoted by the reference character I21, the current I22 and I21 flowing through the N-MOS transistors 20c and 20e, respectively, has the following relationship because both the gates of the N-MOS transistors 30c and 20e are commonly connected and have the same voltage potential.

$$I22/I21 = W20c/W20e,$$

where transistor dimensions of the N-MOS transistors 20a and 20e are W20c/L, W20e/L, respectively (the channel lengths of both N-MOS transistors 20c and 20e are same). Thereby the constant current value can be set to a desired value only by adjusting the channel width dimension rates of the N-MOS transistors 20c and 20e.

Accordingly, the constant current output of the N-MOS transistor 20c can be controlled by using the external input signal Vin and traces the path Q4 in which the constant current output is decreased when the level of the external input signal Vin is increased and has the negative constant current power source input/output characteristics, as shown by the solid line in FIG. 15B.

Here, when the feed-back control signal VFB transferred from the amplifier 30 is in the VDD level, the N-MOS transistor 20d is in the on-state, the source of the N-MOS transistor 20b is in the VSS level, namely in the active state because the N-MOS transistors 20b and 20d are connected in series. Further, the N-MOS transistor 20b can be controlled by using the external input signal Vin because the gate of the N-MOS transistor 20b receives the external input signal Vin.

In the above state, it can be achieved to form the circuit configuration that the N-MOS transistors 20b and 20d connected in series through the ground voltage source VSS through the node N13 and the P-MOS transistor 20a connected to the voltage power source VDD through the node N13 are connected in series between the voltage power source VDD and the ground power source VSS. This circuit. configuration generates a new current path between the N-MOS transistors 20b and 20d and becomes a reverse amplifier circuit.

Accordingly, the output voltage VBL at the node N13 is not less than the element threshold voltage (VSS+Vthn) of the N-MOS transistor 20c until the current from the N-MOS transistor 20b whose constant current load is controlled by the external input signal Vin reaches the current from the P-MOS transistor 20a whose constant current load is also controlled by the external input signal Vin, so that the N-MOS transistor 20c can be maintained in-the cut-off state. Thereby, the circuit threshold voltage VN20 of the N-type current mirror circuit 200 can be modulated. Therefore the N-type current mirror circuit 200 can operate only when the external input signal Vin is not over the threshold voltage VN20.

When the level of the external input signal Vin is not less than the element threshold voltages Vthn, (VSS+Vthn), of the N-MOS transistors 20e and 20c after it is changed from the VDD level side to the threshold voltage VN20 of the N-type current mirror circuit 200, the negative current is provided to the P-MOS transistor 20a according to the constant current characteristics of the N-MOS transistor 20e as the active load (as the constant current load).

Accordingly, the constant current output of the N-MOS transistor 20b as the constant current load controlled by the external input signal Vin is decreased according to the decreasing of the level of the external input signal Vin. On the contrary, the output VBL at the node N13 is increased by increasing the constant current output of the P-MOS transistor 20a. When the N-MOS transistor 20e enters the on-state, the on-characteristics (designated by the slope Q3) of the N-MOS transistor 20d can be obtained simultaneously.

In addition, when the feed-back control signal VFB is in the VDD level, the reverse amplifier is formed, namely the N-MOS transistor 20d is in the on-state, the source of the N-MOS transistor 20b is connected to the ground power source VSS. That is, In this reverse amplifier circuit, the circuit threshold voltage of the N-type current mirror circuit is modulated to the voltage level VN20. This voltage level VN20 can be determined by using the transistor dimension ratio of the N-MOS transistors 20d and 20b and the P-MOS transistor 20a.

When there is a request that the circuit threshold voltage VN20 is shifted toward a low voltage potential level side, the request can be solved by setting that the transistor dimension ratio of the N-MOS transistors 20d and 20b is larger and the transistor dimension ratio of the P-MOS transistors 20a is smaller. Thereby, it can be easily achieved to set the circuit threshold voltage VN20 of the N-type current mirror circuit 200 to a constant voltage potential level side.

Next, the operation of the Schmitt trigger circuit as the second embodiment shown in FIG. 13A will now be explained.

When the level of the external input signal Vin is at the VSS levels, the N-MOS transistor 10b in the P-type current mirror circuit 100 in the cut-off state, the P-MOS transistor 20a in the N-type current mirror circuit 200 is in the on-state. As a result, the voltage level of the output Vthc at the node N11 becomes the VSS level, and both the output signal Vout and the feed-back control signal VFB have the VSS level.

In this state described above, the P-MOS transistor 10d whose gate receives the feed-back control signal VFB in the P-type current mirror circuit 100 is in the on-state, the source voltage potential of the P-MOS transistor 10a whose gate receives the external input signal Vin is connected to the voltage power source VDD, so that this P-MOS transistor 10a is in the on state.

On the other hand, the N-MOS transistor 20d whose gate terminal receives the feed-back control signal VFB is in the cut-off state, the source terminal of the N-MOS transistor 20d whose gate terminal receives the external input signal Vin is in the state where no ground power source is given. However, as described above, the node N13 is not affected by this state.

Furthermore, in this state, the N-type current mirror circuit 200 is in a constant current output state and has a off-state (designated by the reference character Q4) of the N-MOS transistor 20d where an output current value is decreased according to increasing of the external input signal Vin.

In addition to the state described above, each section and each element is in a transition state where the external input signal Vin is changed from the VSS level to the VDD level, the level of the output current from the P-MOS transistor 10a in the P-type current mirror circuit 100 is controlled by the level of the external input signal Vin and performs as an active element. Accordingly, both the P-MOS transistors 10a and 10d connected in series between the voltage power source VDD and the node N12 act as the constant current load for the N-MOS transistor 10b because the P-MOS transistor 10a whose operation is controlled by the external input signal Vin is connected to the node N12 when the level of the feed-back control signal VFB is equal to the VSS level or more. These P-MOS transistor 10a and 10b form the reverse amplifier circuit.

Accordingly, the circuit threshold voltage of the P-type current mirror circuit 100 can be modulated to the level VP10 by the P-MOS transistor 10a which acts as the constant current loads for the N-MOS transistor 10b. Furthermore, the relationship between the P-MOS transistors 10a and 10d which are also connected in series between the voltage power source VDD and the node N12 can be obtained as follows:

$$W10a/L10a \leq W10d/L10d,$$

$$W10a \leq W10d, \text{ and}$$

$$L10a \geq L10d,$$

where each transistor dimension is W10a/L10a, W10d/L10d, and each element threshold voltage is Vthp10a, Vthp10d, respectively.

in addition, there is the following relationship:

$$Vthp10a \geq Vthp10d,$$

where Vthp10d is more effective in a low threshold voltage.

Those relationships provide the smallest effect to the element characteristics such as a channel conductance and a relative conductance of the P-MOS transistor 10a.

Accordingly, the P-type current mirror circuit 100 enters the constant current output state only when the external input signal Vin is not less than the threshold voltage level Vp10 of the P-type current mirror circuit 100. In this state, the current addition operation between the negative constant current output I22 from the N-type current mirror circuit 200 and the positive constant current output I12 can be executed.

As the result, because the current difference I12>I2 is generated at the node N11, the signal Vthc is changed to the VDD level. The signal Vthc is further amplified by the amplifier 30, and generated to the external output signal Vout and the feed-back control signal VFB, respectively.

Since the feed-back control signal VFB is fed back to both the P-MOS transistor 10d in the P-type current mirror circuit 100 and the N-MOS transistor 20d in the N-type current mirror circuit 200, as described above, the signal Vthc is shifted to the VDD level and further amplified by the amplifier 30. Therefore feed-back control signal VFB is further shifted toward the VDD level.

Thereby, the P-MOS transistor 10d whose gate receives the feed-back control signal VFB enters the cut-off state completely and the N-MOS transistor 20d is shifted to the on-state, so that the P-type current mirror circuit 100 enters in the constant current output state and the circuit threshold voltage of the N-type current mirror circuit 200 is modulated to the voltage VN20 because the N-MOS transistor 20d in the N-type current mirror circuit 200 is shifted to the on-state.

Accordingly, the source voltage of the N-MOS transistor 20b becomes the VSS level by the signal VBL which is provided to the gate of the N-MOS transistor 20c in the N-type current mirror circuit 200 because the N-MOS transistor 20d is in the on-state. In addition, the signal VBL outputs the VSS voltage potential level because the external input signal Vin is in the high voltage potential side and the N-MOS transistor 20b is in the on-state.

Accordingly, the voltage potential of the output VBL becomes below the threshold voltage (VSS+Vthn) of the N-MOS transistor 20c, so that the N-MOS transistor 20c enters the cut-off state and the constant current output from the N-MOS transistor 20c is halted. Thereby, only the constant current output from the P-MOS transistor 10c is provided to the node N11, as the current summed-up node, because providing of the constant current output from the N-MOS transistor 20c to the node N11 is halted. Thereby, the output Vthc is further amplified to the VDD level.

Because the Schmitt trigger circuit of the second embodiment forms the positive feed-back amplifier by feeding back the feed-back control signal VFB transferred from the amplifier 30 to the P-type and N-type current mirror circuit 100 and 200, this make it possible to get approximately infinite amplification degree, so that the signal delay of the output signal Vout can be decreased as small as possible even if a low voltage power source is used, and it can be achieved to perform a stable operation of the Schmitt trigger circuit of the second embodiment within a wide frequency range.

Figure 16:
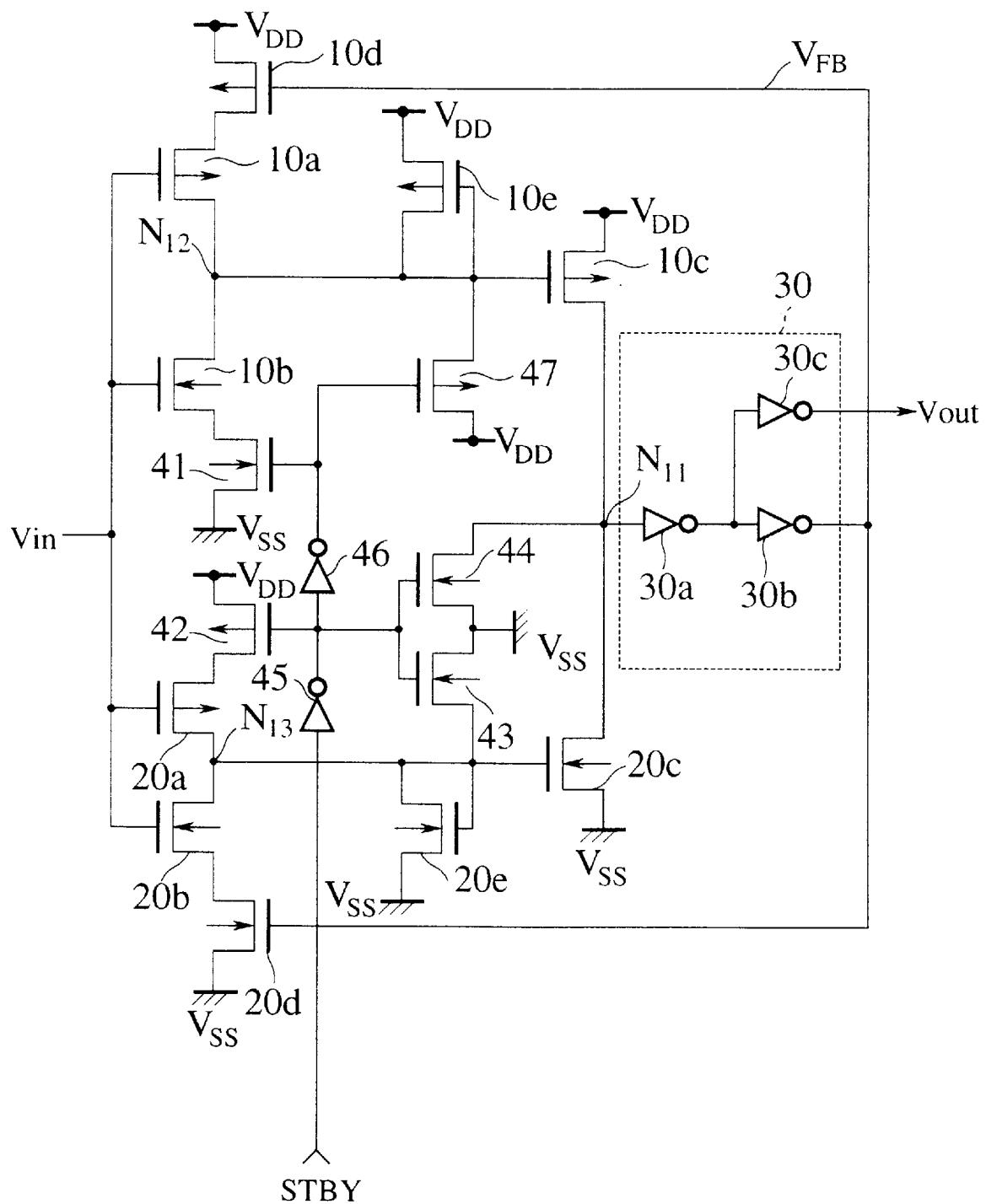
FIG. 16 is a circuit diagram showing a circuit configuration (the first configuration example) of a Schmitt trigger circuit having a stand-by function in addition to the configuration of the Schmitt trigger circuit of the second embodiment.

First example of a configuration of a Schmitt trigger circuit having a stand-by function FIG. 16 is a circuit diagram showing a circuit configuration (the first configuration example) of a Schmitt trigger circuit having a stand-by function in addition to the configuration of the Schmitt trigger circuit as the first embodiment shown in FIG. 13A. In addition, the common configuration elements between FIGS. 13A and 16 are used with the same reference numbers in this embodiment. Therefore explanation for these elements are omitted here for brevity.

This Schmitt trigger circuit having the stand-by function comprises: the Schmitt trigger circuit having the configuration shown in FIG. 13A, a current cut N-MOS transistor 41 incorporated between the source terminal of the N-MOS transistor 10c and the ground voltage power source VSS, a current cut P-MOS transistor 42 incorporated between the source of the P-MOS transistor 20a and the voltage power source VDD, N-MOS transistors 43, P-MOS transistor 47 and the N-MOS transistor 44 connected to the node N12, N13 and N11, respectively, so as to fix a terminal voltage potential level at each node, and inverter circuits 45 and 46 connected in series for amplifying an external stand-by signal STBY.

In the Schmitt trigger circuit having the stand-by function shown in FIG. 16, when the level of the external stand-by signal is at the VSS level, namely when the Schmitt trigger circuit is not used, it is possible to cut each current path where there is no current flow, so that a power consumption of the Schmitt trigger circuit of the first embodiment becomes zero.

On the other hand, when the external stand-by signal STBY is at the VDD level, the Schmitt trigger circuit enters the normal operation mode and all circuit elements forming the stand-by function do not effect to the function and the operation of the Schmitt trigger circuit.

Figure 17:
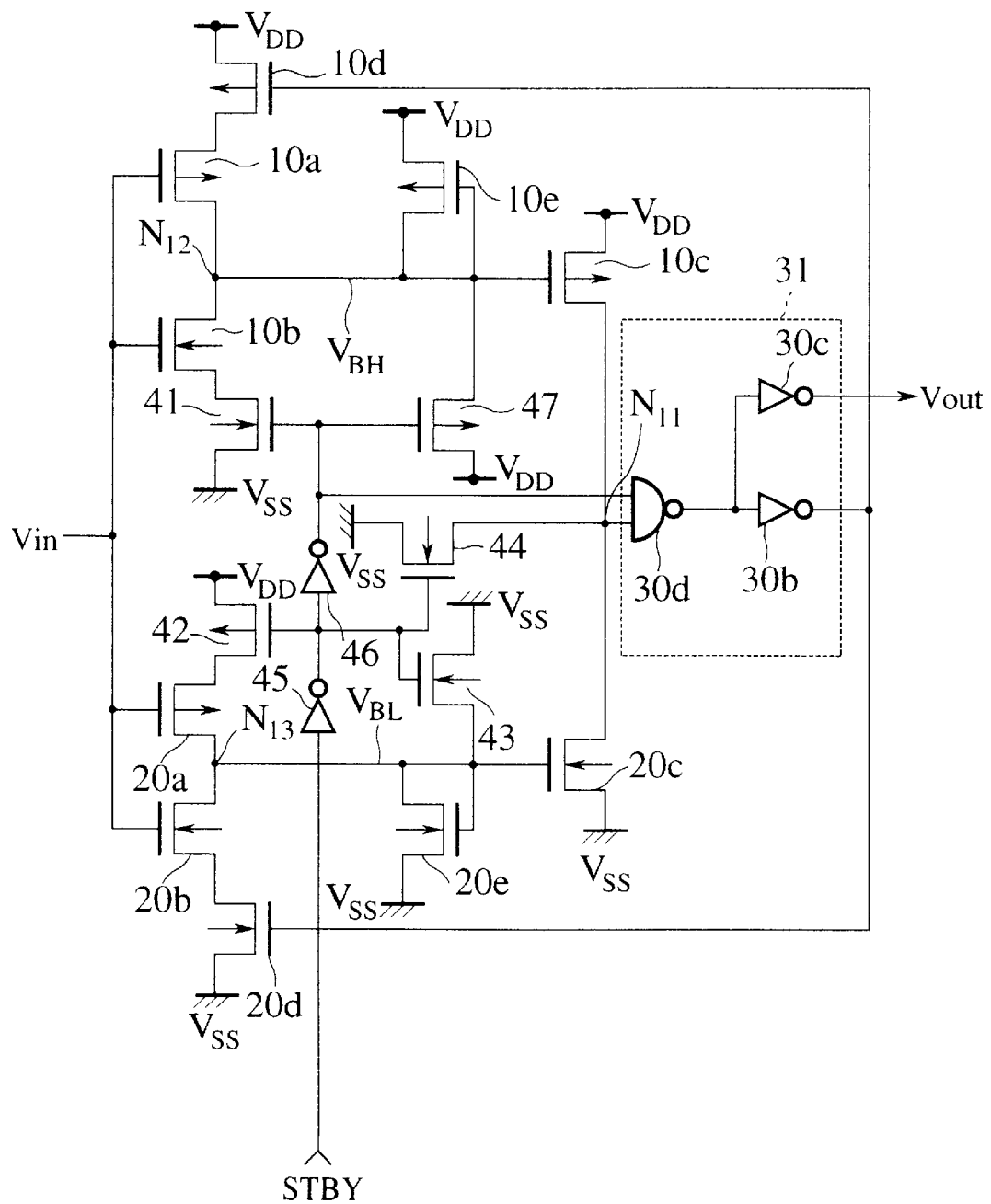
FIG. 17 is a circuit diagram showing a circuit configuration (the second configuration example) of a Schmitt trigger circuit having a stand-by function in addition to the configuration of the Schmitt trigger circuit of the second embodiment.

Second example of a configuration of a Schmitt trigger circuit having a stand-by function FIG. 17 is a circuit diagram showing a circuit configuration (the second configuration example) of a Schmitt trigger circuit having a stand-by function in addition to the configuration of the Schmitt trigger circuit as the first embodiment shown in FIG. 13A. The common configuration elements between FIGS. 13A and 17 are used with the same reference numbers in this embodiment. Therefore explanation for these elements are omitted here for brevity.

In an amplifier 31 in the Schmitt trigger circuit shown in FIG. 17, in order to retard unexpected output caused when the external stand-by signal is in the transition-state, the inverter 30a in the amplifier 30 incorporated in the Schmitt trigger circuit shown in FIG. 13A is replaced with a NAND gate 30d and one input terminal of the NAND gate 30d is connected to the node N11 and the other input terminal is connected to the output terminal of the inverter circuit 46. By using the configuration of the amplifier 31, unexpected output generated at the summing node N11 can be inhibited. In addition, when the external stand-by signal STBY is at the VDD level, the Schmitt trigger circuit enters the normal operation mode and all circuit elements forming the stand-by function do not to the function and the operation of the Schmitt trigger circuit.

Figure 18:
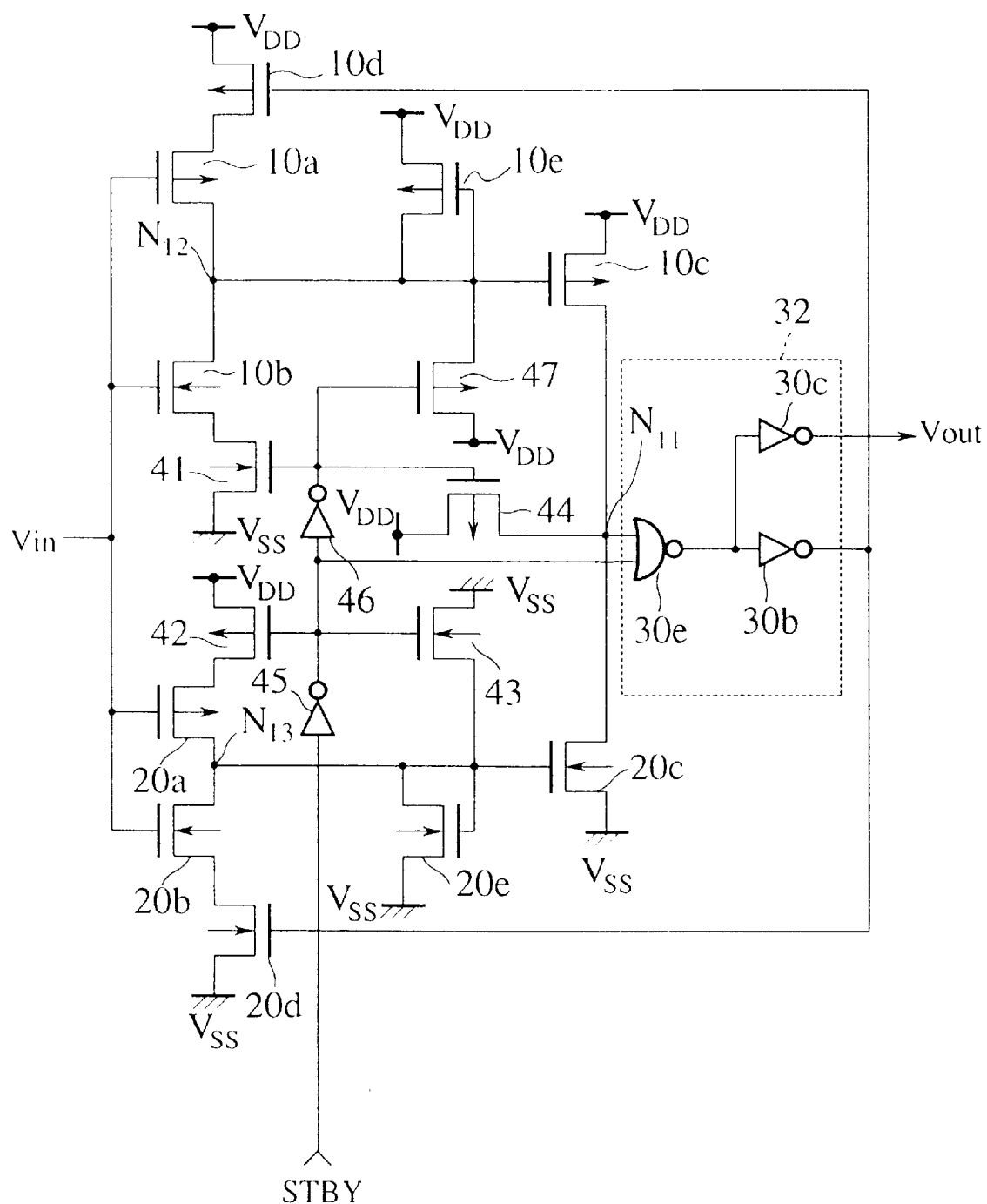
FIG. 18 is a circuit diagram showing a circuit configuration (the third configuration example) of a Schmitt trigger circuit having a stand-by function in addition to the configuration of the Schmitt trigger circuit of the second embodiment.

Third example of a configuration of a Schmitt trigger circuit having a stand-by function FIG. 18 is a circuit diagram showing a circuit configuration (the third configuration example) of a Schmitt trigger circuit having a stand-by function in addition to the configuration of the Schmitt trigger circuit of the first embodiment shown in FIG. 13A. In addition, the common configuration elements between FIGS. 13A and 18 are used with the same reference numbers in this embodiment. Therefore explanation for these elements are omitted here for brevity.

An amplifier 32 in the Schmitt trigger circuit shown in FIG. 18 comprises: the N-MOS transistors 41 as a current cut transistor placed between the voltage power source VDD and the source terminal of the N-MOS transistor 10b; the P-MOS transistor 42 as a current cut transistor placed between the voltage power source VDD and the source terminal of the P-MOS transistor 20a, the N-MOS transistor 43; the P-MOS transistor 47 and the N-MOS transistor 44 to be used for fixing the voltage potential level at each terminal connected to the nodes N12, N13 and N11, respectively; the inverter circuits 45 and 46 for amplifying the external stand-by signal STBY; and the NOR circuit 30e which is replaced with the inverter circuit 30a connected to the node N11 in the amplifier 30 which has been described in the description for the first example.

By using the configuration of the Schmitt trigger circuit, each of direct current paths can be cut, while the external stand-by signal STBY is in the VSS level, so that the power consumption of the Schmitt trigger circuit of the second embodiment can be reduced to or set at zero when this Schmitt trigger circuit is not used.

In addition, because the one input terminal of the NOR circuit 30e is connected to the node N11 and the other input terminal of the NOR circuit 30e is connected to the output terminal of the inverter circuit 45 which receives the external stand-by signal STBY, unexpected output generated at the summed-up node N11 can be inhibited. In addition, when the external stand-by signal STBY is at the VDD level, the Schmitt trigger circuit of the second embodiment enters the normal operation mode and all circuit elements forming the stand-by function do not effect to the function and the operation of the Schmitt trigger circuit of the second embodiment.

Figure 19:
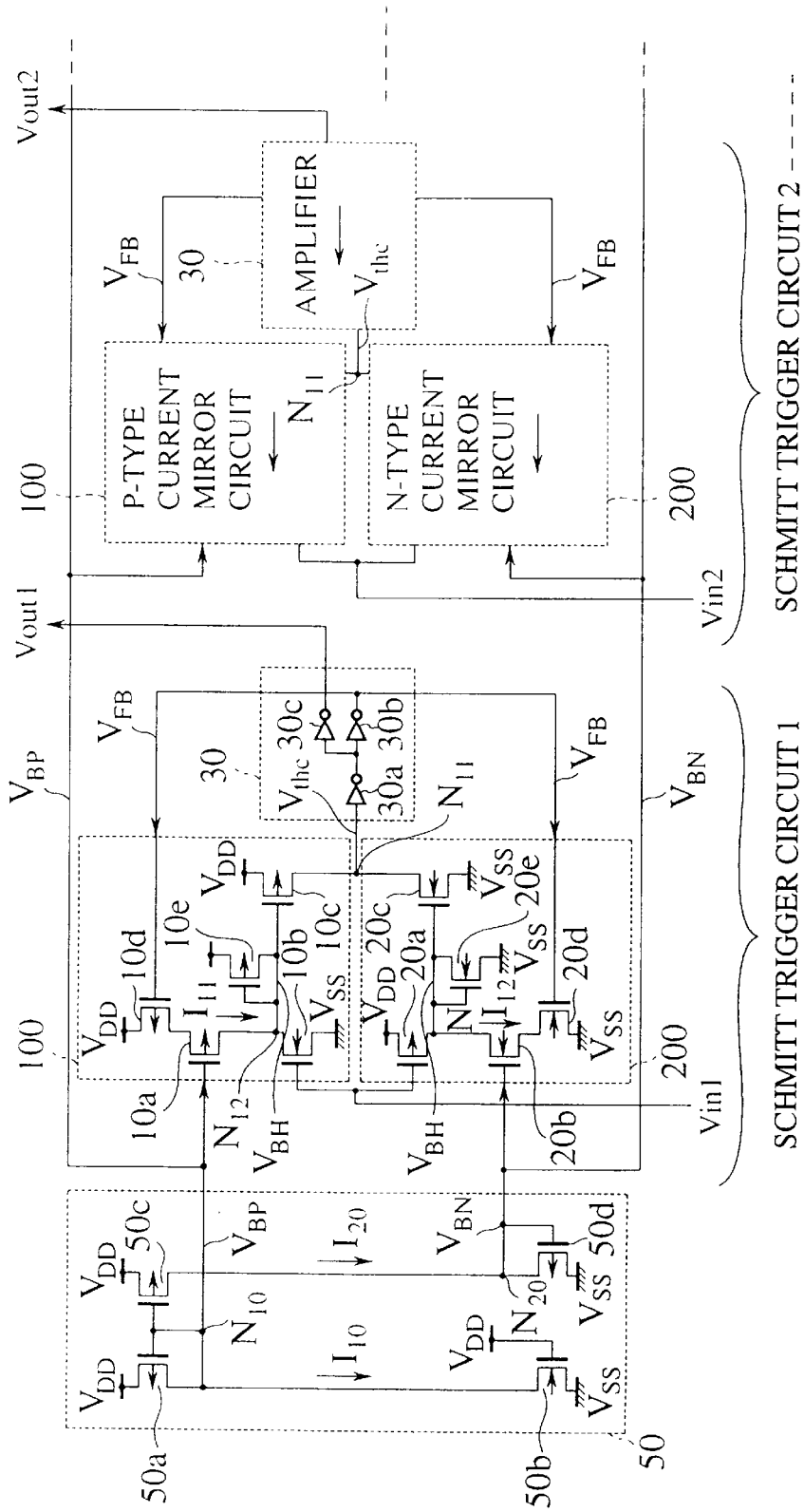
FIG. 19 is a diagram showing a configuration of a semiconductor input circuit having the Schmitt trigger circuit of the second embodiment.

FIG. 19 is a diagram showing a configuration of a Schmitt trigger input circuit system as a semiconductor input system having the Schmitt trigger circuit of the second embodiment shown in FIG. 13A. In addition, the common configuration elements between FIGS. 13A and 19 are used with the same reference numbers in this embodiment. Therefore explanation for these elements are omitted here for brevity.

This Schmitt trigger input circuit system comprising a plurality of the Schmitt trigger circuits shown in FIG. 13A placed for processing a plurality of different external input signals. That is, the Schmitt trigger input circuit system comprises a reference voltage generation circuit 50 (as bias means) for generating a gate bias signal VBP used for the P-MOS transistor 10a as the constant current load in the P-type current mirror circuit 100 and also for generating a gate bias signal VBN used for the N-MOS transistor 20b as the constant current load in the N-type current mirror circuit 200.

The reference voltage generation circuit 50 for generating the gate bias signal VBP has the configuration that a N-MOS transistor 50b connected to the voltage power source VDD is connected through a node N10 to a P-MOS transistor 50a whose gate and drain are connected to each other. The reference voltage generation circuit 50 for generating the gate bias signal VBN has the configuration that a P-MOS transistor 50c whose gate receives the bias signal VBP is connected through a node N20 to a N-MOS transistor 50d whose drain and gate are connected to each other. In this configuration, the P-MOS transistor 50a whose gate and drain are connected to each other usually performs only in a saturated region as the constant current load for the N-MOS transistor 50b connected to the P-MOS transistor 50a through the node N10. Here, the constant current flowing through both the P-MOS transistor 50a and the N-MOS transistor 50b is designated by the reference character I10.

Similarly, the N-MOS transistor 50d whose gate and drain are connected to each other usually performs only in a saturated region as the constant current load for the P-MOS transistor 50c connected to the N-MOS transistor 50d through the node N20. Here, the constant current flowing through both the N-MOS transistor 50d and the P-MOS transistor 50c is designated by the reference character I20.

The P-MOS transistor 50c and the P-MOS transistor 50a whose gates receive the bias voltage VBP form a current mirror circuit because both are connected through the node N10 and both voltage potentials are same. Accordingly, the value of the current I20 flowing through both the P-MOS transistor 50c and the N-MOS transistor 50d can be determined only by using the channel dimension ratio W50a/W50c with the relationship of I10/I20=W50a/W50c, where each transistor dimension of the P-MOS transistor 50c and the N-MOS transistor 50d is W50a/L, W50c/L (L is a channel length and the channel length L of each of the P-MOS transistor 50c and the N-MOS transistor 50d is same).

Furthermore, the P-MOS transistor 50a in the reference voltage generation circuit 50 and the P-MOS transistor 10a in the P-type current mirror circuit 100 whose gate is connected to the P-MOS transistor 50a through the node N10 form the current mirror circuit. Like the constant current I20, there is the relationship of I10/I11=W50a/W50a between the constant current I11 from the P-MOS transistor 10a and the transistor dimension W10a/L of the P-MOS transistor 10a. Thereby, the constant current value can be determined only by using the transistor dimensions of the P-MOS transistor 50a in the reference voltage generation circuit 50 and the P-MOS transistor 10a in the P-type current mirror circuit 100.

Similarly, since the reference voltage generation circuit 50 and the N-MOS transistor 20b in the N-type current mirror circuit 200 whose gate is commonly connected to the gate of the N-MOS transistor 50d through the node N20 form the current mirror circuit, there is the relationship of I20/I12=W50d/W50b when the transistor dimension of the N-MOS transistor 50d is W40d/L and the current from the N-MOS transistor 20b is I12.

Accordingly, the constant current I11 from the P-MOS transistor 10a can be set only by using the channel dimension ratio:

$$W50d/W10a=I10/I11, I11=I10 \cdot W50a/W10a$$

between the P-MOS transistor 50a in the reference voltage generation circuit 50 and the P-MOS transistor 10a in the P-type current mirror circuit 100. In addition, the constant current I12 from the N-MOS transistor 20b can be set only by using the channel dimension ratio W50d/W20b=I20/I12, I12=I20·W20b/W50d between the P-MOS transistor 50d in the reference voltage generation circuit 50 and the N-MOS transistor 20b in the P-type current mirror circuit 200.

Furthermore, the constant current I20 from the N-MOS transistor 50d in the reference voltage generation circuit 50 can also be determined only by using the relationship of I20=I10·W50a/W50c.

As described above in detail, in the Schmitt trigger input circuit system (or the semiconductor input system), the P-MOS transistor 10a and the N-MOS transistor 20b which act as the constant current load for the input transistor controlled by the external input signal Vin1, Vin2, . . . provided for each P-type current mirror circuit 100, N-type current mirror circuit 200, . . . are connected to the output signals VBP, VBN of the reference voltage generation circuit 50 in a current mirror connection. Thereby, the threshold voltage VP10 and VN20 of the P-type current mirror circuit 100 and the N-type current mirror circuit 200 can be easily set, so that fluctuation of circuit threshold voltages of a plurality of Schmitt trigger circuits can be reduced as much as possible.

Furthermore, because the difference between the transistor dimensions of the P-MOS and N-MOS transistors based on mobilities of them can be reduced, a semiconductor integrated circuit with a good symmetrical configuration can be formed and a circuit pattern area of a Schmitt trigger circuit can be also reduced.

Embodiment 3

Figure 20:
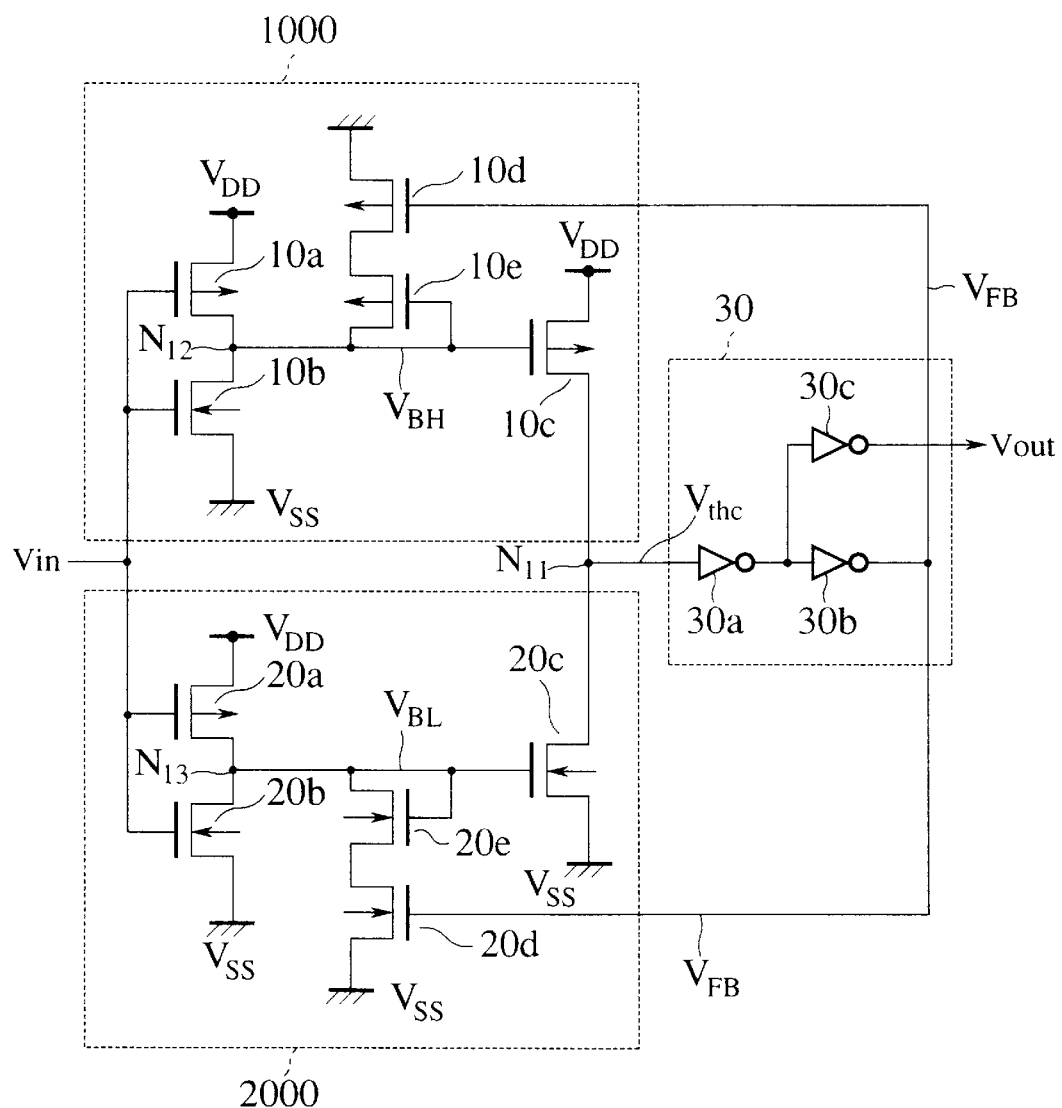
FIG. 20 is a circuit diagram of a Schmitt trigger circuit, as a semiconductor integrated circuit, of a third embodiment according to the present invention.
Figure 21:
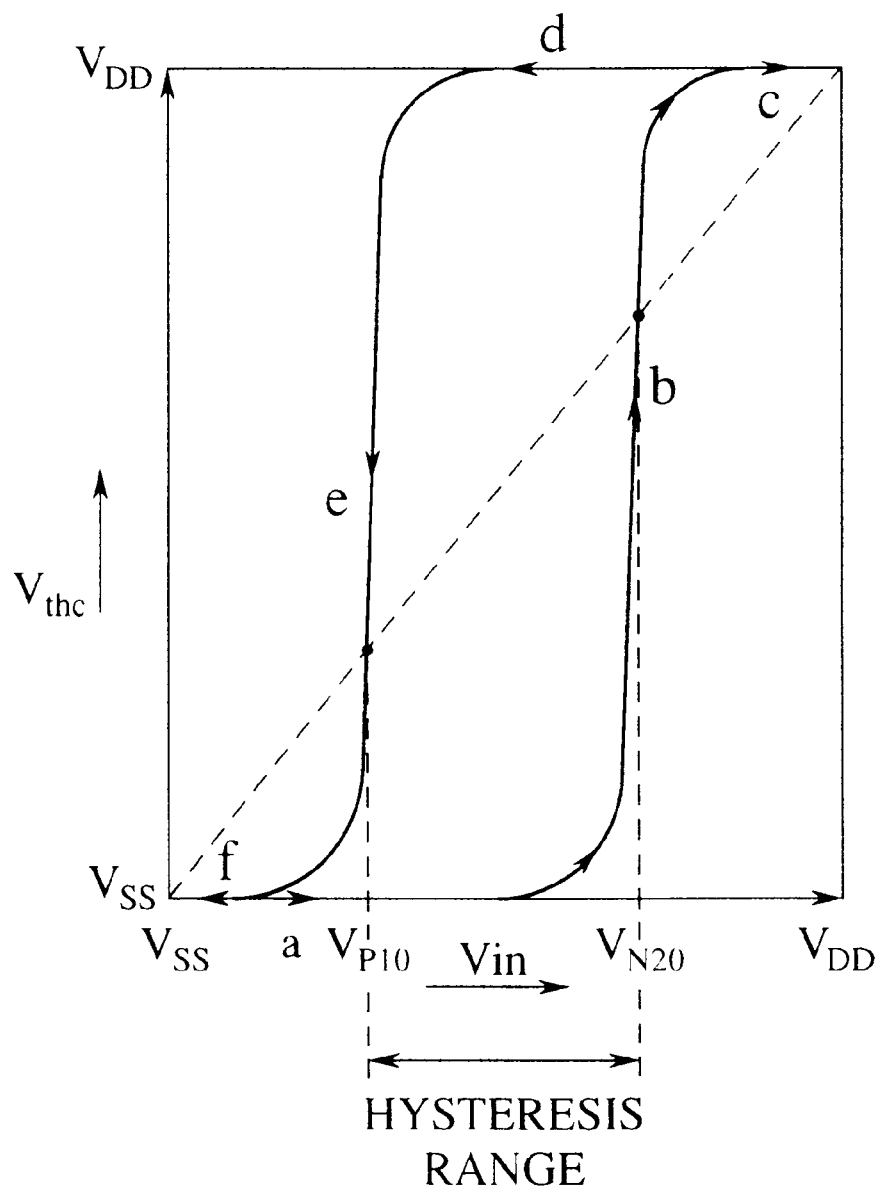
FIG. 21 is an explanation diagram showing an input/output characteristic of the Schmitt trigger circuit of the third embodiment.
Figure 22A:
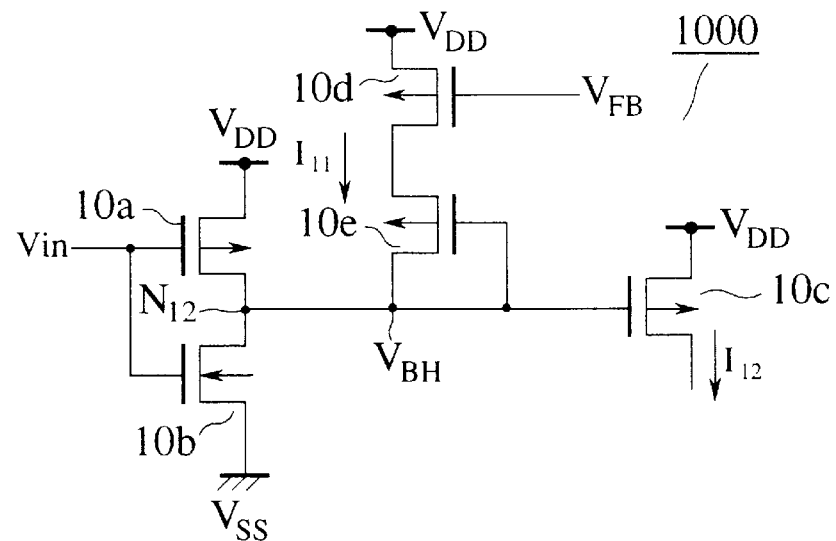
FIGS. 22A and 22B are a circuit diagram of a P-type current mirror circuit and an explanation diagram showing an operation of the P-type current mirror circuit, respectively, in the Schmitt trigger circuit of the third embodiment.
Figure 22B:
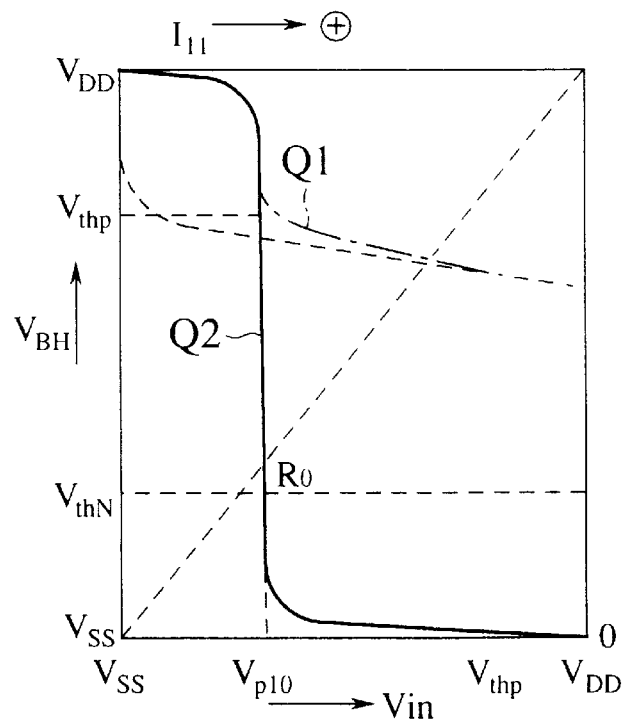
Figure 23A:
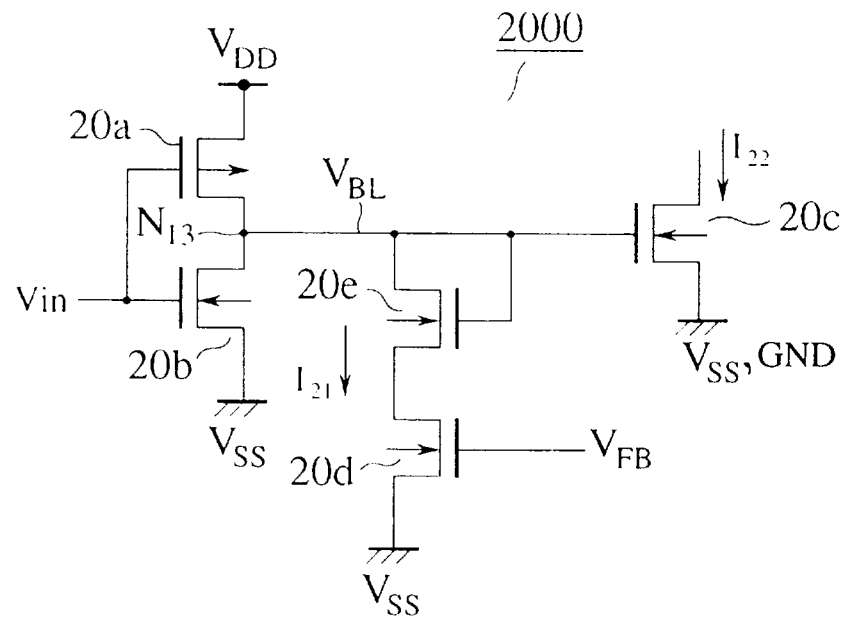
FIGS. 23A and 23B are a circuit diagram of a N-type current mirror circuit and an explanation diagram showing an operation of the N-type current mirror circuit, respectively, in the Schmitt trigger circuit of the third embodiment.
Figure 23B:
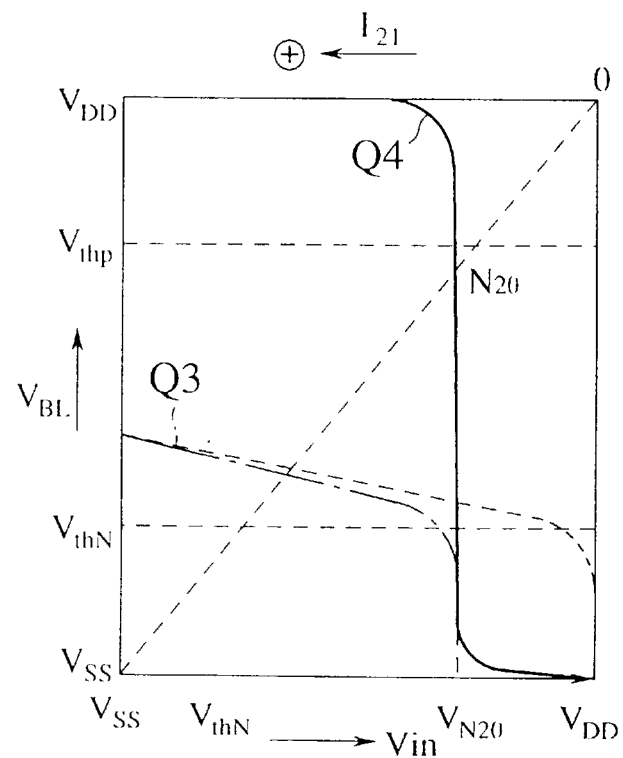

FIG. 20 is a circuit diagram of a Schmitt trigger circuit, as a semiconductor integrated circuit, of a third embodiment according to the present invention. FIG. 21 is an explanation diagram showing an input/output characteristic of the Schmitt trigger circuit of the third embodiment. FIGS. 22A and 22B are a circuit diagram of a P-type current mirror circuit and an explanation diagram showing an operation of the P-type current mirror circuit, respectively, in the Schmitt trigger circuit of the third embodiment. FIGS. 23A and 23B are a circuit diagram of the N-type current mirror circuit and an explanation diagram showing an operation of the N-type current mirror circuit, respectively, in the Schmitt trigger circuit of the third embodiment.

The basic configuration of the Schmitt trigger circuit according to the third embodiment is the same as the Schmitt trigger circuit of the first embodiment shown in FIG. 1. In addition, the common configuration elements between the Schmitt trigger circuits as the first embodiment shown in FIG. 2, the Schmitt trigger circuits of the second and third embodiments are used with the same reference numbers in this third embodiment. Therefore explanation for these elements are omitted here for brevity.

The difference points between the P-type current mirror circuit 1000 in the Schmitt trigger circuit of the third embodiment and the P-type current mirror circuit 100 (see FIG. 14A) in a circuit configuration are that the P-MOS transistor 10d (whose gate terminal receives the feed-back control signal VFB) connected between the source terminal of the P-MOS transistor 10a (whose gate terminal receives the external input signal Vin) in the P-type current mirror circuit shown in FIG. 14A and the voltage power source VDD is connected between the source of the P-MOS transistor 10a whose gate and drain are commonly connected and the voltage power source VDD through the node N12, and the source terminal of the P-MOS transistor 10a is connected to the voltage power source VDD. Other circuit connections and circuit configuration are same between the P-type current mirror circuit 1000 in the Schmitt trigger circuit of the third embodiment and the P-type current mirror circuit 100.

As shown in FIGS. 20 and 22A, the actual configuration of the P-type current mirror circuit 1000 of the third embodiment is as follow. The P-type current mirror circuit 1000 comprises a reverse amplifier having a configuration in which a P-MOS transistor 10a and a N-MOS transistor 10b whose gates receive the external input signal Vin are commonly connected through the node N12, a P-MOS transistor 10d whose gate receives a feed-back control signal VFB transferred from an amplifier 30 placed between the voltage power source VDD and the node N12, a P-MOS transistor 10e which can operate in a saturated state whose drain and gate are commonly connected through the node N12, and a P-MOS transistor 10c whose gate receives a signal VBH transferred from the node N12. These P-MOS transistors 10d and 10e are connected in series between the voltage power source VDD and the node N12 in order to generate and provide the signal VBH.

In the P-type current mirror circuit 1000, the P-MOS transistor 10e acts as an active load (or as a constant current load) for the N-MOS transistor 10b whose operation is controlled by the external input signal Vin in the state that the P-MOS transistor 10e is connected electrically to the drain terminal of the P-MOS transistor 10d through the node N12 and the feed-back control signal VFB transferred from the amplifier 30 is in the VSS level. In this state, the state of the feed-back control signal VFB transferred from the amplifier 30 can affect to the node N12 at all time.

In the state that the level of the feed-back control signal VFB transferred from the amplifier 30 is at the VDD level, the P-MOS transistor 10d is completely in the cut-off state where the voltage power source VDD is not provided to the P-MOS transistor 10d. Accordingly, in this state, the P-MOS transistor 10e whose drain and gate are commonly connected to the node N12 can not affect to the node N12. Thereby, the signal VBH output from the reverse amplifier comprising the P-MOS transistor 10a and the N-MOS transistor 10b has the input/output characteristics designated by the solid line in FIG. 21.

By forming the configuration that the drain terminals of the P-MOS transistor 10a and the N-MOS transistor 10b whose gates receive the external input signal Vin are commonly connected through the node N12, the circuit threshold voltage VP10 of the reverse amplifier is expressed as follows:

$$V_{P10} = \frac{V_{DD} - |V_{thP}| + \sqrt{\beta_n / \beta_p} \cdot V_{thN}}{1 + \sqrt{\beta_n / \beta_p}},$$

where, $\beta_n = \mu_N \cdot C_{OX} \cdot W_{10b} / L,$ $\beta_p = \mu_P \cdot C_{OX} \cdot W_{10a} / L,$ the transistor dimensions of the P-MOS transistor 10a and the N-MOS transistor 10b are W10a/L and W10b/L, respectively.

Thus, the transistor dimension ratio makes it possible to set the circuit threshold voltage VP10 of the P-type current mirror circuit 1000.

Since the circuit threshold voltage VP10 becomes the circuit threshold voltage of the P-type current mirror circuit 1000, this threshold voltage is set near the ground voltage power source VSS. This is different from the case of the second embodiment 2 shown in FIG. 14B where the circuit threshold voltage VP10 is set near the voltage power source VDD.

Here, while the transition state where the level of the external input signal Vin is shifted from the VSS level to the VDD level under the condition that the level of the feed-back control signal VFB is at the VSS level, the source terminal of the P-MOS transistor 10e whose drain and gate are commonly connected through the node N12 receives the VDD voltage level because the feed-back control signal VFB has the VSS voltage level.

Thereby, the output voltage VBH at the node N12 works to maintain the P-type current mirror circuit 100 in the cut-off state and the output voltage VBH at the node N12 becomes more than the element threshold voltage of the P-MOS transistors 10e and 10c (VDD−|Vthp|) until it reaches the element threshold voltage of the P-type current mirror circuit 1000 where the current value from the N-MOS transistor 10b controlled by the external input signal Vin is equal to the current value from the P-MOS transistor 10a controlled by the external input signal Vin.

In addition, when the external input signal Vin is over the threshold voltage VP10 of the P-type current mirror circuit 1000 and when the output voltage VBH becomes below the element threshold voltage (VDD−|Vthp|) of each of the P-MOS transistors 10e and 10c, the on-characteristic of the P-MOS transistor 10d (designated by the slope Q1) shown in FIG. 22 for providing the constant current to the N-MOS transistor 10b can be obtained according to the constant current characteristics of the P-MOS transistor 10e as an active load.

Accordingly, the constant current output of the P-MOS transistor 10a controlled by using the external input signal Vin is decreased by increasing the external input signal Vin. In contrast, the constant current output of the N-MOS transistor 10b is increased when the external input signal Vin is increased. When the current flowing through the P-MOS transistor 10c whose gate is connected to the node N12 is designated by I12, the current value of the P-MOS transistor 10e acts as the active load is denoted by I11, because the voltage levels at the input gates of both the P-MOS transistors 10e and 10c whose gates are commonly connected through the node N12 are same, the relationship between the currents I12 and I11 flowing through the P-MOS transistor 10e and 10c is as follows:

$$I11/I12 = W10c/W10e,$$

where transistor dimensions of the P-MOS transistors 10e and 10c are W10c/L and W10e/L, respectively.

Thereby, each constant current value can be determined only by the channel dimension ration of each of the P-MOS transistors 10e and 10c. Accordingly, the constant current output has the positive constant current output characteristics designated by the slope Q1 shown in FIG. 22B where the constant current value of the P-MOS transistor 10c is increased corresponding to the increasing of the external input signal Vin.

The different point between the N-type current mirror circuit 2000 in the Schmitt trigger circuit of the third embodiment and the N-type current mirror circuit 200 of the second embodiment shown in FIG. 15A is that the N-MOS transistor 20d (whose gate terminal receives the feed-back control signal VFB) connected between the source of the N-MOS transistor 20b (whose gate terminal receives the external input signal Vin) in the N-type current mirror circuit 200 shown in FIG. 15A and the voltage power source Vdd is connected between the voltage power source VDD and the source of the N-MOS transistor 20e whose drain and gate are commonly connected through the node N12. Other circuit connections and circuit configuration are same between the N-type current mirror circuit 2000 in the Schmitt trigger circuit of the third embodiment and the N-type current mirror circuit 200.

As shown in FIGS. 20 and 23A, the physical circuit configuration of the N-type current mirror circuit according to the third embodiment is as follows, The N-type current mirror circuit 2000 comprises: a reverse amplifier which comprises a P-MOS transistor 20a and a N-MOS transistor 20b (the P-MOS transistor 20a whose gate received the external input signal Vin and the N-MOS transistor 20b and whose drains of them are commonly connected through the node N13); a P-MOS transistor 20d, whose gate receives the feed-back control signal VFB transferred from the amplifier 30, placed between the ground voltage power source VSS and the node N13; a P-MOS transistor 20e whose gate and drain are commonly connected through the node N13 and which can perform in an active state at all time; and a N-MOS transistor 20c whose gate receives a signal VBL at the node N13. The N-type current mirror circuit 2000 can generate and provide the signal VBL because the P-MOS transistors 20d and 20e are connected in series between the ground voltage power source VSS and the node N13.

In the N-type current mirror circuit 2000, the N-MOS transistor 20d is in the on-state under the condition that the level of the feed-back control signal transferred from the amplifier 30 is at the VDD level and the N-MOS transistor 20e is connected to the drain of the P-MOS transistor 20d through the node N13. In this case, the source of the N-MOS transistor 20e is fallen to the ground voltage level VSS. Accordingly, the N-MOS transistor 20e in this state acts as the constant current load for the P-MOS transistor 20e and can give the effect from the feed-back control signal VFB transferred from the amplifier 30 to the node N13 at all time.

In the state where the level of the feed-back control signal VFB from the amplifier 30 is at the VSS level, the N-MOS transistor 20d is completely in the cut-off state, so that no ground voltage VSS is provided to the source of the N-MOS transistor 20e. Accordingly, in this state, the N-MOS transistor 20e whose drain and gate are commonly connected to the node N13 can not give any effects to the node N13.

The signal VBL transferred from the reverse amplifier comprising the N-MOS transistor 20b and the P-MOS transistor 20a has the input/output characteristics designated by the slope Q4 (the solid line) shown in FIG. 23B. Because the drains of both the P-MOS transistor 20a and the N-MOS transistor 20b whose gates receive the external input signal Vin are connected through the node N13, the circuit threshold voltage VN20 of the reverse amplifier is expressed as follows:

$$V_{N20} = \frac{V_{DD} - |V_{thP}| + \sqrt{\beta_n/\beta_p} \cdot V_{thN}}{1 + \sqrt{\beta_n/\beta_p}},$$

where, the transistor dimensions of the P-MOS transistor 20a and the N-MOS transistor 20b are W20a/L and W20b/L, respectively.

Thus, the circuit threshold voltage VN20 of the N-type current mirror circuit 2000 can be set only by using the transistor dimension ratio.

This circuit threshold voltage VN20 is the circuit threshold voltage of the N-type current mirror circuit 2000. The threshold voltage VN20 of the N-type current mirror circuit 2000 of the third embodiment shown in FIG. 23A is set near to the voltage VDD. This is different from the case where the threshold voltage VN20 is set near the ground voltage VSS in the N-type current mirror circuit of the second embodiment, as shown in FIG. 15A.

Here, in the transition state while the level of the external input signal Vin is changed from the VDD level to the VSS level and during in the VDD level of the feed-back control signal VFB, namely in the active state, the VSS level is provided to the source terminal of the P-MOS transistor 20e whose drain and gate are commonly connected through the node N13.

Accordingly, the output VBL at the node N13 is more than the element threshold voltage (VSS+Vthn) of each of the N-MOS transistors 20e and 20c and the output VBL maintains the N-MOS transistor 20c whose gate is connected to the node N13 into the cut-off state until the circuit threshold voltage VN20 of the N-type current mirror circuit 2000 in which the current value from the P-MOS transistor 20a controlled by the external input signal Vin is equal to the current value from the N-MOS transistor 20b controlled by the external input signal Vin.

When the level of the external input signal Vin is below the circuit threshold voltage VN20 of the N-type current mirror circuit 2000 and the level of the signal VBL at the node N13 is over the element threshold voltage (VSS+Vthn) of each of the N-MOS transistors, the on-characteristics (designated by the slope Q3) of the N-MOS transistor 20d which provides the negative constant current to the P-MOS transistor 20a can be obtained according to the constant current output characteristics of the N-MOS transistor 20e as the active load.

Accordingly, the constant current output from the N-MOS transistor 20b controlled by the external input signal Vin is decreased by decreasing of the level of the external input signal Vin. In contrast, the output VBL at the node N13 is increased when the constant current output from the P-MOS transistor 20a is increased, so that, the operation of the N-MOS transistor 20c traces the on-characteristics (designated by the slope Q3) of the N-MOS transistor 20d shown in FIG. 23B immediately after the N-MOS transistor 20e enters the on-state.

Here, when the current flowing through the N-MOS transistor 20c whose gate is connected to the node N13 is I22 and the current flowing through the N-MOS transistor 20c that acts as the active load is I21, because the input gates of the N-MOS transistors 20e and 20c are commonly connected to the node N13 and have the same voltage potential, the relationship between the current I21 and I12 flowing through the N-MOS transistors 20e and 20c, respectively, is as follows:

$$I22/I21 = W20c/W20e,$$

where the transistor dimensions of the N-MOS transistors 20c and the 20e are W20c/L and W20e/L, respectively. Thereby, this makes it possible to set the constant current value to a required current value only by using the channel width ratio between the N-MOS transistors 20e and 20c. The constant current output I22 from the N-MOS transistor 20c has the negative constant current output characteristics tracing the slope Q3 shown in FIG. 23B can be obtained where the constant current output I22 is increased when the external input signal Vin is decreased.

Next, the operation of the Schmitt trigger circuit shown in FIG. 20 according to the third embodiment will now be explained.

When the level of the external input signal Vin is at the VDD levels, in the P-type current mirror circuit 1000, the P-MOS transistor 10a is in the on-state and the N-MOS transistor 10b is in the cut-off state, and in the N-type current mirror circuit 2000, the P-MOS transistor 20a is in the on-state and the N-MOS transistor 20b is in the cut-off state. As a result, both nodes N11 and N12 are at the VDD level, in the P-type and N-type current mirror circuits 1000 and 2000. The voltage level of the output Vthc at the node N11 reaches the VSS level, both output signal Vout and the feed-back control signal VFB transferred from the amplifier 30 have the VSS level.

In this state described above, the P-MOS transistor 10d whose gate receives the feed-back control signal VFB in the P-type current mirror circuit 1000 is in the on-state, the source voltage potential of the P-MOS transistor 10e whose drain and gate are commonly connected to the node N12 is connected to the voltage power source VDD, so that this P-MOS transistor 10e is in an operable state.

On the other hand, although the N-MOS transistor 20d whose gate terminal receives the feed-back control signal VFB is in the cut-off state, no ground voltage level VSS is provided to the source terminal of the N-MOS transistor 20e whose drain and gate are connected to the node N13, as described above, the node N13 is not affected by this state.

In addition to the state described above, when each section and each element is in a transition state where the external input signal Vin is changed from the VSS level to the VDD level, the reverse amplifier comprising the P-MOS transistor 10a and the N-MOS transistor 10b whose gates receive the external input signal Vin starts to reverse its output because the P-MOS transistor 10e is in active state when the external input signal Vin whose voltage level is over the circuit threshold voltage level of the P-type current mirror circuit 1000 is provided. The constant current I11 is provided from the P-MOS transistor 10e as the active load immediately after the signal VBH at the node N12 is shifted to the VSS level and is below the element threshold voltage (VDD−|Vthp|) of the P-MOS transistor 10e. In addition, the P-MOS transistor 10c starts to output the constant current output according to the characteristics of the P-MOS transistor 10e as the active load because the P-MOS transistor 10e whose drain and gate are connected through the node N12 and the P-MOS transistor 10c whose gate is connected to the node N12 are connected in a current mirror circuit configuration.

Accordingly, in the state where the level of the external input signal Vin is over the circuit threshold voltage VP10 of the P-type current circuit 1000, the output current I12 of the P-type current mirror circuit 1000 is added with the output current I22 from the N-type current mirror circuit 2000 at the summed-up node N11 which is connected to both the P-type current mirror circuit 1000 and the N-type current mirror circuit 2000. The ratio of the output currents I12 and I22 determines the output voltage level Vthc at the node N11.

Each magnitude of the constant current outputs I12 and I22 from the P-type current mirror circuit 1000 and the N-type current mirror circuit 2000 is controlled by using the external input signal Vin.

The output voltage VBH at the node N12 in the P-type current mirror circuit 1000 can be expressed as follows:

$$V_{BH} = V_{DD} - |V_{thP}| - \alpha,$$

$$\alpha = \frac{V_{in} - V_{thN}}{\sqrt{\beta_p/\beta_n}},$$

where, $\beta_n = \mu_n \cdot C_{OX} \cdot W_{10b}/L,$ $\beta_p = \mu_p \cdot C_{OX} \cdot Q_{10a}/L,$ The output voltage VBH is controlled by using the external input signal Vin and is compressed as follows:

$$\frac{1}{\sqrt{\beta_p/\beta_n}} \text{ multiple where}, \beta_p >> \beta_n.$$

In addition, the output voltage VBL at the node N13 in the N-type current mirror circuit 2000 maintains approximately the voltage level VDD. Thereby, the output voltage VBH at the node N12 in the P-type current mirror circuit 1000 is kept at the voltage potential (VBH=VDD−|Vthp|−α) while the level of the external input signal Vin is reached to the circuit threshold voltage VN20 of the N-type current mirror circuit 1000.

Furthermore, because the gate bias voltage potential VBH of the P-MOS transistor 10c in the P-type current mirror circuit 1000 whose gate is connected to the node N12 is low and the current summed-up node N11 is in the state. of I22<<I12, the output voltage at the node N11 is kept approximately at the VSS level.

In the state described above, when the level of the external input signal Vin is increased and then over the circuit threshold voltage VN20 of the N-type current mirror circuit 2000, the output voltage VBL at the node N13 in the reverse amplifier comprising the P-MOS transistor 20a and the N-MOS transistor 20b whose gates receive the external input signal Vin in the N-type current mirror circuit 2000 is changed from the VSS level to the VDD level.

In this state, because the output VBL at the node N13 in the N-type current mirror circuit 2000 is changed from the VDD level to the VSS level, the magnitude of the output current I22 from the N-MOS transistor 20c whose gate is connected to the node N13 is rapidly decreased, and the output voltage Vthc at the node N11 is amplified to the VDD level by setting the constant current output at the current summed-up node N11 to the I22>I11. Then, the amplifier 30 amplifies this output voltage Vthc and generates the external output signal Vout and the feed-back control signal VFB.

As described above, because the feed-back control signal VFB is transferred to the P-MOS transistor 10d in the P-type current mirror circuit 1000 and the N-MOS transistor 20d in the N-type current mirror circuit 2000, the P-MOS transistor 10d enters the cut-off state and the N-MOS transistor 20d enters the on-state, so that the constant current output from the P-MOS transistor 10e that acts as the active load is halted because no VDD level is provided to the source of the P-MOS transistor 10e in the P-type current mirror circuit 1000. In this case, the level of the output at the node N12 is therefore further increased toward the VSS level and the magnitude of the output current I12 of the P-type current mirror circuit 1000 is increased.

In contrast, because the VSS level is provided to the source terminal of the N-MOS transistor 20e whose drain and gate are connected to the node N13 in the N-type current mirror circuit 2000, the N-MOS transistor 20e enters the active state.

Accordingly, the N-MOS transistor 20e that acts the active load for the P-MOS transistor 20a controlled by the external input signal Vin outputs the constant current so as to change the output VBL at the node N13 toward the VSS level and to halts the constant current output I22 from the N-type current mirror circuit 2000.

As the result, the output current state at the current summed-up node N11 assumes the state of I12>>I22, the output Vthc is further amplified toward the VDD level, the output voltage VBL at the node N13 in the N-type current mirror circuit 2000 is not more than the element threshold voltage (VSS+Vthn) of the N-MOS transistor 20c, and the constant current output 122 of the N-type current mirror circuit 2000 becomes zero (I22=0). Therefore the output voltage Vthc at the current summed-up node N11 can be amplified to the VDD level completely.

Accordingly, the feed-back control signal VFB transferred from the amplifier 30 is fed back to both the P-type current mirror circuit 1000 and N-type current mirror circuit 2000 so as to form the positive feed-back amplifier. Thereby, the present invention makes it possible to obtain approximately infinite amplification, and the Schmitt trigger circuit of the third embodiment is also makes it possible to decrease the delay of the output signal Vout as much as possible and to perform within a wide frequency range.

Figure 24:
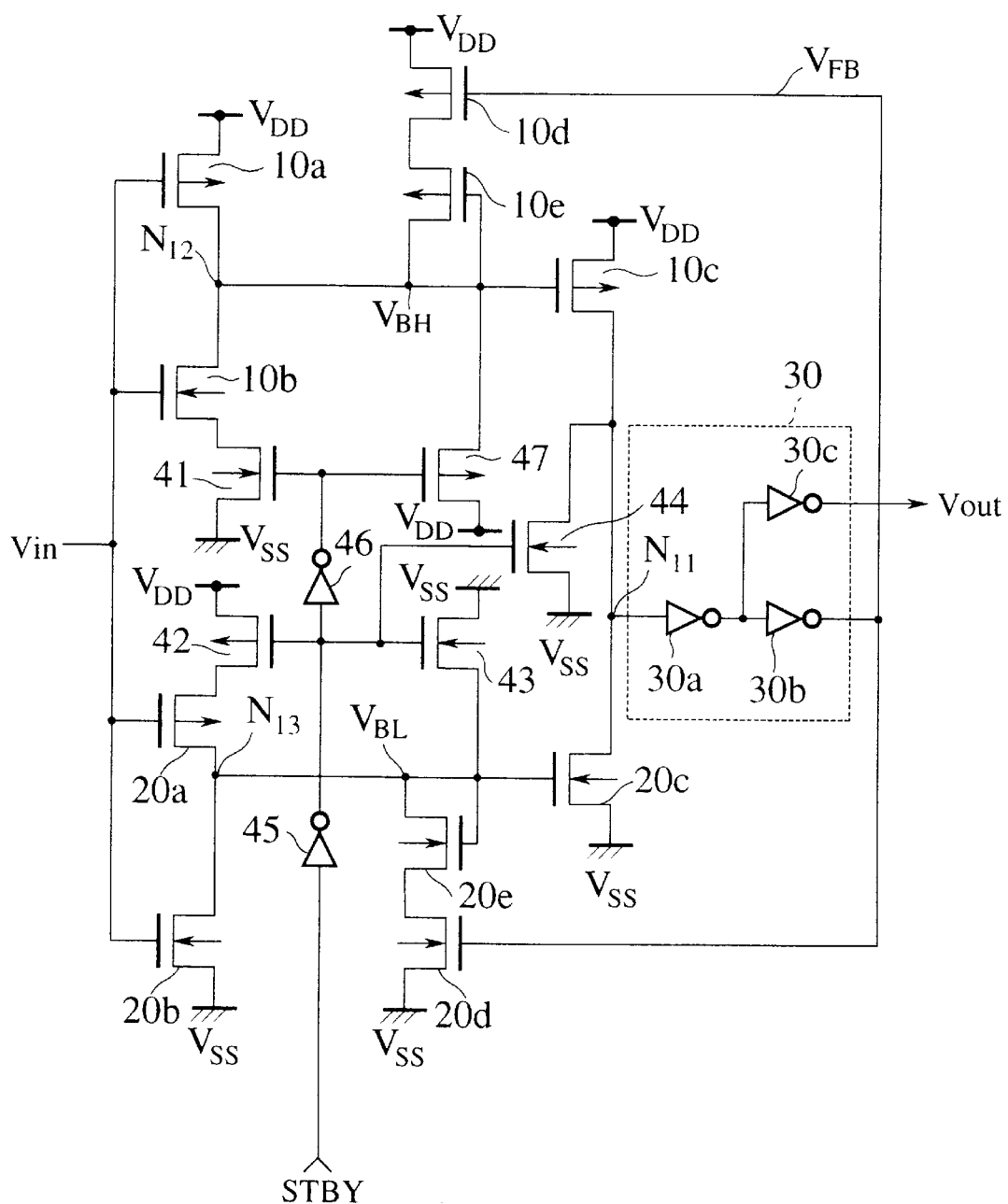
FIG. 24 is a circuit diagram showing a circuit configuration (the first configuration example) of a Schmitt trigger circuit having a stand-by function in addition to the configuration of to the Schmitt trigger circuit of the third embodiment.

First example of a configuration of a Schmitt trigger circuit having a stand-by function FIG. 24 is a circuit diagram showing a circuit configuration (the first configuration example) of a Schmitt trigger circuit having a stand-by function in addition to the configuration of the Schmitt trigger circuit as the first embodiment shown in FIG. 20. In addition, the common configuration elements between FIGS. 20 and 24 are used with the same reference numbers in this embodiment. Therefore explanation for these elements are omitted here for brevity.

This Schmitt trigger circuit having the stand-by function comprises: the Schmitt trigger circuit having the configuration shown in FIG. 20, a current cut N-MOS transistor 41 incorporated between the source terminal of the N-MOS transistor 10b and the ground voltage power source VSS, a current cut P-MOS transistor 42 incorporated between the source of the P-MOS transistor 20a and the voltage power source VDD, a N-MOS transistors 43, a P-MOS transistor 47 and a N-MOS transistor 44 connected to the node N12, N13 and N11, respectively, so as to fix a terminal voltage potential level at each node, and inverter circuits 45 and 46 connected in series for amplifying an external stand-by signal STBY.

In the Schmitt trigger circuit having the stand-by function shown in FIG. 20, when the external stand-by signal is at the VSS level, namely when the Schmitt trigger circuit is not used, it is possible to cut off each of the current paths where there is no current flow, so that a power consumption of the Schmitt trigger circuit becomes zero.

On the other hand, when the level of the external stand-by signal STBY is at the VDD level, the Schmitt trigger circuit of the third embodiment enters the normal operation mode and all circuit elements forming the stand-by function do not effect to the function and the operation of the Schmitt trigger circuit.

Figure 25:
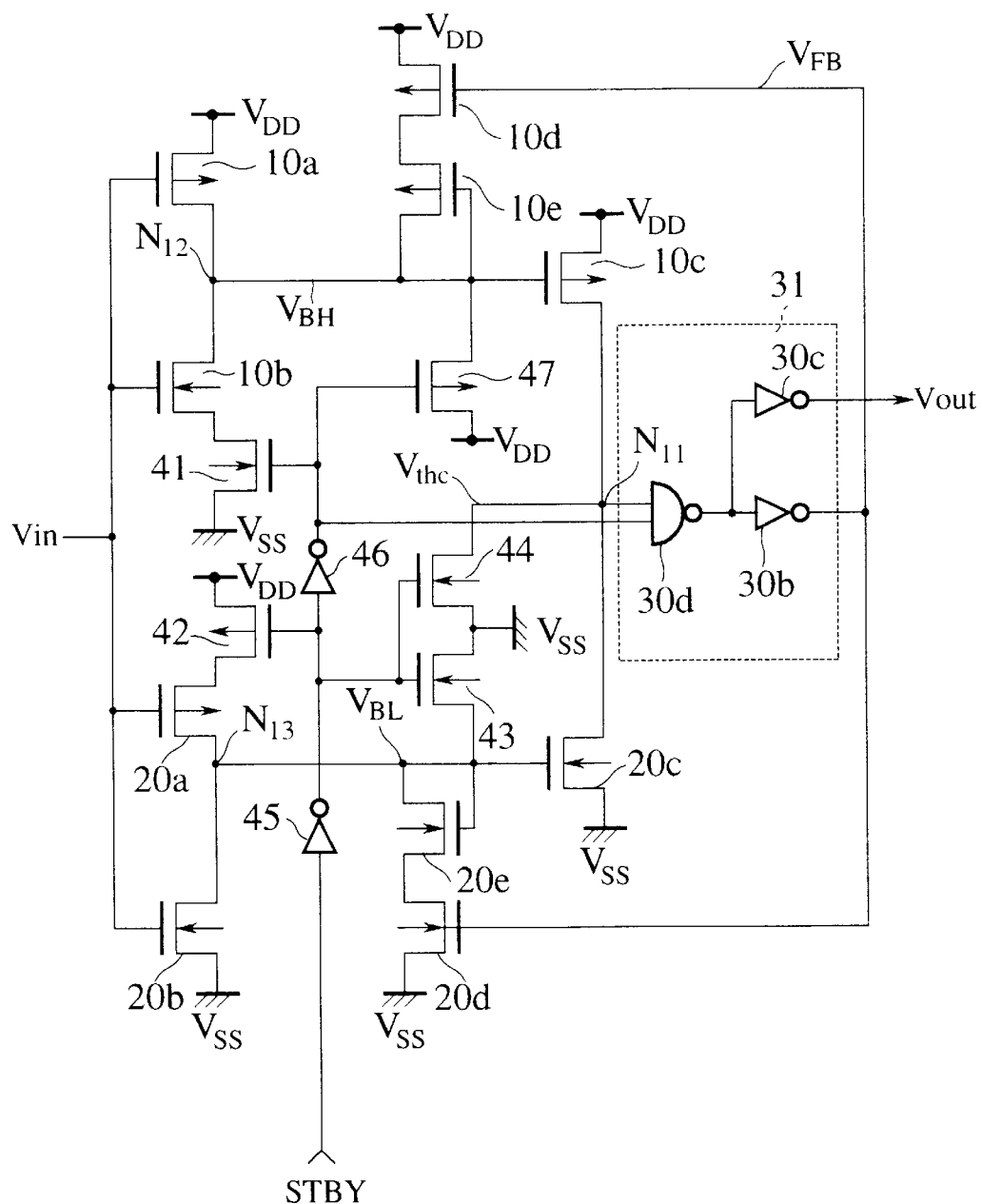
FIG. 25 is a circuit diagram showing a circuit configuration (the second configuration example) of a Schmitt trigger circuit having a stand-by function in addition to the configuration of the Schmitt trigger circuit of the third embodiment.

Second example of a configuration of a Schmitt trigger circuit having a stand-by function FIG. 25 is a circuit diagram showing a circuit configuration (the second configuration example) of a Schmitt trigger circuit having a stand-by function in addition to the configuration of the Schmitt trigger circuit as the first embodiment shown in FIG. 20. The common configuration elements between FIGS. 20 and 25 are used with the same reference numbers in this embodiment. Therefore explanation for these elements are omitted here for brevity.

In an amplifier 31 in the Schmitt trigger circuit shown in FIG. 25, in order to retard unexpected output caused when the external stand-by signal STBY is in the transition state, the inverter 30a in the amplifier 30 incorporated in the Schmitt trigger circuit shown in FIG. 20 is replaced with a NAND gate 30d and one input terminal of the NAND gate 30d is connected to the node N11 and the other input terminal is connected to the output terminal of the inverter circuit 46.

By using the configuration of the amplifier 31, unexpected output generated at the summed-up node N11 can be inhibited. In addition, when the level of the external stand-by signal STBY is at the VDD level, the Schmitt trigger circuit enters the normal operation mode and all circuit elements forming the stand-by function do not effect to the function and the operation of the Schmitt trigger circuit.

Figure 26:
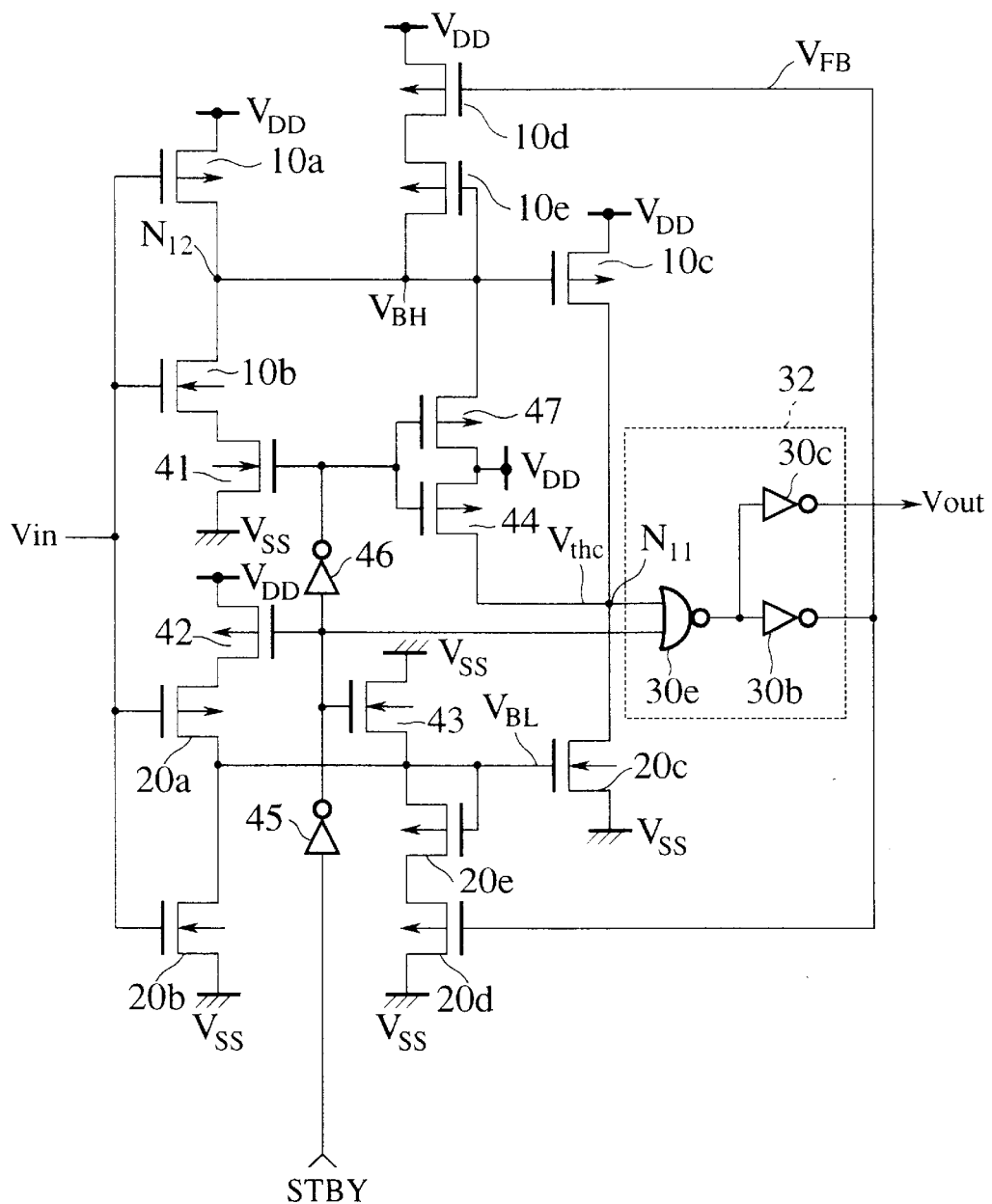
FIG. 26 is a circuit diagram showing a circuit configuration (the third configuration example) of a Schmitt trigger circuit having a stand-by function in addition to the configuration of the Schmitt trigger circuit of the third embodiment.

Third example of a configuration of a Schmitt trigger circuit having a stand-by function FIG. 26 is a circuit diagram showing a circuit configuration (the third configuration example) of a Schmitt trigger circuit having a stand-by function in addition to the configuration of the Schmitt trigger circuit of the first embodiment shown in FIG. 20. In addition, the common configuration elements between FIGS. 20 and 26 are used with the same reference numbers in this embodiment. Therefore explanation for these elements are omitted here for brevity.

An amplifier 32 in the Schmitt trigger circuit shown in FIG. 26 comprises: the N-MOS transistors 41 as a current cut transistor placed between the voltage power source VDD and the source terminal of the N-MOS transistor 10b; the P-MOS transistor 42 as a current cut transistor placed between the voltage power source VDD and the source terminal of the P-MOS transistor 20a, the N-MOS transistor 43; the P-MOS transistor 47 and the N-MOS transistor 44 to be used for fixing the voltage potential level at each terminals connected to the nodes N12, N13 and N11, respectively; the inverter circuits 45 and 46 for amplifying the external stand-by signal STBY; and the NOR circuit 30e which is replaced with the inverter circuit 30a connected to the node N11 in the amplifier 30 which has been described in the description for the first example.

By using the configuration of the Schmitt trigger circuit, each of direct current paths can be cut-off, while the level of the external stand-by signal STBY is at the VSS level, so that the power consumption of the Schmitt trigger circuit can be set to zero when this Schmitt trigger circuit is not used.

In addition, because the one input terminal of the NOR circuit 30e is connected to the node N11 and the other input terminal of the NOR circuit 30e is connected to the output terminal of the inverter circuit 45 which receives the external stand-by signal STBY, unexpected output generated at the summed-up node N11 can be inhibited. In addition, when the external stand-by signal STBY is at the VDD level, the Schmitt trigger circuit of the third embodiment enters the normal operation mode and all circuit elements forming the stand-by function do not effect to the function and the operation of the Schmitt trigger circuit of the third embodiment shown in FIG. 20.

Figure 27:
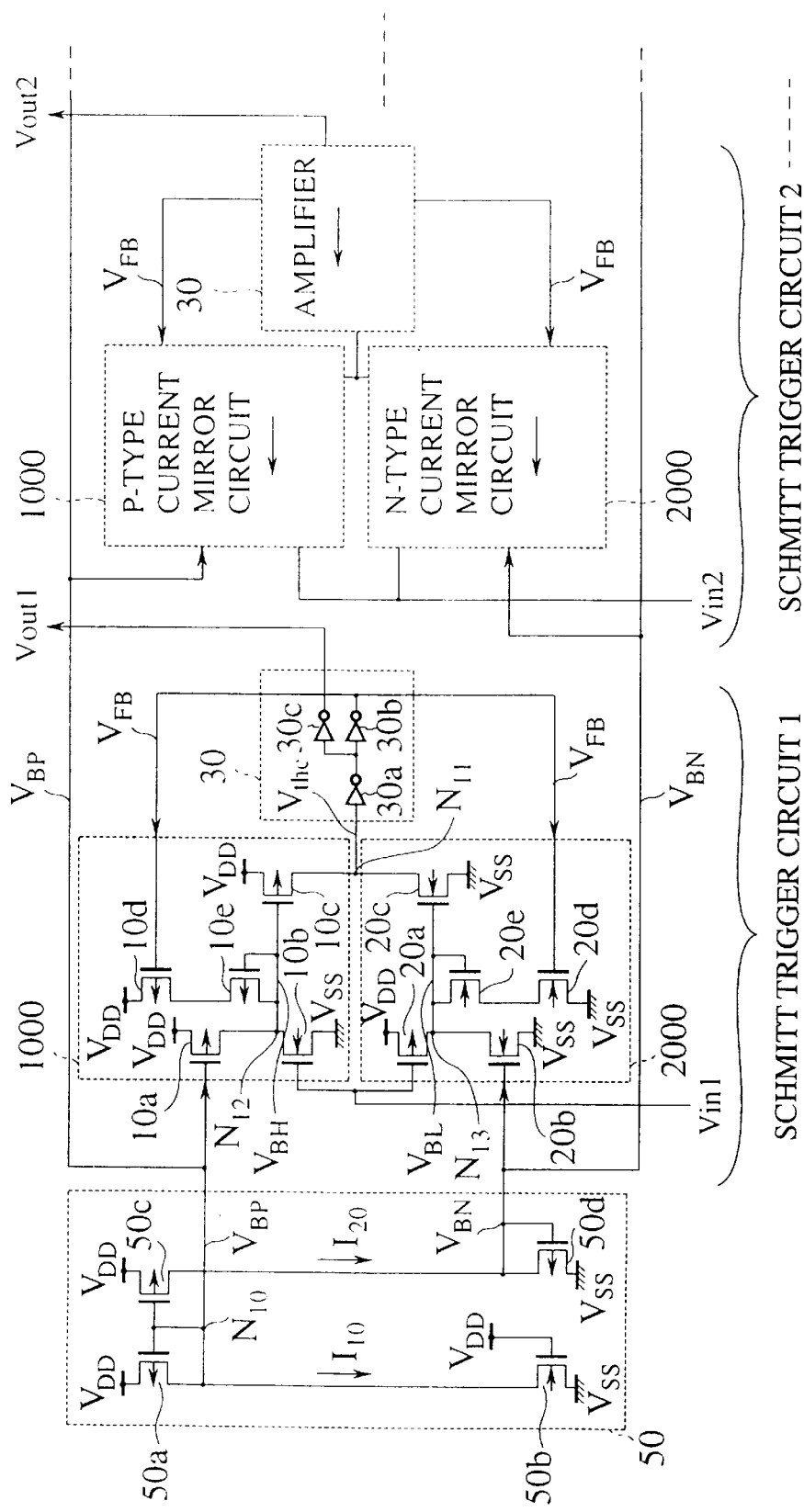
FIG. 27 is a diagram showing a configuration of a semiconductor input circuit having the Schmitt trigger circuit of the third embodiment.

FIG. 27 is a diagram showing a configuration of a semiconductor input circuit (or a Schmitt trigger input circuit system as a noise elimination device) having the Schmitt trigger circuit of the third embodiment.

The Schmitt trigger input circuit system comprises a plurality of the Schmitt trigger circuits shown in FIG. 20 corresponding to different external input signals.

Illustratively, like the Schmitt trigger input circuit system (namely, the semiconductor input system) shown in FIG. 19, this Schmitt trigger input circuit system shown in FIG. 27 comprises the reference voltage generation circuit (bias means) 50 for generating and providing the gate bias signal VBP to the P-MOS transistor 10a that acts as the constant current load in the P-type current mirror circuit 1000 and for generating and providing the gate bias voltage VBN to the N-MOS transistor 20b that acts as the constant current load in the N-type current mirror circuit 2000.

As described in the explanation for the Schmitt trigger input circuit system shown in FIG. 19, in the Schmitt trigger input circuit system shown in FIG. 27, the P-MOS transistor 10a and the N-MOS transistor 20b which act as the constant current load for the input transistor controlled by the external input signal Vin1, Vin2, . . . provided for each P-type current mirror circuit 1000, N-type current mirror circuit 2000, . . . are connected to the output signals VBP, VBN of the reference voltage generation circuit 50 in a current mirror connection. Thereby, the threshold voltage VP10 and VN20 of the P-type current mirror circuit 1000 and the N-type current mirror circuit 2000 can be easily set, so that fluctuation of circuit threshold voltages of a plurality of Schmitt trigger circuits can be made as small as possible.

Furthermore, because the difference between the transistor dimensions of the P-MOS and N-MOS transistors based on mobilities of them can be reduced, there are effects that a semiconductor integrated circuit with a good symmetrical configuration can be formed and a circuit pattern area of a Schmitt trigger circuit can be also reduced.

Embodiment 4

Figure 28:
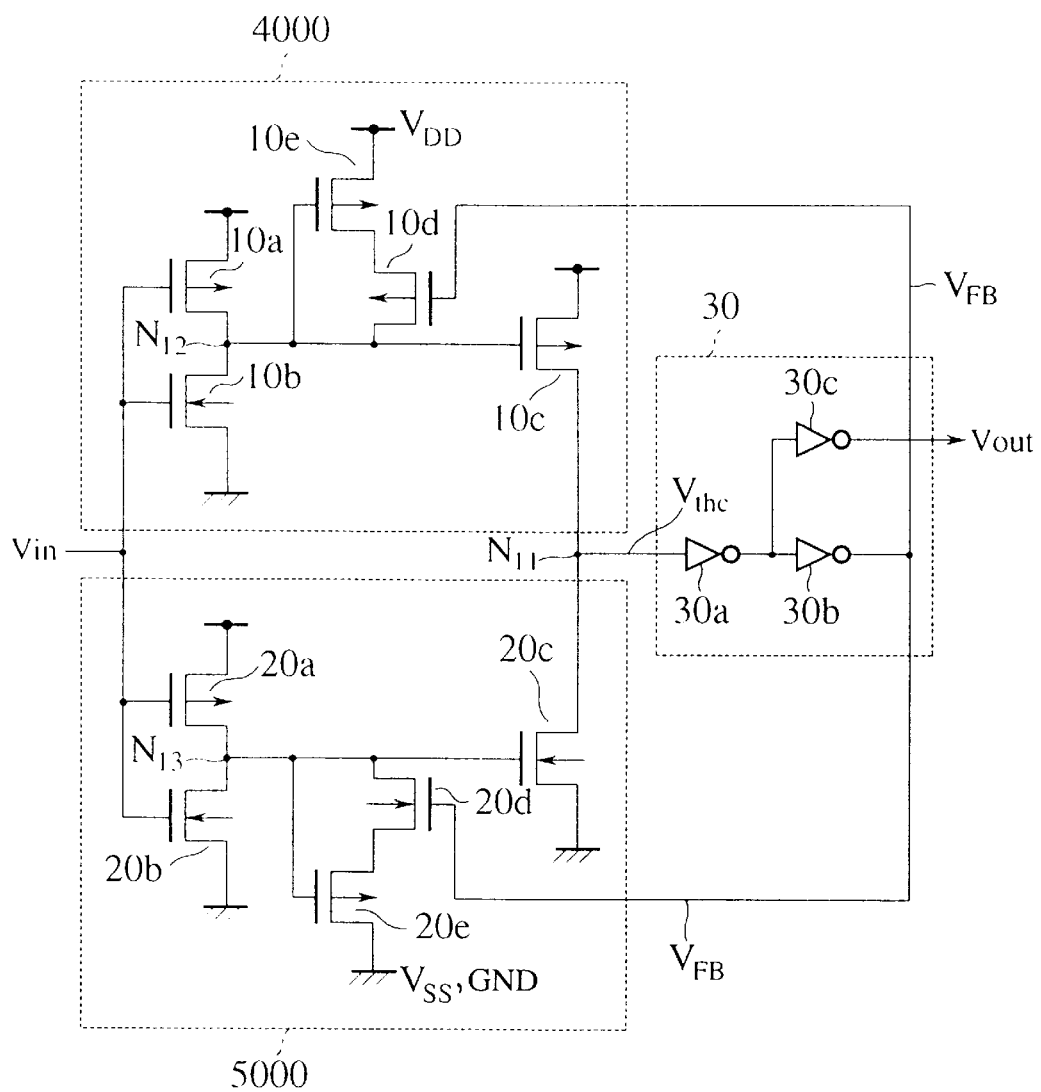
FIG. 28 is a circuit diagram of a Schmitt trigger circuit, as a semiconductor integrated circuit, of a fourth embodiment according to the present invention.
Figure 29:
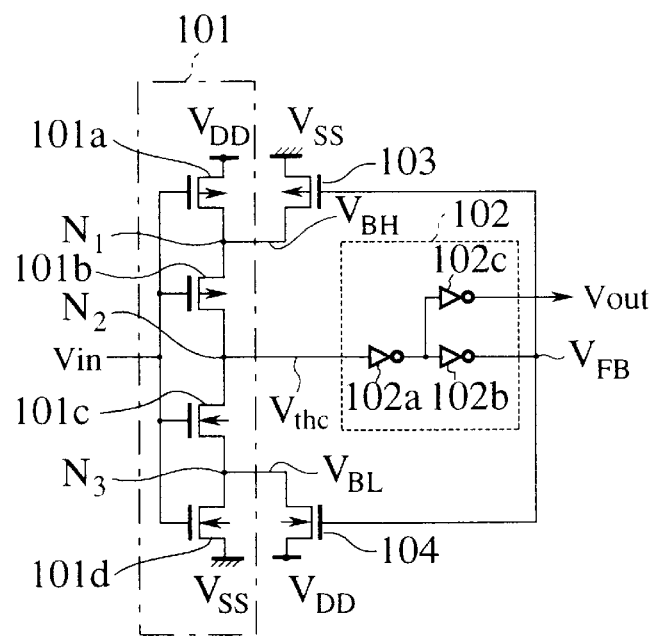
FIG. 29 is a circuit diagram showing a circuit configuration of a conventional Schmitt trigger circuit.
Figure 30:
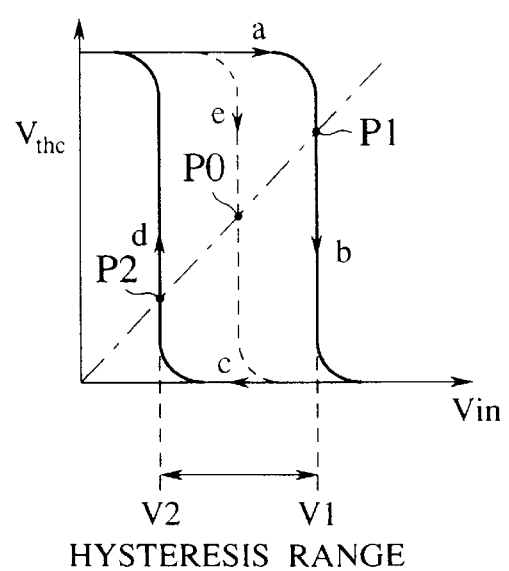
FIG. 30 is a diagram showing a hysteresis characteristic of the conventional Schmitt trigger circuit shown in FIG. 29.
Figure 31:
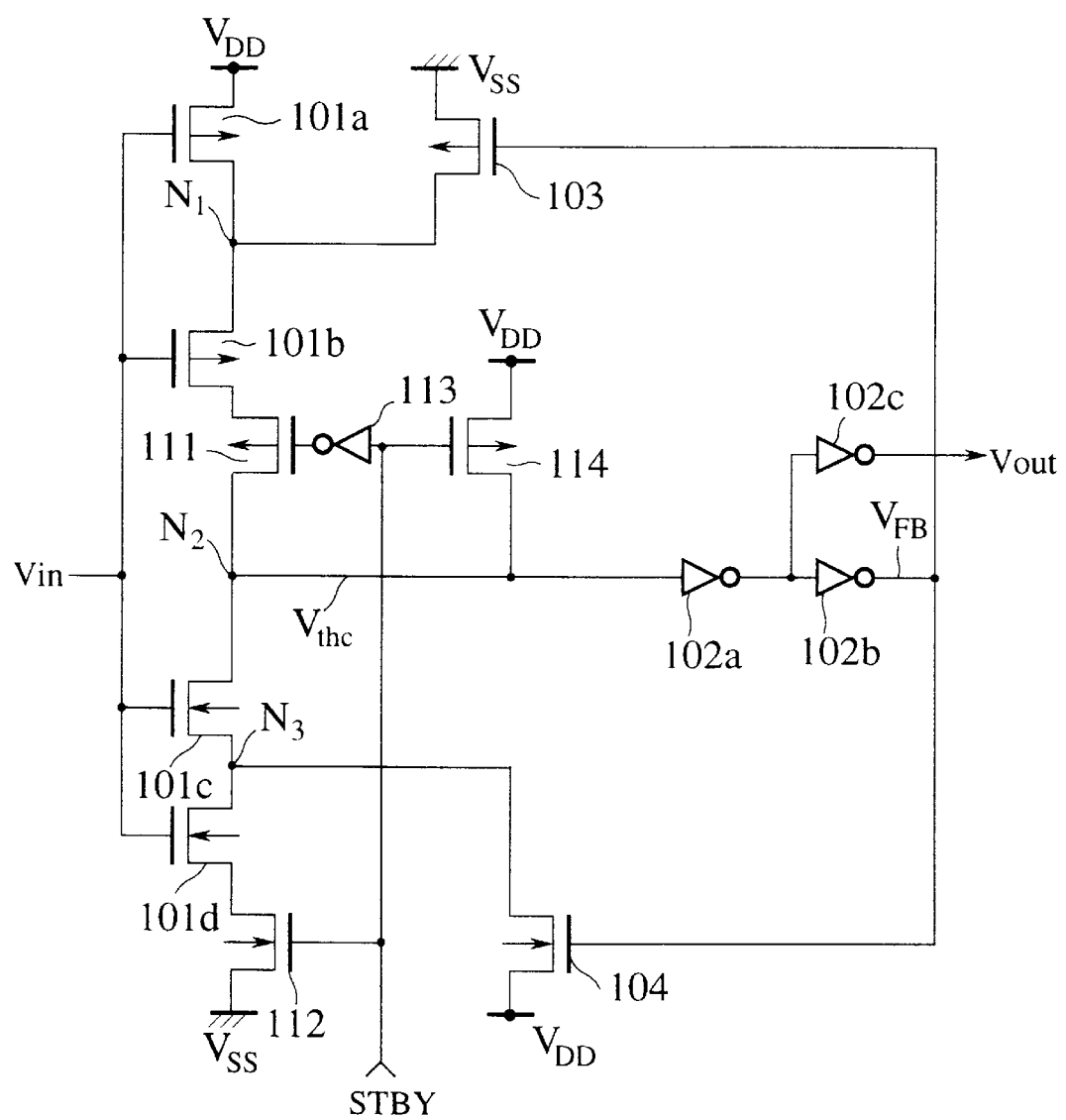
FIG. 31 is a circuit diagram showing a circuit configuration of a conventional Schmitt trigger circuit having a stand-by function in addition to the configuration of the conventional Schmitt trigger circuit shown in FIG. 29.
Figure 32:
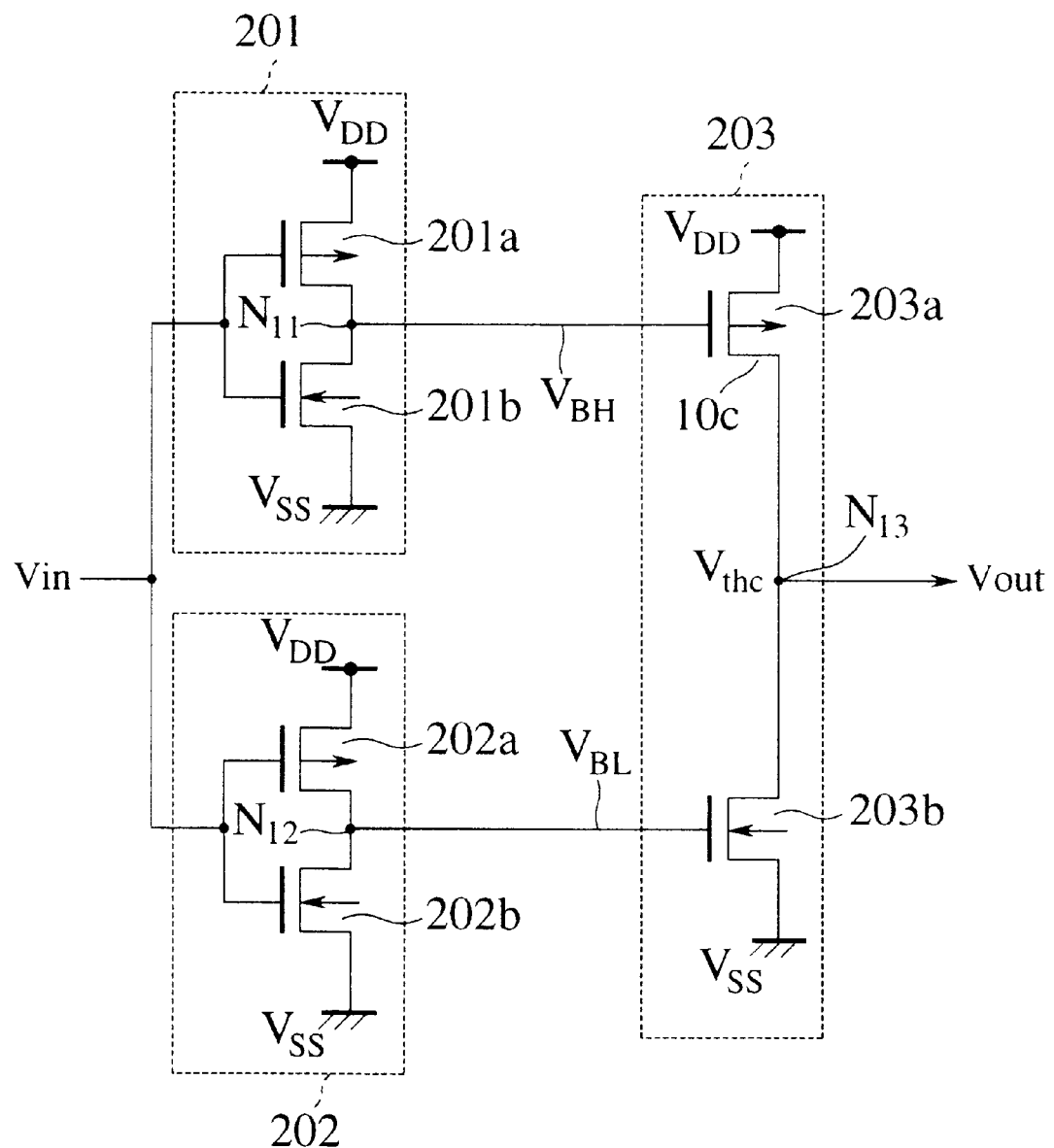
FIG. 32 is a circuit diagram showing another circuit configuration of a conventional Schmitt trigger circuit.
Figure 33A:
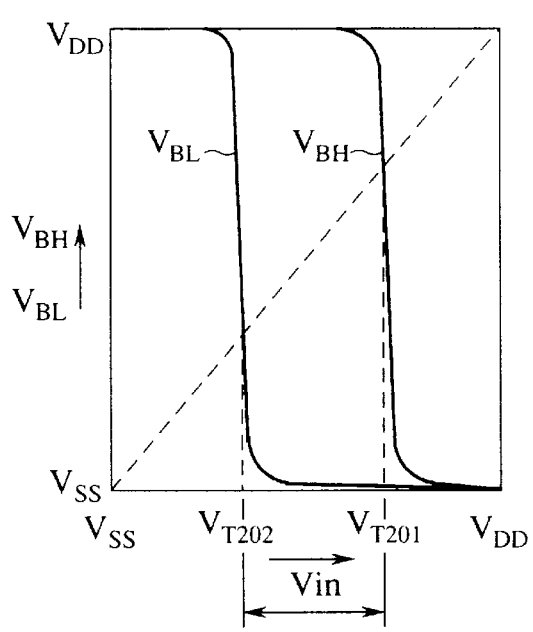
FIGS. 33A, 33B and 33C are diagrams showing a hysteresis characteristic of the conventional Schmitt trigger circuit shown in FIG. 32.
Figure 33B:
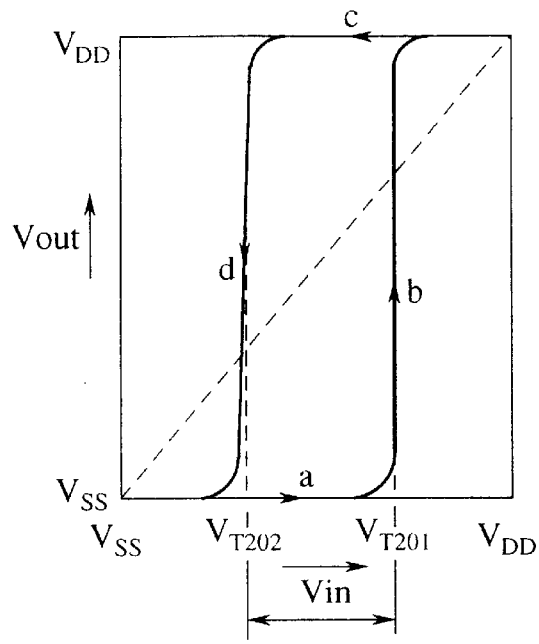
Figure 33C:
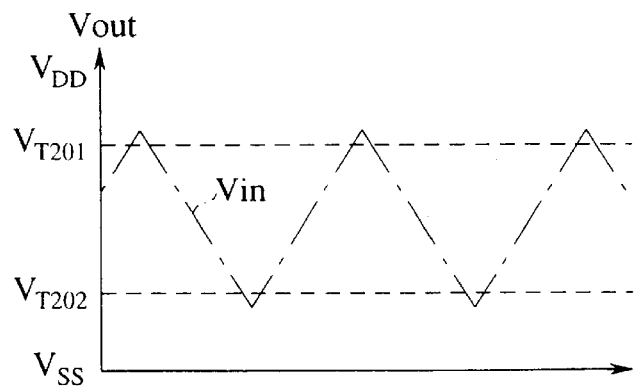

FIG. 28 is a circuit diagram of a Schmitt trigger circuit, as a semiconductor integrated circuit, of a fourth embodiment according to the present invention. The basic configuration of the Schmitt trigger circuit according to the fourth embodiment is the same as the Schmitt trigger circuit of the first embodiment shown in FIG. 1. In addition, the common configuration elements between the Schmitt trigger circuits shown in FIG. 20 and of the fourth embodiments are used with the same reference numbers in this embodiment. Therefore explanation for these elements are omitted here for brevity.

The feature of the Schmitt trigger circuit of the fourth embodiment is that in the circuit configuration shown in FIG. 20, the P-MOS transistor 10d as the first output current control transistor in the P-type current mirror circuit 1000 is exchanged in position to the P-MOS transistor 10e and the N-MOS transistor 20d as the second output current control transistor in the N-type current mirror circuit 2000 is exchanged in position to the P-MOS transistor 10e. By using the circuit configuration of the Schmitt trigger circuit of the fourth embodiment can obtain the same effect and operation as the third embodiment.

As described above in detail, according to the present invention, because the semiconductor integrated circuit has the configuration in which constant current outputs of the first current mirror circuit and the second current mirror circuit are controlled by using a feed-back control signal transferred from an amplifier, the semiconductor integrated circuit makes it possible to obtain approximately infinite amplification and to decrease the delay of an external output signal, even if a low voltage power source is used, as much as possible and to be able to perform in stability within a wide frequency range. Furthermore, the first and second current mirror circuits can modulate each circuit threshold value according to the state of the feed-back control signal from the amplifier and can complement each other, so that the first and second current mirror circuits can cut unexpected direct current path so as to decrease the entire power consumption.

According to the semiconductor integrated circuit of the present invention, in addition to the feature described above, because a current adder comprising the P-type and N-type current mirror circuits connected to each other is incorporated in an input device, the output voltage of the semiconductor integrated circuit can be determined only by using the ratio of output currents from the P-type and N-type current mirror circuits and can generate a stable external output signal. Further, the value of the output current corresponding to an input voltage (an external input signal) can be obtained because the P-type and N-type current mirror circuits are used for the input device. Thereby, the semiconductor integrated circuit can perform in stability. Furthermore, because first and second output current control transistors are incorporated in the P-type and N-type current circuits, each circuit threshold voltage in both the P-type and N-type current mirror circuits can be set to a required value and the hysteresis characteristics of each circuit can be easily controlled.

According to the semiconductor integrated circuit of the present invention, the semiconductor integrated circuit such as a Schmitt trigger circuit, a semiconductor input circuit system can be formed in a simple configuration.

According to the semiconductor integrated circuit of the present invention, because first and second cut off transistors enter the cut-off state in a stand-by mode, it can be possible to reduce the power consumption, as small as possible.

According to the semiconductor integrated circuit of the present invention, circuit threshold voltages of the P-type and N-type current mirror circuits can be easily set and the variation or the fluctuation of a circuit threshold voltage of each input device can be made as small as possible.

According to the semiconductor integrated circuit of the present invention, because an operation stopping means is incorporated in the semiconductor integrated circuit for stopping the operation of the P-type current mirror circuit and the N-type current mirror circuit in a stand-by mode, the power consumption of the semiconductor integrated circuit can be reduced.

While the above provides a full and complete disclosure of the preferred embodiments of the present invention, various modifications, alternate constructions and equivalents may be employed without departing from the true spirit and scope of the invention. Therefore the above description and illustration should not be construed as limiting the scope of the invention, which is defined by the appended claims.

What is claimed is:

1. A semiconductor integrated circuit comprising:
   a first current mirror circuit for providing a first constant current to an output terminal based on an external input signal;
   a second current mirror circuit having an output that is compensated with an output of the first current mirror circuit for providing a second constant current to said output terminal based on the external input signal;
   and an amplifier, coupled to said output terminal, for amplifying the first constant current and second constant current from the first current mirror circuit and the second current mirror circuit;
   wherein the amplifier generates a feedback control signal to said first and second current mirror circuits in addition to an external output signal, the first constant current from the first current mirror circuit and the second constant current from the second current mirror circuit are controlled by the feedback control signal at the same time.

2. A semiconductor input system comprising an input device and an amplifier, wherein:
   the input device comprises:
      a P-type current mirror circuit comprising a positive constant current source means for conducting in response to an external input signal to provide a positive constant current to an output terminal, and a first output current control transistor for controlling said positive constant current from the positive constant current source means; and
      an N-type current mirror circuit connected in parallel to the P-type current mirror circuit, comprising a negative constant current source means for conducting in response to the external input signal to provide a negative constant current to said output terminal, and a second output current control transistor for controlling said negative constant current from the negative constant current source means; and
   the amplifier, coupled to said output terminal, for amplifying said positive constant current and said negative constant current;
   wherein the amplifier provides a feed-back control signal to both the first output current control transistor and the second output current control transistor in order to drive the first output current control transistor and the second output current control transistor to opposite conductive states.

3. A semiconductor input system as claimed in claim 2, further comprises driving means for stopping the P-type current mirror circuit and the N-type current mirror circuit from providing the positive constant current and the negative constant current, respectively, during a stand-by mode.

4. A semiconductor integrated circuit comprising:
   a P-type current mirror circuit, an N-type current mirror circuit and an amplifier, wherein
   the P-type current mirror circuit comprises:
      a first input transistor connected between a first input node and a low power source and driven by an external input signal;
      a first constant current load means, comprising a first constant current load for the first input transistor, connected between a high power source and the first input node;
      a first output transistor connected between the high power source and an output node and driven based on a voltage potential of the first input node; and
      a first output current control transistor connected between the high power source and the first input node and driven by a feed-back control signal from the amplifier;
   the N-type current mirror circuit comprises:
      a second input transistor connected between a high power source and a second input node and driven by the external input signal;
      a second constant current load means, comprising a second constant current load for the second input transistor, connected between the second input node and the low power source;
      a second output transistor connected between the output node and the low power source and driven by a voltage potential of the second input node; and
      a second output current control transistor connected between the second input node and the low power source and driven by the feed-back control signal from the amplifier, and
   wherein the amplifier amplifies a voltage potential of the output node to provide amplifier outputs, one output from the amplifier being the feed-back control signal, and the other output being an external output signal.

5. A semiconductor integrated circuit as claimed in claim 4, further comprising:
   a first current cut-off transistor connected between the first input node and the low power source and which is driven to cut-off by a stand-by signal; and
   a second current cut-off transistor connected between the high power source and the second input node and which is driven to cut-off by the stand-by signal.

6. A semiconductor integrated circuit comprising:
   a P-type current mirror circuit, an N-type current mirror circuit and an amplifier providing a feed-back signal and an amplifier output, wherein the P-type current mirror circuit comprises:
  a first input transistor connected between a first input node and a low power source and driven by an external input signal;
  a first constant current load means, comprising a first constant current load for the first input transistor, connected between a high power source and the first input node;
  a first output transistor connected between the high power source and an output node and driven by a voltage potential of the first input node;
  a first output current control transistor connected between the high power source and the first output transistor; and
  a first control transistor connected between the high power source and the first constant current load means and driven by the amplifier feed-back signal,
the N-type current mirror circuit comprises:
  a second input transistor connected between the high power source and a second input node and driven by the external input signal;
  a second constant current load means, comprising a second constant current load for the second input transistor, and connected between the second input node and the low power source;
  a second output transistor connected between the output node and the low power source and driven by a voltage potential of the second input node;
  a second control transistor connected between the second constant current load means and the low power source and driven by the amplifier feed-back signal; and
  a second output current control transistor connected between the second output transistor, the second constant current load means, the second input transistor and the low power source, and
wherein the amplifier amplifies a voltage potential at the output node.

7. A semiconductor integrated circuit as claimed in claim 6, which further comprises:
  a first current cut-off transistor connected between the first input node and the low power source and whose operation is driven by a stand-by signal; and
  a second current cut-off transistor connected between the high power source and the second input node and whose operation is driven by the stand-by signal.

8. A semiconductor integrated circuit comprising:
a P-type current mirror circuit, an N-type current mirror circuit and an amplifier, wherein
the P-type current mirror circuit comprises:
  a first input transistor connected between a first input node and a low power source and driven by an external input signal;
  a first constant current load means, comprising a first constant current load for the first input transistor, connected between a high power source and the first input node;
  a first output transistor connected between the high power source and an output node and driven by a voltage potential of the first input node;
  a first output current control transistor connected between the high power source and the first output transistor; and
  a first control transistor connected between the high power source and the first output current control transistor and driven by a feed-back control signal,
the N-type current mirror circuit comprises:
  a second input transistor connected between the high power source and a second input node and driven by the external input signal;
  a second constant current load means, comprising a second constant current load for the second input transistor, connected between the second input node and the low power source;
  a second output transistor connected between the output node and the low power source and driven by a voltage potential of the second input node;
  a second output current control transistor connected between the second input transistor and the low power source; and
  a second control transistor connected between the second output transistor, the second constant current load means, the second input transistor and the low power source and driven by the feed-back control signal; and
wherein the amplifier amplifies a voltage potential at the output node to provide the feed-back control signal, and an external output signal.

9. A semiconductor integrated circuit as claimed in claim 8, further comprises:
  a first current cut-off transistor connected between the first input node and the low power source and whose operation is driven by a stand-by signal; and
  a second current cut-off transistor connected between the high power source and the second input node and whose operation is driven by the stand-by signal.

10. A semiconductor input system comprising an input device and an amplifier coupled to the input device, wherein
  the input device comprises a current addition device comprising a P-type current mirror circuit and an N-type current mirror circuit connected in parallel, wherein
  the P-type current mirror circuit comprises:
    a positive constant current source for producing a positive constant current when driven to conduct by an external input signal;
    a first output current control transistor, coupled to the positive constant current source, for controlling a magnitude of an output current from the positive constant current source; and
    a first threshold voltage setting section, coupled to the positive constant current source, for outputting a constant current based on a high potential reference voltage,
  the N-type current mirror circuit comprises:
    a negative constant current source for producing a negative constant current when driven to conduct by the external input signal;
    a second output current control transistor, coupled to the negative constant current source, for controlling a magnitude of an output current from the negative constant current source; and
    a second threshold voltage setting section, coupled to the negative constant current source, for outputting a constant current based on a low potential reference voltage, and
  wherein the amplifier amplifies the output currents from the first and second threshold voltage setting sections and generates an external output signal, and generates a feed-back control signal coupled to drive the first output current control transistor and the second output current control transistor.

11. A semiconductor input system as claimed in claim 10, further comprises driving means for stopping the P-type current mirror circuit and the N-type current mirror circuit from producing the positive constant current and the negative constant current, respectively, during a stand-by mode.

12. A semiconductor input system comprising:
- a plurality of input devices connected in series; and
- a reference voltage generation circuit for generating a high reference voltage and a low reference voltage, wherein each of the plurality of input devices comprises:
- a current addition device and an amplifier,
- wherein the current addition device comprises:
  - a P-type current mirror circuit; and
  - an N-type current mirror circuit connected in parallel,
  - wherein the P-type current mirror circuit comprises:
    - a positive constant current source for producing a positive constant current;
    - a first output current control transistor, coupled to the positive constant current source, for controlling a magnitude of an output current from the positive constant current source; and
    - a first threshold voltage setting section, coupled to the positive constant current source, for outputting a constant current based on the high reference voltage,
  - the N-type current mirror circuit comprises:
    - a negative constant current source for producing a negative constant current;
    - a second output current control transistor, coupled to the negative constant current source, for controlling a magnitude of an output current from the negative constant current source; and
    - a second threshold voltage setting section, coupled to the negative constant current source, for outputting a constant current based on the low reference voltage, and wherein the amplifier amplifies the output currents from the first and second threshold voltage setting sections and provides an external output signal, and provides a feed-back control signal coupled to drive both the first output current control transistor and the second output current control transistor.

13. A semiconductor input system as claimed in claim 12, further comprises driving means for stopping the P-type current mirror circuit and the N-type current mirror circuit from producing the positive constant current and the negative constant, current respectively, during a stand-by mode.

* * * * *

UNITED STATES PATENT AND TRADEMARK OFFICE
CERTIFICATE OF CORRECTION

PATENT NO.: 6,008,679
DATED: December 28, 1999
INVENTOR: Yoshinobu MASUDA

It is certified that error appears in the above-identified patent and that said Letters Patent is hereby corrected as shown below:

On the Title page, Item [57], in the Abstract, line 3, "a N-type" should read --an N-type--;

Claim 13, column 48, line 24, "constant, current" should read --constant current,--.

Signed and Sealed this

Twenty-seventh Day of March, 2001

Attest:

NICHOLAS P. GODICI

Attesting Officer

Acting Director of the United States Patent and Trademark Office